_(12)_ United States Patent
Hidaka

(10) Patent No.: US 10,360,285 B2
(45) Date of Patent: Jul. 23, 2019

(54) COMPUTING USING UNKNOWN VALUES

(71) Applicant: FUJITSU LIMITED, Kawasaki-shi, Kanagawa (JP)

(72) Inventor: Yasuo Hidaka, Cupertino, CA (US)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/802,342

(22) Filed: Nov. 2, 2017

(65) Prior Publication Data

US 2019/0129916 A1    May 2, 2019

(51) Int. Cl.
*G06F 17/18* (2006.01)
*G06F 17/16* (2006.01)
*G06F 8/30* (2018.01)
*G06F 17/13* (2006.01)
*G06N 10/00* (2019.01)
*G06F 17/50* (2006.01)

(52) U.S. Cl.
CPC .............. *G06F 17/18* (2013.01); *G06F 8/311* (2013.01); *G06F 17/13* (2013.01); *G06F 17/16* (2013.01); *G06N 10/00* (2019.01); *G06F 17/50* (2013.01)

(58) Field of Classification Search
CPC .......... G06F 17/18; G06F 8/311; G06F 17/13; G06F 17/16; G06N 10/00
USPC ........................................................ 708/445
See application file for complete search history.

(56) References Cited

U.S. PATENT DOCUMENTS

2018/0247200 A1* 8/2018 Rolfe .................... G06N 3/0454
2019/0065956 A1* 2/2019 Qian ....................... G06N 3/082

OTHER PUBLICATIONS

Statistics Cheat Sheet, Massachusetts Institute of Technology, USABO Lectures, 2014.
Gomes et al., "Satisfiability Solvers", Handbook of Knowledge Representation, p. 89-134, 2008.
Marina Wahl, "Crash Course on Basic Statistics", University of New York at Stony Brook, Nov. 6, 2013.
Benenti et al., "Principles of Quantum Computation and Information, vol. 1: Basic Concepts", World Scientific, 2004.
"Monte Carlo Simulation", Probabilistic Engineering Design, Sep. 29, 1983.
Charles J. Geyer, Introduction to Markov Chain Monte Carlo:, Handbook of Markov Chain Monte Carlo, May 10, 2011.
Laurent Bernardin, "How Maple Comapres to Mathematica", Maplesoft, 2015.

* cited by examiner

*Primary Examiner* — Tan V Mai
(74) *Attorney, Agent, or Firm* — Maschoff Brennan

(57) ABSTRACT

A method of computing includes defining a first atomic random variable (ARV) and first random variable (RV) in a programming language system. The first ARV having a non-deterministic value of either zero according to a second probability or one according to a first probability. A sum of the first probability and the second probability is one. A covariance of the first ARV and a second ARV is zero. The first RV has a first indefinite value at a first definite probability and includes a polynomial of one or more atomic random variables (ARVS) that includes the first ARV. The method includes executing a computer instruction that includes a mathematical operation involving the first RV as a basic data type and produces a second RV having a second indefinite value at a second definite probability, represents a result distribution, and tracks a response to the one or more ARVS.

20 Claims, 89 Drawing Sheets

$$G[X_i] = \begin{cases} 0 & \text{if } p_i < 0.5 \\ 1 & \text{if } p_i > 0.5 \\ 0.5 & \text{if } p_i = 0.5 \end{cases} \quad (\text{EQ 1})$$

Ground of ARV is 0, if $p_i$ is less than 0.5.
Ground of ARV is 1, if $p_i$ is more than 0.5.
Ground of ARV is 0.5, if $p_i$ is exactly 0.5.

FIG. 4

$$E[X_i] = p_i \times E[1] + (1 - p_i) \times E[0] = p_i \times 1 + (1 - p_i) \times 0 = p_i \quad (\text{EQ 2})$$

FIG. 5

$$E[X_i^2] = p_i \times E[1^2] + (1 - p_i) \times E[0^2] = p_i \times 1^2 + (1 - p_i) \times 0^2 = p_i \quad (\text{EQ 3})$$

FIG. 6

$$V[X_i] = E[X_i^2] - (E[X_i])^2 = p_i - p_i^2 = p_i(1-p_i) \quad \text{(EQ 4)}$$

FIG. 7

$$E[X_1]E[X_2] = p_1 p_2 \quad \text{(EQ 5)}$$
$$E[X_1 X_2] = E[1 \times 1] \times p_1 p_2 + E[0] \times (1 - p_1 p_2) = p_1 p_2 \quad \text{(EQ 6)}$$
$$Cov[X_1, X_2] = E[X_1 X_2] - E[X_1]E[X_2] = p_1 p_2 - p_1 p_2 = 0 \quad \text{(EQ 7)}$$

FIG. 8

$$E[X_i^n] = p_i \times E[1^n] + (1 - p_i) \times E[0^n] = p_i \times 1^n + (1 - p_i) \times 0^n = p_i \quad \text{(EQ 8)}$$

FIG. 9

$$f_{X_i}(x) = p_i \times \delta(x-1) + (1-p_i) \times \delta(x) \quad \text{(EQ 9)}$$

Here, $\delta(x)$ is a Dirac's delta function.

FIG. 10

$$F_{X_i}(x) = p_i \times U(x-1) + (1-p_i) \times U(x) \quad \text{(EQ 10)}$$

Here, $U(x)$ is a unit step function.

FIG. 11

$$M_{X_i}(t) = E[\exp(tX_i)] = p_i \times E[\exp(t \times 1)] + (1-p_i) \times E[\exp(t \times 0)]$$
$$= 1 - p_i + p_i \exp(t) \quad \text{(EQ 11)}$$

FIG. 12

$$\varphi_{X_i}(t) = E[\exp(jtX_i)] = p_i \times E[\exp(jt \times 1)] + (1 - p_i) \times E[\exp(jt \times 0)] \quad \text{(EQ 12)}$$
$$= 1 - p_i + p_i \exp(jt)$$

FIG. 13

$$K_{X_i}(t) = \log\left(M_{X_i}(t)\right) = \log\{1 - p_i + p_i \exp(t)\} \quad \text{(EQ 13)}$$

FIG. 14

A power of an ARV is statistically equivalent to the ARV itself.

$$X_i = X_i^p \text{ for } \forall p \in \mathbb{N} \quad \text{(EQ 14)}$$

Proof:

An $n$-th moment of $X_i^p$ is calculated as follows:
$$E[(X_i^p)^n] = p_i \times E[1^{pn}] + (1-p_i) \times E[0^{pn}] = p_i \times 1^{pn} + (1-p_i) \times 0^{pn} = p_i \quad \text{(EQ 15)}$$

This is same as the $n$-th moment of $X_i$ calculated in (EQ 8). Since they have the same $n$-th moment for any $n$, they are statistically equivalent.

FIG. 15

$$G[Y_a] = G[a_0X_0 + a_1X_1 + a_2X_2 + \cdots + a_mX_m] = a_0 + \sum_{k \in \{1,\cdots,m\}} a_k X_k \quad \text{(EQ 16)}$$

$$X_k = \begin{cases} 0 & \text{if } p_k < 0.5 \\ 1 & \text{if } p_k > 0.5 \\ 0.5 & \text{if } p_k = 0.5 \end{cases}$$

FIG. 16

$$E[Y_a] = E[a_0X_0 + a_1X_1 + a_2X_2 + \cdots + a_mX_m] = E\left[\sum_{k=0}^{m} a_k X_k\right] = \sum_{k=0}^{m} a_k E[X_k] \quad \text{(EQ 17)}$$

$$= \sum_{k=0}^{m} a_k p_k$$

FIG. 17

$$E[Y_a^2] = E\left[\left(\sum_{k=0}^{m} a_k X_k\right)^2\right] = E\left[\left(\sum_{k=0}^{m} a_k X_k\right)\left(\sum_{l=0}^{m} a_l X_l\right)\right] = E\left[\sum_{k=0}^{m}\sum_{l=0}^{m} a_k a_l X_k X_l\right]$$

$$= \sum_{k=0}^{m}\sum_{l=0}^{m} a_k a_l E[X_k X_l] = \sum_{k=0}^{m}\sum_{l=0}^{m} a_k a_l E\left[\prod_{i\in\{k\}\cup\{l\}} X_i\right]$$

$$= \sum_{k=0}^{m}\sum_{l=0}^{m} a_k a_l \prod_{i\in\{k\}\cup\{l\}} p_i = \left(\sum_{k=0}^{m} a_k^2 p_k\right) + \left(\sum_{k=0}^{\{0,\cdots,m\}}\sum_{l\neq k}^{m} a_k a_l p_k p_l\right)$$

$$V[Y_a] = E[Y_a^2] - (E[Y_a])^2 = \sum_{k=0}^{m} a_k^2 (p_k - p_k^2) = \sum_{k=0}^{m} a_k^2 p_k (1 - p_k) \quad (\text{EQ 19})$$

FIG. 19

$$\begin{aligned}
E[Y_a^n] &= E\left[\left(\sum_{k=0}^{m} a_k X_k\right)^n\right] \\
&= E\left[\left(\sum_{k_1=0}^{m} a_{k_1} X_{k_1}\right)\left(\sum_{k_2=0}^{m} a_{k_2} X_{k_2}\right) \cdots \left(\sum_{k_n=0}^{m} a_{k_n} X_{k_n}\right)\right] \\
&= \sum_{k_1=0}^{m} \sum_{k_2=0}^{m} \cdots \sum_{k_n=0}^{m} a_{k_1} a_{k_2} \cdots a_{k_n} X_{k_1} X_{k_2} \cdots X_{k_n} \\
&= \sum_{k_1=0}^{m} \sum_{k_2=0}^{m} \cdots \sum_{k_n=0}^{m} a_{k_1} a_{k_2} \cdots a_{k_n} E[X_{k_1} X_{k_2} \cdots X_{k_n}] \\
&= \sum_{k_1=0}^{m} \sum_{k_2=0}^{m} \cdots \sum_{k_n=0}^{m} a_{k_1} a_{k_2} \cdots a_{k_n} E\left[\prod_{l \in \{k_1\} \cup \{k_2\} \cup \cdots \cup \{k_n\}} X_l\right] \\
&= \sum_{k_1=0}^{m} \sum_{k_2=0}^{m} \cdots \sum_{k_n=0}^{m} a_{k_1} a_{k_2} \cdots a_{k_n} \prod_{l \in \{k_1\} \cup \{k_2\} \cup \cdots \cup \{k_n\}} p_l
\end{aligned} \quad (\text{EQ 20})$$

FIG. 20

$$E[Y_a]E[Y_b] = \left(\sum_{k=0}^{m} a_k p_k\right)\left(\sum_{k=0}^{m} b_k p_k\right) = \sum_{k=0}^{m}\sum_{l=0}^{m} a_k b_l p_k p_l \quad (EQ\ 21)$$

$$E[Y_a Y_b] = E\left[\left(\sum_{k=0}^{m} a_k p_k\right)\left(\sum_{k=0}^{m} b_k p_k\right)\right] = E\left[\sum_{k=0}^{m}\sum_{l=0}^{m} a_k b_l X_k X_l\right] = \sum_{k=0}^{m}\sum_{l=0}^{m} a_k b_l E[X_k X_l] \quad (EQ\ 22)$$

$$= \sum_{k=0}^{m}\sum_{l=0}^{m} a_k b_l \prod_{j \in \{k\} \cup \{l\}} p_j$$

$$Cov[Y_a, Y_b] = E[Y_a Y_b] - E[Y_a]E[Y_b] = \sum_{k=0}^{m}\sum_{l=0}^{m} a_k b_l \prod_{j \in \{k\} \cup \{l\}} p_j - \sum_{k=0}^{m}\sum_{l=0}^{m} a_k b_l p_k p_l \quad (EQ\ 23)$$

$$= \sum_{k=1}^{m} a_k b_k p_k (1 - p_k)$$

$$= \sum_{k=0}^{m} a_k b_k p_k (1 - p_k)$$

FIG. 21

$$\rho_{a,b} = \frac{Cov[Y_a, Y_b]}{\sqrt{V[Y_a]V[Y_b]}} = \frac{\sum_{k=1}^{m} a_k b_k p_k (1 - p_k)}{\sqrt{\{\sum_{k=0}^{m} a_k^2 p_k (1 - p_k)\}\{\sum_{k=0}^{m} b_k^2 p_k (1 - p_k)\}}} \quad (EQ\ 24)$$

FIG. 22

$Y_{\tilde{A}} \equiv \vec{X}^T \tilde{A} \vec{X}$ $$\tilde{A} \equiv \begin{bmatrix} \tilde{a}_0 & 0 & 0 & \cdots & 0 & 0 \\ 0 & \tilde{a}_1 & \tilde{a}_{1,2} & \cdots & \tilde{a}_{1,m-1} & \tilde{a}_{1,m} \\ 0 & 0 & \tilde{a}_2 & \cdots & \tilde{a}_{2,m-1} & \tilde{a}_{2,m} \\ \vdots & \vdots & \vdots & \ddots & \vdots & \vdots \\ 0 & 0 & 0 & \cdots & \tilde{a}_{m-1} & \tilde{a}_{m-1,m} \\ 0 & 0 & 0 & \cdots & 0 & \tilde{a}_m \end{bmatrix}$$

$\tilde{a}_0 \equiv a_{0,0}$
$\tilde{a}_k \equiv a_{0,k} + a_{k,0} + a_{k,k} \quad (k \in \{1,2,\cdots,m\})$
$\tilde{a}_{k,l} \equiv a_{k,l} + a_{l,k} \quad (k \in \{1,2,\cdots,m-1\}, l \in \{k+1, k+2, \cdots, m\})$ Proof:

$Y_A = \vec{X}^T A \vec{X} = \sum_{k=0}^{m} \sum_{l=0}^{m} a_{k,l} X_k X_l$ $= a_{0,0} X_0 X_0 + \sum_{l=1}^{m} a_{0,l} X_0 X_l + \sum_{k=1}^{m} a_{k,0} X_k X_0 + \sum_{k=1}^{m} a_{k,k} X_k X_k + \sum_{k=1}^{m-1} \sum_{l=k+1}^{m} a_{k,l} X_k X_l + \sum_{l=1}^{m-1} \sum_{k=l+1}^{m} a_{k,l} X_k X_l$ $= a_{0,0} + \sum_{k=1}^{m} a_{0,k} X_k + \sum_{k=1}^{m} a_{k,0} X_k + \sum_{k=1}^{m} a_{k,k} X_k X_k + \sum_{k=1}^{m-1} \sum_{l=k+1}^{m} a_{k,l} X_k X_l + \sum_{k=1}^{m-1} \sum_{l=k+1}^{m} a_{l,k} X_l X_k$ $= a_{0,0} + \sum_{k=1}^{m} (a_{0,k} + a_{k,0} + a_{k,k}) X_k + \sum_{k=1}^{m-1} \sum_{l=k+1}^{m} (a_{k,l} + a_{l,k}) X_l X_k$ $= \tilde{a}_0 X_0 X_0 + \sum_{k=1}^{m} \tilde{a}_k X_k X_k + \sum_{k=1}^{m-1} \sum_{l=k+1}^{m} \tilde{a}_{k,l} X_k X_l$ $= a_{0,0} + \sum_{k=1}^{m} (a_{0,k} + a_{k,0} + a_{k,k}) X_k + \sum_{k=1}^{m-1} \sum_{l=k+1}^{m} (a_{k,l} + a_{l,k}) X_l X_k = Y_A$

FIG. 23

$$G[Y_{\tilde{A}}] = G\left[\tilde{a}_0 + \sum_{k=1}^{m} \tilde{a}_k X_k + \sum_{k=1}^{m-1} \sum_{l=k+1}^{m} \tilde{a}_{k,l} X_k X_l\right]$$

$$= \tilde{a}_0 + \sum_{k=1}^{m} \tilde{a}_k \chi_k + \sum_{k=1}^{m-1} \sum_{l=k+1}^{m} \tilde{a}_{k,l} X_k X_l$$

$$\chi_k = \begin{cases} 0 & \text{if } p_k < 0.5 \\ 1 & \text{if } p_k > 0.5 \\ 0.5 & \text{if } p_k = 0.5 \end{cases}$$

$$E[Y_A] = E\left[a_0 + \sum_{k=1}^{m} a_k X_k + \sum_{k=1}^{m-1} \sum_{l=k+1}^{m} a_{k,l} X_k X_l\right]$$

$$= a_0 + \sum_{k=1}^{m} a_k p_k + \sum_{k=1}^{m-1} \sum_{l=k+1}^{m} a_{k,l} p_k p_l$$

$$E[Y_A^2] = E\left[(\vec{X}^T A \vec{X})^2\right] = E\left[\left(\sum_{k=0}^{m} a_k X_k + \sum_{k=1}^{m-1} \sum_{l=k+1}^{m} a_{k,l} X_k X_l\right)^2\right]$$

$$= a_0^2 + \left(\sum_{k=1}^{m} a_k^2 p_k\right) + \left(\sum_{k=0}^{m} \sum_{\substack{l=k \\ l \neq k}}^{\{0,\cdots,m\}} a_k a_l p_k p_l\right)$$

$$+ 2\left(\sum_{i=0}^{m-1} \sum_{k=1}^{m-1} \sum_{l=k+1}^{m} a_i a_{k,l} \prod_{t \in \{i\} \cup \{k\} \cup \{l\}} p_t\right)$$

$$+ \left(\sum_{i=1}^{m-1} \sum_{j=i+1}^{m} \sum_{k=1}^{m-1} \sum_{l=k+1}^{m} a_{i,j} a_{k,l} \prod_{t \in \{i\} \cup \{j\} \cup \{k\} \cup \{l\}} p_t\right)$$

$$= \sum_{k=0}^{m} a_k^2 \{p_k - p_k^2\} + 2 \sum_{i=0}^{m-1} \sum_{k=i+1}^{m} \sum_{l=k+1}^{m} a_i a_{k,l} \left\{ \prod_{q \in \{i\} \cup \{k\} \cup \{l\}} p_q - p_i p_k p_l \right\}$$

$$+ \sum_{i=1}^{m-1} \sum_{k=i+1}^{m} \sum_{l=k+1}^{m} a_{i,j} a_{k,l} \left\{ \prod_{q \in \{i\} \cup \{j\} \cup \{k\} \cup \{l\}} p_q - p_i p_j p_k p_l \right\}$$

$$= \sum_{k=1}^{m} a_k^2 p_k (1-p_k) + 2 \sum_{k=1}^{m-1} \sum_{l=k+1}^{m} a_{k,l} \{a_k p_k p_l (1-p_k) + a_l p_k p_l (1-p_l)\}$$

$$+ \sum_{k=1}^{m-1} \sum_{l=k+1}^{m} a_{k,l}^2 p_k p_l (1 - p_k p_l)$$

$$+ \sum_{k=1}^{m-1} \sum_{l=k+1}^{m} \sum_{\substack{j \neq l \\ \{k+1,\ldots,m\}}} a_{k,j} a_{k,l}^2 (1 - p_k) p_j p_k p_l$$

$$+ \sum_{k=1}^{m-1} \sum_{l=k+1}^{m} \sum_{\substack{j=l+1 \\ k-1}}^{m} a_{l,j} a_{k,l} (1 - p_l) p_j p_k p_l$$

$$+ \sum_{k=1}^{m-1} \sum_{l=k+1}^{m} \sum_{\substack{i=1 \\ \{1,\ldots,l-1\}}}^{m} a_{i,k} a_{k,l} p_i (1 - p_k) p_k p_l$$

$$+ \sum_{k=1}^{m-1} \sum_{l=k+1}^{m} \sum_{\substack{i \neq k}}^{m} a_{i,l} a_{k,l} p_i (1 - p_l) p_k p_l$$

$$E[Y_A]E[Y_B] = \left(\sum_{k=0}^{m} a_k p_k + \sum_{k=1}^{m-1} \sum_{l=k+1}^{m} a_{k,l} p_k p_l\right)\left(\sum_{k=0}^{m} b_k p_k + \sum_{k=1}^{m-1} \sum_{l=k+1}^{m} b_{k,l} p_k p_l\right)$$

$$= \sum_{k=0}^{m} \sum_{l=0}^{m} a_k b_l p_k p_l + \sum_{i=0}^{m} \sum_{k=1}^{m-1} \sum_{l=k+1}^{m} (a_i b_{k,l} + b_i a_{k,l}) p_i p_k p_l$$

$$+ \sum_{i=1}^{m-1} \sum_{j=i+1}^{m} \sum_{k=1}^{m-1} \sum_{l=k+1}^{m} a_{i,j} b_{k,l} p_i p_j p_k p_l \qquad (EQ\ 2)$$

FIG. 28A $$\begin{aligned}
E[Y_A Y_B] &= E\left[\left(\sum_{k=0}^{m} a_k p_k + \sum_{k=1}^{m-1}\sum_{l=k+1}^{m} a_{k,l} p_k p_l\right)\left(\sum_{k=0}^{m} b_k p_k + \sum_{k=1}^{m-1}\sum_{l=k+1}^{m} b_{k,l} p_k p_l\right)\right] \\
&= E\left[\sum_{k=0}^{m}\sum_{l=0}^{m} a_k b_l X_k X_l + \sum_{i=0}^{m}\sum_{k=1}^{m-1}\sum_{l=k+1}^{m}(a_i b_{k,l} + b_i a_{k,l}) X_i X_k X_l \right. \\
&\quad \left. + \sum_{i=1}^{m}\sum_{j=i+1}^{m}\sum_{k=1}^{m-1}\sum_{l=k+1}^{m} a_{i,j} b_{k,l} X_i X_j X_k X_l\right] \\
&= \sum_{k=0}^{m-1}\sum_{l=0}^{m} a_k b_l E[X_k X_l] + \sum_{i=0}^{m}\sum_{k=1}^{m-1}\sum_{l=k+1}^{m}(a_i b_{k,l} + b_i a_{k,l}) E[X_i X_k X_l] \\
&\quad + \sum_{i=1}^{m}\sum_{j=i+1}^{m}\sum_{k=1}^{m-1}\sum_{l=k+1}^{m} a_{i,j} b_{k,l} E[X_i X_j X_k X_l] \\
&= \sum_{k=0}^{m-1} a_k b_l \prod_{q \in \{k\} \cup \{l\}} p_q + \sum_{i=0}^{m}\sum_{k=1}^{m-1}\sum_{l=k+1}^{m}(a_i b_{k,l} + b_i a_{k,l}) \prod_{q \in \{i\} \cup \{k\} \cup \{l\}} p_q \\
&\quad + \sum_{i=1}^{m}\sum_{j=i+1}^{m}\sum_{k=1}^{m-1}\sum_{l=k+1}^{m} a_{i,j} b_{k,l} \prod_{q \in \{i\} \cup \{j\} \cup \{k\} \cup \{l\}} p_q
\end{aligned}$$

(EQ 3)

FIG. 28B $$\begin{aligned}
Cov[Y_A, Y_B] &= E[Y_A Y_B] - E[Y_A]E[Y_B] \\
&= \sum_{k=0}^{m} \sum_{l=0}^{m} a_k b_l \underbrace{\prod_{q \in \{k\} \cup \{l\}} p_q - p_k p_l}_{} \\
&+ \sum_{i=0}^{m-1} \sum_{k=i+1}^{m} (a_i b_{k,l} + b_i a_{k,l}) \underbrace{\prod_{q \in \{i\} \cup \{k\} \cup \{l\}} p_q - p_i p_k p_l}_{} \\
&+ \sum_{i=1}^{m-1} \sum_{j=i+1}^{m} \sum_{k=1}^{\{k+1,\ldots,m\}} \sum_{l=k+1}^{m} a_{i,j} b_{k,l} \underbrace{\prod_{q \in \{i\} \cup \{j\} \cup \{k\} \cup \{l\}} p_q - p_i p_j p_k p_l}_{} \\
&= \sum_{k=1}^{m} a_k b_k p_k (1 - p_k) \\
&+ \sum_{k=1}^{m-1} \sum_{l=k+1}^{m} \{(a_k b_{k,l} + b_k a_{k,l}) p_k p_l (1 - p_k) + (a_l b_{k,l} + b_l a_{k,l}) p_k p_l (1 - p_l)\} \\
&+ \sum_{k=1}^{m-1} \sum_{l=k+1}^{m} \sum_{j=l+1}^{\{k+1,\ldots,m\}} a_{k,j} b_{k,l} p_k p_l (1 - p_k) + \sum_{k=1}^{m-1} \sum_{l=k+1}^{m} \sum_{j \neq l}^{\{k+1,\ldots,m\}} a_{k,j} b_{k,l} (1 - p_k) p_j p_k p_l \\
&+ \sum_{k=1}^{m-1} \sum_{l=k+1}^{m} \sum_{j=l+1}^{\{1,\ldots,l-1\}} a_{i,j} b_{k,l} (1 - p_l) p_j p_k p_l + \sum_{k=1}^{m-1} \sum_{l=k+1}^{m} \sum_{i=1}^{k-1} a_{i,k} b_{k,l} p_i (1 - p_k) p_k p_l \\
&+ \sum_{k=1}^{m-1} \sum_{l=k+1}^{m} \sum_{i \neq k}^{\{1,\ldots,l-1\}} a_{i,l} b_{k,l} p_i (1 - p_l) p_k p_l
\end{aligned}$$

$$\rho_{A,B} = \frac{Cov[Y_A, Y_B]}{\sqrt{V[Y_A]V[Y_B]}}$$

$$\approx \frac{\sum_{k=1}^{m} a_k b_k p_k (1-p_k) + \sum_{k=1}^{m-1} \sum_{l=k+1}^{m} \{(a_k b_{k,l} + b_k a_{k,l}) p_k p_l (1-p_k) + (a_l b_{k,l} + b_l a_{k,l}) p_k p_l (1-p_l)\} + \cdots}{\sqrt{\sum_{k=1}^{m} a_k^2 p_k (1-p_k) + 2 \sum_{k=1}^{m-1} \sum_{l=k+1}^{m} a_{k,l} \{a_k p_k p_l (1-p_k) + a_l p_k p_l (1-p_l)\} + \cdots} \cdot \sqrt{\sum_{k=1}^{m} b_k^2 p_k (1-p_k) + 2 \sum_{k=1}^{m-1} \sum_{l=k+1}^{m} b_{k,l} \{b_k p_k p_l (1-p_k) + b_l p_k p_l (1-p_l)\} + \cdots}}$$

An LRV can be transformed to an equivalent QRV with a diagonal coefficient matrix.

$$Y_a = \sum_{k=0}^{m} a_k X_k = \sum_{k=0}^{m} a_k X_k X_k = [X_0 \ X_1 \ X_2 \ \cdots \ X_m] \begin{bmatrix} a_0 & 0 & 0 & \cdots & 0 \\ 0 & a_1 & 0 & \cdots & 0 \\ 0 & 0 & a_2 & \cdots & 0 \\ \vdots & \vdots & \vdots & \ddots & \vdots \\ 0 & 0 & 0 & \cdots & a_m \end{bmatrix} \begin{bmatrix} X_0 \\ X_1 \\ X_2 \\ \vdots \\ X_m \end{bmatrix}$$

A QRV with a diagonal coefficient matrix is equivalent to an LRV.

$$Y_A = [X_0 \ X_1 \ X_2 \ \cdots \ X_m] \begin{bmatrix} a_{0,0} & 0 & 0 & \cdots & 0 \\ 0 & a_{1,1} & 0 & \cdots & 0 \\ 0 & 0 & a_{2,2} & \cdots & 0 \\ \vdots & \vdots & \vdots & \ddots & \vdots \\ 0 & 0 & 0 & \cdots & a_{m,m} \end{bmatrix} \begin{bmatrix} X_0 \\ X_1 \\ X_2 \\ \vdots \\ X_m \end{bmatrix} = \sum_{k=0}^{m} a_{k,k} X_k X_k = \sum_{k=0}^{m} a_{k,k} X_k$$

FIG. 31

Suppose the following QRV in a canonical form is given:

$$Y_A = \vec{X}^T A \vec{X}$$

$$A = \begin{bmatrix} a_0 & 0 & a_1 & 0 & a_{1,2} & \cdots & \cdots & a_{1,m} \\ 0 & 0 & \cdots & a_2 & \cdots & \cdots & a_{2,m} \\ \vdots & \vdots & \vdots & \vdots & \ddots & \vdots \\ 0 & 0 & \cdots & 0 & \cdots & \cdots & a_m \end{bmatrix}$$

This is transformed to the following LRV:

$$Y_b \equiv \sum_{k=0}^{m} b_k X_k$$

$$b_0 \equiv a_0$$

$$b_k \equiv a_k + \frac{1}{2}\left(\sum_{l=1}^{k-1} a_{l,k} \chi_l + \sum_{l=k+1}^{m} a_{k,l} \chi_l\right)$$

$\chi_l$ is locally determined value of $X_l$ as $$\chi_l \to \begin{cases} 1 & \text{randomly at probability } p_l \\ 0 & \text{randomly at probability } (1 - p_l) \end{cases}$$

FIG. 32

Before transformation $$G[Y_A] = G[\vec{X}^T A \vec{X}] = G\left[a_0 + \sum_{k=1}^{m} a_k X_k + \sum_{k=1}^{m-1} \sum_{l=k+1}^{m} a_{k,l} X_k X_l\right] = a_0 + \sum_{k=1}^{m} a_k X_k + \sum_{k=1}^{m-1} \sum_{l=k+1}^{m} a_{k,l} X_k X_l$$

$$X_k = \begin{cases} 0 & \text{if } p_k < 0.5 \\ 1 & \text{if } p_k > 0.5 \\ 0.5 & \text{if } p_k = 0.5 \end{cases}$$

After transformation $$G[Y_b] = G\left[\sum_{k=0}^{m} b_k X_k\right] = b_0 + \sum_{k=1}^{m} b_k X_k = a_0 + \sum_{k=1}^{m} a_k X_k + \sum_{k=1}^{m} \left\{\frac{1}{2}\left(\sum_{l=1}^{k-1} a_{l,k}\zeta_l + \sum_{l=k+1}^{m} a_{k,l}\zeta_l\right)\right\} X_k$$

$\zeta_l$ is locally determined value of $X_l$ as $$\zeta_l \to \begin{cases} 1 & \text{randomly at probability } p_l \\ 0 & \text{randomly at probability } (1 - p_l) \end{cases}$$

Hence, this transformation may change the ground, if $p_k \geq 0.5$ for some $k \in \{1, \cdots, m\}$.
However, this transformation does not change the ground, if $p_k < 0.5$ for all $k \in \{1, \cdots, m\}$, because $X_k$ is always zero.

FIG. 33

Before transformation $$E[Y_A] = E[\vec{X}^T A \vec{X}] = E\left[a_0 + \sum_{k=1}^{m} a_k X_k + \sum_{k=1}^{m-1}\sum_{l=k+1}^{m} a_{k,l} X_k X_l\right] = a_0 + \sum_{k=1}^{m} a_k p_k + \sum_{k=1}^{m-1}\sum_{l=k+1}^{m} a_{k,l} p_k p_l$$

After transformation $$E[Y_b] = E\left[\sum_{k=0}^{m} b_k X_k\right] = E\left[a_0 + \sum_{k=1}^{m}\left\{a_k + \frac{1}{2}\left(\sum_{l=1}^{k-1} a_{l,k} X_l + \sum_{l=k+1}^{m} a_{k,l} X_l\right)\right\} X_k\right]$$

$$= a_0 + E\left[\sum_{k=1}^{m} a_k X_k\right] + \frac{1}{2} E\left[\sum_{k=2}^{m}\sum_{l=1}^{k-1} a_{l,k} X_l X_k\right] + \frac{1}{2} E\left[\sum_{k=1}^{m-1}\sum_{l=k+1}^{m} a_{k,l} X_l X_k\right]$$

$$= a_0 + \sum_{k=1}^{m} a_k p_k + \frac{1}{2} E\left[\sum_{k=1}^{m-1}\sum_{l=k+1}^{m} a_{k,l} X_l X_k\right] + \frac{1}{2} E\left[\sum_{k=1}^{m-1}\sum_{l=k+1}^{m} a_{k,l} X_l X_k\right]$$

$$= a_0 + \sum_{k=1}^{m} a_k p_k + \frac{1}{2} E\left[\sum_{k=1}^{m-1}\sum_{l=k+1}^{m} a_{k,l} X_k X_l\right] + \frac{1}{2} E\left[\sum_{k=1}^{m-1}\sum_{l=k+1}^{m} a_{k,l} X_l X_k\right]$$

$$= a_0 + \sum_{k=1}^{m} a_k p_k + \frac{1}{2} \sum_{k=1}^{m-1}\sum_{l=k+1}^{m} a_{k,l} p_k p_l + \frac{1}{2} \sum_{k=1}^{m-1}\sum_{l=k+1}^{m} a_{k,l} p_l p_k = a_0 + \sum_{k=1}^{m} a_k p_k + \sum_{k=1}^{m-1}\sum_{l=k+1}^{m} a_{k,l} p_k p_l$$

$$= E[Y_A]$$

Hence, this transformation does not change the mean.

FIG. 34

Before transformation $$E[Y_A^2] = E\left[(\vec{X}^T A \vec{X})^2\right] = E\left[\left(\sum_{k=0}^{m} a_k X_k + \sum_{k=1}^{m-1}\sum_{l=k+1}^{m} a_{k,l} X_k X_l\right)^2\right]$$

$$= a_0^2 + \left(\sum_{k=1}^{m} a_k^2 p_k\right) + \left(\sum_{k=0}^{m\,\{0,\cdots,m\}}\sum_{l\neq k} a_k a_l p_k p_l\right) + 2\left(\sum_{i=0}^{m}\sum_{k=1}^{m-1}\sum_{l=k+1}^{m} a_i a_{k,l} \prod_{t\in\{i\}\cup\{k\}\cup\{l\}} p_t\right)$$

$$+ \left(\sum_{i=1}^{m-1}\sum_{j=i+1}^{m}\sum_{k=1}^{m-1}\sum_{l=k+1}^{m} a_{i,j} a_{k,l} \prod_{t\in\{i\}\cup\{j\}\cup\{k\}\cup\{l\}} p_t\right)$$

FIG. 35A

After transformation $$E[Y_b^2] = E\left[\left(\sum_{k=0}^{m} b_k X_k\right)^2\right] = E\left[\left\{\sum_{k=0}^{m} a_k X_k + \sum_{k=1}^{m} \frac{1}{2}\left(\sum_{l=1}^{k-1} a_{l,k} X_l + \sum_{l=k+1}^{m} a_{k,l} X_l\right) X_k\right\}^2\right]$$

$$= E\left[\left(\sum_{k=0}^{m} a_k X_k\right)^2\right] + 2E\left[\left(\sum_{i=0}^{m} a_i X_i\right)\left(\sum_{k=1}^{m} \frac{1}{2}\left(\sum_{l=1}^{k-1} a_{l,k} X_l + \sum_{l=k+1}^{m} a_{k,l} X_l\right) X_k\right)\right]$$

$$+ E\left[\left\{\sum_{i=1}^{m} \frac{1}{2}\left(\sum_{j=1}^{i-1} a_{j,i} X_j + \sum_{j=i+1}^{m} a_{i,j} X_j\right) X_i\right\}\left\{\sum_{k=1}^{m} \frac{1}{2}\left(\sum_{l=1}^{k-1} a_{l,k} X_l + \sum_{l=k+1}^{m} a_{k,l} X_l\right) X_k\right\}\right]$$

$$= a_0^2 + \left(\sum_{k=1}^{m} a_k^2 p_k\right) + \sum_{k=0}^{m \{0,\cdots,m\}} a_k a_l p_k p_l \left(\prod_{t \in \{i\} \cup \{k\}} p_t\right)$$

$$+ \sum_{i=0}^{m} \sum_{k=1}^{m} a_i \left(\sum_{l=1}^{k-1} a_{l,k} p_l + \sum_{l=k+1}^{m} a_{k,l} p_l\right)\left(\prod_{t \in \{i\} \cup \{k\}} p_t\right)$$

$$+ \frac{1}{4}\left(\sum_{i=1}^{m} \sum_{k=1}^{m} \left(\sum_{j=1}^{i-1} a_{j,i} p_j + \sum_{j=i+1}^{m} a_{i,j} p_j\right)\left(\sum_{l=1}^{k-1} a_{l,k} p_l + \sum_{l=k+1}^{m} a_{k,l} p_l\right)\prod_{t \in \{i\} \cup \{k\}} p_t\right)$$

Hence, this transformation may change second moment, variance, covariance, correlation coefficient, etc.

FIG. 35B

The above HRV $Y_{\tilde{A}}$ can be transformed to an equivalent canonical form as follows:

$$Y_{\tilde{A}} \equiv \tilde{a}_0 + \sum_{k=1}^{m} \tilde{a}_k X_k + \sum_{k_1=1}^{m-1} \sum_{k_2=k_1+1}^{m} \tilde{a}_{k_1,k_2} X_{k_1} X_{k_2} + \cdots$$

$$+ \sum_{k_1=1}^{m-d+1} \sum_{k_2=k_1+1}^{m-d+2} \sum_{k_3=k_2+1}^{m-d+3} \cdots \sum_{k_d=k_{d-1}+1}^{m} \tilde{a}_{k_1,k_2,\cdots,k_d} X_{k_1} X_{k_2} \cdots X_{k_d}$$

$\tilde{a}_0 \equiv a_{0,0,\cdots,0}$ $\tilde{a}_k \equiv \sum_{(\{l_1\}\cup\{l_2\}\cdots\cup\{l_d\})-\{0\}=\{k\}} a_{l_1,l_2,\cdots,l_d}$  $(k \in \{1,2,\cdots,m\})$ $\tilde{a}_{k_1,k_2} \equiv \sum_{(\{l_1\}\cup\{l_2\}\cdots\cup\{l_d\})-\{0\}=\{k_1,k_2\}} a_{l_1,l_2,\cdots,l_d}$  $(k_1 \in \{1,2,\cdots,m-1\}, k_2 \in \{k_1+1, k_1+2,\cdots,m\})$ $\tilde{a}_{k_1,k_2,\cdots,k_d} \equiv \sum_{(\{l_1\}\cup\{l_2\}\cdots\cup\{l_d\})-\{0\}=\{k_1,k_2,\cdots,k_d\}} a_{l_1,l_2,\cdots,l_d}$ $(k_1 \in \{1,2,\cdots,m-d+1\}, k_2 \in \{k_1+1,\cdots,m-d+2\},\cdots,\quad k_d \in \{k_{d-1}+1,\cdots,m\})$ In the canonical form, the order of an HRV is guaranteed to be less than or equal to $m$.

FIG. 36A

Proof of equivalence of the canonical form:

$$Y_A = \sum_{k_1=0}^{m}\sum_{k_2=0}^{m}\cdots\sum_{k_d=0}^{m} a_{k_1,k_2,\ldots,k_d} X_{k_1} X_{k_2} \cdots X_{k_d}$$

$$= a_{0,0,\ldots,0} X_0 X_0 \cdots X_0$$
$$+ [\{a_{1,0,\ldots,0} X_1 X_0 \cdots X_0 + a_{0,1,\ldots,0} X_0 X_1 \cdots X_0 + \cdots + a_{1,1,\ldots,0} X_1 X_1 \cdots X_0 + \cdots + a_{1,1,\ldots,1} X_1 X_1 \cdots X_1\}$$
$$+ \{a_{2,0,\ldots,0} X_2 X_0 \cdots X_0 + a_{0,2,\ldots,0} X_0 X_2 \cdots X_0 + a_{2,2,\ldots,0} X_2 X_2 \cdots X_0 + \cdots + a_{2,2,\ldots,2} X_2 X_2 \cdots X_2\} + \cdots$$
$$+ \{a_{m,0,\ldots,0} X_m X_0 \cdots X_0 + a_{0,m,\ldots,0} X_0 X_m \cdots X_0 + a_{m,m,\ldots,0} X_m X_m \cdots X_0 + \cdots$$
$$+ a_{m,m,\ldots,m} X_m X_m \cdots X_m\}]$$
$$+ [\{a_{1,2,0,\ldots,0} X_1 X_2 X_0 \cdots X_0 + a_{2,1,0,\ldots,0} X_2 X_1 X_0 \cdots X_0 + a_{1,1,2,0,\ldots,0} X_1 X_1 X_2 X_0 \cdots X_0 + \cdots$$
$$+ a_{1,\ldots,1,2} X_1 \cdots X_1 X_2 + a_{2,\ldots,2,1} X_2 \cdots X_2 X_1 + \cdots + a_{1,2,\ldots,2} X_1 X_2 \cdots X_2 + a_{2,1,\ldots,1} X_2 X_1 \cdots X_1\}$$
$$+ \{a_{1,3,0,\ldots,0} X_1 X_3 X_0 \cdots X_0 + a_{3,1,0,\ldots,0} X_3 X_1 X_0 \cdots X_0 + a_{1,1,3,0,\ldots,0} X_1 X_1 X_3 X_0 \cdots X_0 + \cdots$$
$$+ a_{1,\ldots,1,3} X_1 \cdots X_1 X_3 + a_{3,\ldots,3,1} X_3 \cdots X_3 X_1 + \cdots + a_{1,3,\ldots,3} X_1 X_3 \cdots X_3 + a_{3,1,\ldots,1} X_3 X_1 \cdots X_1\} + \cdots$$
$$+ \{a_{m-1,m,0,\ldots,0} X_{m-1} X_m X_0 \cdots X_0 + a_{m,m-1,0,\ldots,0} X_m X_{m-1} X_0 \cdots X_0 + \cdots$$
$$+ a_{m-1,\ldots,m-1,m} X_{m-1} \cdots X_{m-1} X_m + a_{m,\ldots,m,m-1} X_m \cdots X_m X_{m-1} + \cdots$$
$$+ a_{m-1,m,\ldots,m} X_{m-1} X_m \cdots X_m + a_{m,m-1,\ldots,m-1} X_m X_{m-1} \cdots X_{m-1}\}] + \cdots$$
$$+ [\{a_{1,2,3,\ldots,d} X_1 X_2 X_3 \cdots X_d + a_{1,2,3,\ldots,d-2,d,d-1} X_1 X_2 X_3 \cdots X_{d-2} X_d X_{d-1} + \cdots$$
$$+ a_{d,d-1,\ldots,2,1} X_d X_{d-1} \cdots X_2 X_1\} + \cdots$$
$$+ \{a_{m-d+1,m-d+2,\ldots,m-1,m} X_{m-d+1} X_{m-d+2} \cdots X_{m-1} X_m + \cdots$$
$$+ a_{m,m-1,\ldots,m-d+2,m-d+1} X_m X_{m-1} \cdots X_{m-d+2} X_{m-d+1}\}] = a_{0,0,\ldots,0}$$

FIG. 36B $$+ [\{a_{1,0,\ldots,0} + a_{0,1,\ldots,0} + \cdots + a_{1,1,\ldots,1}\}X_1 + \{a_{2,0,\ldots,0} + a_{0,2,\ldots,0} + \cdots + a_{2,2,\ldots,2}\}X_2 + \cdots$$
$$+ \{a_{m,0,\ldots,0} + a_{0,m,\ldots,0} + a_{m,m,\ldots,0} + \cdots + a_{m,m,\ldots,m}\}X_m]$$
$$+ [\{a_{1,2,0,\ldots,0} + a_{2,1,0,\ldots,0} + a_{1,1,2,0,\ldots,0} + \cdots + a_{1,\ldots,1,2} + a_{2,\ldots,2,1} + \cdots + a_{1,2,\ldots,2} + a_{2,1,\ldots,1}\}X_1 X_2$$
$$+ \{a_{1,3,0,\ldots,0} + a_{3,1,0,\ldots,0} + a_{1,1,3,0,\ldots,0} + \cdots + a_{1,\ldots,1,3} + a_{3,\ldots,3,1} + \cdots + a_{1,3,\ldots,3} + a_{3,1,\ldots,1}\}X_1 X_3$$
$$+ \cdots$$
$$+ \{a_{m-1,m,0,\ldots,0} + a_{m,m-1,0,\ldots,0} + \cdots + a_{m,m-1,m} + a_{m,\ldots,m,m-1} + \cdots + a_{m-1,m,\ldots,m}$$
$$+ a_{m,m-1,\ldots,m-1}\}X_{m-1}X_m] + \cdots$$
$$+ [\{a_{1,2,3,\ldots,d} + a_{1,2,3,\ldots,d-2,d,d-1} + \cdots + a_{d,d-1,\ldots,2,1}\}X_1 X_2 X_3 \cdots X_d + \cdots$$
$$+ \{a_{m-d+1,m-d+2,\ldots,m-1,m} + \cdots + a_{m,m-1,\ldots,m-d+1}\}X_{m-d+1}X_{m-d+2}\cdots X_{m-1}X_m]$$
$$= \tilde{a}_0 + [\tilde{a}_1 X_1 + \tilde{a}_2 X_2 + \cdots + a_m X_m] + [\tilde{a}_{1,2} X_1 X_2 + \tilde{a}_{1,3} X_1 X_3 + \cdots + \tilde{a}_{m-1,m} X_{m-1} X_m] + \cdots$$
$$+ [\tilde{a}_{1,2,3,\ldots,d} X_1 X_2 X_3 \cdots X_d + \cdots + \tilde{a}_{m-d+1,m-d+2,\ldots,m-1,m} X_{m-d+1} X_{m-d+2} \cdots X_{m-1} X_m]$$

$$= \tilde{a}_0 + \sum_{k=1}^{m} \tilde{a}_k X_k + \sum_{k_1=1}^{m-1} \sum_{k_2=k_1+1}^{m} \tilde{a}_{k_1,k_2} X_{k_1} X_{k_2} + \cdots$$
$$+ \sum_{k_1=1}^{m-d+1} \sum_{k_2=k_1+1}^{m-d+2} \sum_{k_3=k_2+1}^{m-d+3} \cdots \sum_{k_d=k_{d-1}+1}^{m} \tilde{a}_{k_1,k_2,\ldots,k_d} X_{k_1} X_{k_2} \cdots X_{k_d} = Y_{\tilde{A}}$$

FIG. 36C $$G[Y_d] = G\left[\tilde{a}_0 + \sum_{k=1}^{m} \tilde{a}_k X_k + \sum_{k_1=1}^{m-1} \sum_{k_2=k_1+1}^{m} \tilde{a}_{k_1,k_2} X_{k_1} X_{k_2} + \cdots \right.$$

$$+ \sum_{k_1=1}^{m-d+1} \sum_{k_2=k_1+1}^{m-d+2} \cdots \sum_{k_d=k_{d-1}+1}^{m} \tilde{a}_{k_1,k_2,\ldots,k_d} X_{k_1} X_{k_2} \cdots X_{k_d} \Bigg]$$

$$= \tilde{a}_0 + \sum_{k=1}^{m} \tilde{a}_k \mathcal{X}_k + \sum_{k_1=1}^{m-1} \sum_{k_2=k_1+1}^{m} \tilde{a}_{k_1,k_2} \mathcal{X}_{k_1} \mathcal{X}_{k_2} + \cdots$$

$$+ \sum_{k_1=1}^{m-d+1} \sum_{k_2=k_1+1}^{m-d+2} \cdots \sum_{k_d=k_{d-1}+1}^{m} \tilde{a}_{k_1,k_2,\ldots,k_d} \mathcal{X}_{k_1} \mathcal{X}_{k_2} \cdots \mathcal{X}_{k_d}$$

$$\mathcal{X}_k = \begin{cases} 0 & \text{if } p_k < 0.5 \\ 1 & \text{if } p_k > 0.5 \\ 0.5 & \text{if } p_k = 0.5 \end{cases}$$

$$E[Y_A] = E\left[\sum_{k_1=0}^{m}\sum_{k_2=0}^{m}\cdots\sum_{k_d=0}^{m} a_{k_1,k_2,\ldots,k_d} X_{k_1} X_{k_2} \cdots X_{k_d}\right]$$

$$= E\left[\sum_{k_1=0}^{m}\sum_{k_2=0}^{m}\cdots\sum_{k_d=0}^{m} \tilde{a}_{k_1,k_2,\ldots,k_d} \prod_{t\in\{k_1\}\cup\{k_2\}\cup\ldots\cup\{k_d\}} p_t\right]$$

$$= E\left[\tilde{a}_0 + \sum_{k=1}^{m} \tilde{a}_k X_k + \sum_{k_1=1}^{m-1}\sum_{k_2=k_1+1}^{m} \tilde{a}_{k_1,k_2} X_{k_1} X_{k_2} + \cdots \right.$$

$$\left. + \sum_{k_1=1}^{m-d+1}\sum_{k_2=k_1+1}^{m}\cdots\sum_{k_d=k_{d-1}+1}^{m} \tilde{a}_{k_1,k_2,\ldots,k_d} X_{k_1} X_{k_2} \cdots X_{k_d}\right]$$

$$= \tilde{a}_0 + \sum_{k=1}^{m} \tilde{a}_k p_k + \sum_{k_1=1}^{m-1}\sum_{k_2=k_1+1}^{m} \tilde{a}_{k_1,k_2} p_{k_1} p_{k_2} + \cdots$$

$$+ \sum_{k_1=1}^{m-d+1}\sum_{k_2=k_1+1}^{m}\cdots\sum_{k_d=k_{d-1}+1}^{m} \tilde{a}_{k_1,k_2,\ldots,k_d} p_{k_1} p_{k_2} \cdots p_{k_d}$$

$$E[Y_A^2]$$
$$= E\left[\left(\sum_{k_1=0}^{m}\sum_{k_2=0}^{m}\cdots\sum_{k_d=0}^{m}a_{k_1,k_2,\ldots,k_d}X_{k_1}X_{k_2}\cdots X_{k_d}\right)\right.$$
$$\left.\times\left(\sum_{l_1=0}^{m}\sum_{l_2=0}^{m}\cdots\sum_{l_d=0}^{m}a_{l_1,l_2,\ldots,l_d}X_{l_1}X_{l_2}\cdots X_{l_d}\right)\right]$$
$$=\sum_{k_1=0}^{m}\sum_{k_2=0}^{m}\cdots\sum_{k_d=0}^{m}\sum_{l_1=0}^{m}\sum_{l_2=0}^{m}\cdots\sum_{l_d=0}^{m}a_{k_1,k_2,\ldots,k_d}a_{l_1,l_2,\ldots,l_d}\prod_{t\in\{k_1\}\cup\{k_2\}\cup\cdots\cup\{k_d\}\cup\{l_1\}\cup\{l_2\}\cup\cdots\cup\{l_d\}}p_t$$

$$= \sum_{k_1=0}^{m}\sum_{k_2=0}^{m}\cdots\sum_{k_d=0}^{m}\sum_{l_1=0}^{m}\sum_{l_2=0}^{m}\cdots\sum_{l_d=0}^{m} a_{k_1,k_2,\ldots,k_d} a_{l_1,l_2,\ldots,l_d}$$

$$\left(\prod_{t\in\{k_1\}\cup\{k_2\}\cup\cdots\cup\{k_d\}} p_t\right) \left(\prod_{t\in\{l_1\}\cup\{l_2\}\cup\cdots\cup\{l_d\}} p_t\right)$$

$$\times \left(\prod_{t\in\{k_1\}\cup\{k_2\}\cup\cdots\cup\{k_d\}\cup\{l_1\}\cup\{l_2\}\cup\cdots\cup\{l_d\}} p_t\right)$$

$$= \sum_{k_1=0}^{m}\sum_{k_2=0}^{m}\cdots\sum_{k_d=0}^{m}\sum_{l_1=0}^{m}\sum_{l_2=0}^{m}\cdots\sum_{l_d=0}^{m} a_{k_1,k_2,\ldots,k_d} a_{l_1,l_2,\ldots,l_d}$$

$$\left(\left(\prod_{t\in\{k_1\}\cup\{k_2\}\cup\cdots\cup\{k_d\}} p_t\right)\left(\prod_{t\in\{l_1\}\cup\{l_2\}\cup\cdots\cup\{l_d\}} p_t\right) - \left(\prod_{t\in\{k_1\}\cup\{k_2\}\cup\cdots\cup\{k_d\}\cup\{l_1\}\cup\{l_2\}\cup\cdots\cup\{l_d\}} p_t\right)\right)$$

$$E[Y_A]E[Y_B] = E\left[\left(\sum_{k_1=0}^{m}\sum_{k_2=0}^{m}\cdots\sum_{k_{d_A}=0}^{m} a_{k_1,k_2,\cdots,k_{d_A}} X_{k_1} X_{k_2} \cdots X_{k_{d_A}}\right)\right] E\left[\left(\sum_{l_1=0}^{m}\sum_{l_2=0}^{m}\cdots\sum_{l_{d_B}=0}^{m} b_{l_1,l_2,\cdots,l_{d_B}} X_{l_1} X_{l_2} \cdots X_{l_{d_B}}\right)\right]$$

$$= \left(\sum_{k_1=0}^{m}\sum_{k_2=0}^{m}\cdots\sum_{k_{d_A}=0}^{m} a_{k_1,k_2,\cdots,k_{d_A}} \prod_{t \in \{k_1\} \cup \{k_2\} \cup \cdots \cup \{k_{d_A}\}} p_t\right)\left(\sum_{l_1=0}^{m}\sum_{l_2=0}^{m}\cdots\sum_{l_{d_B}=0}^{m} b_{l_1,l_2,\cdots,l_{d_B}} \prod_{t \in \{l_1\} \cup \{l_2\} \cup \cdots \cup \{l_{d_B}\}} p_t\right) \quad \text{(EQ 5)}$$

FIG. 41A $$E[Y_A Y_B] = E\left[\left(\sum_{k_1=0}^{m}\sum_{k_2=0}^{m}\cdots\sum_{k_{d_A}=0}^{m} a_{k_1,k_2,\ldots,k_{d_A}} X_{k_1} X_{k_2} \cdots X_{k_{d_A}}\right)\left(\sum_{l_1=0}^{m}\sum_{l_2=0}^{m}\cdots\sum_{l_{d_B}=0}^{m} b_{l_1,l_2,\ldots,l_{d_B}} X_{l_1} X_{l_2} \cdots X_{l_{d_B}}\right)\right]$$

$$= \sum_{k_1=0}^{m}\sum_{k_2=0}^{m}\cdots\sum_{k_{d_A}=0}^{m}\sum_{l_1=0}^{m}\sum_{l_2=0}^{m}\cdots\sum_{l_{d_B}=0}^{m} a_{k_1,k_2,\ldots,k_{d_A}} b_{l_1,l_2,\ldots,l_{d_B}} \prod_{t \in \{k_1\} \cup \{k_2\} \cup \cdots \cup \{k_{d_A}\} \cup \{l_1\} \cup \{l_2\} \cup \cdots \cup \{l_{d_B}\}} p_t$$

(EQ 6)

FIG. 41B $$Cov[Y_A, Y_B] = E[Y_A Y_B] - E[Y_A]E[Y_B]$$

$$= \sum_{k_1=0}^{m} \sum_{k_2=0}^{m} \cdots \sum_{k_{d_A}=0}^{m} \sum_{l_1=0}^{m} \sum_{l_2=0}^{m} \cdots \sum_{l_{d_B}=0}^{m} a_{k_1,k_2,\cdots,k_{d_A}} b_{l_1,l_2,\cdots,l_{d_B}} \left( \prod_{t \in \{l_1\} \cup \{l_2\} \cup \cdots \cup \{l_{d_B}\}} p_t \right) \left( \overbrace{\prod_{t \in \{k_1\} \cup \{k_2\} \cup \cdots \cup \{k_{d_A}\} \cup \{l_1\} \cup \{l_2\} \cup \cdots \cup \{l_{d_B}\}} p_t}^{p_t} \right)$$

$$- \sum_{k_1=0}^{m} \sum_{k_2=0}^{m} \cdots \sum_{k_{d_A}=0}^{m} \sum_{l_1=0}^{m} \sum_{l_2=0}^{m} \cdots \sum_{l_{d_B}=0}^{m} a_{k_1,k_2,\cdots,k_{d_A}} b_{l_1,l_2,\cdots,l_{d_B}} \left( \overbrace{\prod_{t \in \{k_1\} \cup \{k_2\} \cup \cdots \cup \{k_{d_A}\}} p_t}^{p_t} \right) \left( \overbrace{\prod_{t \in \{k_1\} \cup \{k_2\} \cup \cdots \cup \{k_{d_A}\} \cup \{l_1\} \cup \{l_2\} \cup \cdots \cup \{l_{d_B}\}} 1}^{1} \right)$$

(EQ 7)

FIG. 41C $$\rho_{A,B} = \frac{Cov[Y_A, Y_B]}{\sqrt{V[Y_A]V[Y_B]}} \quad (EQ\ 8)$$

FIG. 42

$$Y_A \equiv a_0 + \sum_{k=1}^{m} a_k X_k + \sum_{k_1=1}^{m-1} \sum_{k_2=k_1+1}^{m} a_{k_1,k_2} X_{k_1} X_{k_2} + \cdots + \sum_{k_1=1}^{m-d+1} \sum_{k_2=k_1+1}^{m-d+2} \cdots \sum_{k_d=k_{d-1}+1}^{m} a_{k_1,k_2,\cdots,k_d} X_{k_1} X_{k_2} \cdots X_{k_d}$$

This is transformed to the following HRV of order $r(<d)$ by local value assignment:

$$Y_B \equiv b_0 + \sum_{k=1}^{m} b_k X_k + \sum_{k_1=1}^{m-1} \sum_{k_2=k_1+1}^{m} b_{k_1,k_2} X_{k_1} X_{k_2} + \cdots + \sum_{k_1=1}^{m-r+1} \sum_{k_2=k_1+1}^{m-r+2} \cdots \sum_{k_r=k_{r-1}+1}^{m} b_{k_1,k_2,\cdots,k_r} X_{k_1} X_{k_2} \cdots X_{k_r}$$

$$b_0 \equiv a_0$$
$$b_k \equiv a_k$$

$$b_{k_1,k_2,\cdots,k_{r-1}} \equiv a_{k_1,k_2,\cdots,k_{r-1}}$$

$$b_{k_1,k_2,\cdots,k_r} \equiv a_{k_1,k_2,\cdots,k_r} + \frac{1}{r+1} \left( \sum_{l=1}^{k_1-1} b_{l,k_2,\cdots,k_r} X_l + \sum_{l=k_1+1}^{k_2-1} b_{k_1,l,k_2,\cdots,k_r} X_l + \cdots + \sum_{l=k_r+1}^{m} b_{k_1,k_2,\cdots,k_r,l} X_l \right)$$

$$b_{k_1,k_2,\cdots,k_r,k_{r+1}} \equiv a_{k_1,k_2,\cdots,k_r,k_{r+1}} + \frac{1}{r+2} \left( \sum_{l=1}^{k_1-1} b_{l,k_1,k_2,\cdots,k_r,k_{r+1}} X_l + \sum_{l=k_1+1}^{k_2-1} b_{k_1,l,k_2,\cdots,k_r,k_{r+1}} X_l + \cdots + \sum_{l=k_r+1}^{m} b_{k_1,k_2,\cdots,k_r,k_{r+1},l} X_l \right)$$

FIG. 43A $$b_{k_1,k_2,\cdots,k_r,\cdots,k_{d-1}} \equiv a_{k_1,k_2,\cdots,k_r,\cdots,k_{d-1}}$$

$$+ \frac{1}{d}\left(\sum_{l=1}^{k_1-1} b_{l,k_1,k_2,\cdots,k_r,\cdots,k_{d-1}}\mathcal{X}_l + \sum_{l=k_1+1}^{k_2-1} b_{k_1,l,k_2,\cdots,k_r,\cdots,k_{d-1}}\mathcal{X}_l + \cdots + \sum_{l=k_{d-1}+1}^{m} b_{k_1,k_2,\cdots,k_r,\cdots,k_{d-1},l}\mathcal{X}_l\right)$$

$$b_{k_1,k_2,\cdots,k_r,\cdots,k_d} \equiv a_{k_1,k_2,\cdots,k_r,\cdots,k_d}$$

$\mathcal{X}_l$ is locally determined value of $X_l$ as $$\mathcal{X}_l \to \begin{cases} 1 & \text{randomly at probability } p_l \\ 0 & \text{randomly at probability } (1-p_l) \end{cases}$$

FIG. 43B

Before transformation $$G[Y_A] = G\left[a_0 + \sum_{k=1}^{m} a_k X_k + \sum_{k_1=1}^{m-1}\sum_{k_2=k_1+1}^{m} a_{k_1,k_2} X_{k_1} X_{k_2} + \cdots \right.$$

$$\left. + \sum_{k_1=1}^{m-d+1}\sum_{k_2=k_1+1}^{m-d+2} \cdots \sum_{k_d=k_{d-1}+1}^{m} a_{k_1,k_2,\cdots,k_d} X_{k_1} X_{k_2} \cdots X_{k_d} + \cdots \right]$$

$$= a_0 + \sum_{k=1}^{m} a_k \chi_k + \sum_{k_1=1}^{m-1}\sum_{k_2=k_1+1}^{m} a_{k_1,k_2} \chi_{k_1} \chi_{k_2} + \cdots$$

$$+ \sum_{k_1=1}^{m-d+1}\sum_{k_2=k_1+1}^{m-d+2} \cdots \sum_{k_d=k_{d-1}+1}^{m} a_{k_1,k_2,\cdots,k_d} \chi_{k_1} \chi_{k_2} \cdots \chi_{k_d} + \cdots$$

$$\chi_k = \begin{cases} 0 & \text{if } p_k < 0.5 \\ 1 & \text{if } p_k > 0.5 \\ 0.5 & \text{if } p_k = 0.5 \end{cases}$$

FIG. 44A

After transformation $$G[Y_B] = G\left[b_0 + \sum_{k=1}^{m} b_k X_k + \sum_{k_1=1}^{m-1} \sum_{k_2=k_1+1}^{m} b_{k_1,k_2} X_{k_1} X_{k_2} + \cdots \right.$$

$$+ \sum_{k_1=1}^{m-r+1} \sum_{k_2=k_1+1}^{m-r+2} \cdots \sum_{k_r=k_{r-1}+1}^{m} b_{k_1,k_2,\cdots,k_r} X_{k_1} X_{k_2} \cdots X_{k_r} \Bigg]$$

$$= b_0 + \sum_{k=1}^{m} b_k X_k + \sum_{k_1=1}^{m-1} \sum_{k_2=k_1+1}^{m} b_{k_1,k_2} X_{k_1} X_{k_2} + \cdots$$

$$+ \sum_{k_1=1}^{m-r+2} \sum_{k_2=k_1+1}^{m-r+3} \cdots \sum_{k_r=k_{r-1}+1}^{m} b_{k_1,k_2,\cdots,k_r} X_{k_1} X_{k_2} \cdots X_{k_r} + \cdots$$

$$= a_0 + \sum_{k=1}^{m} a_k X_k + \sum_{k_1=1}^{m-1} \sum_{k_2=k_1+1}^{m} a_{k_1,k_2} X_{k_1} X_{k_2} + \cdots$$

$$+ \sum_{k_1=1}^{m-r+2} \sum_{k_2=k_1+1}^{m-r+3} \cdots \sum_{k_r=k_{r-1}+1}^{m} a_{k_1,k_2,\cdots,k_{r-1}} X_{k_1} X_{k_2} \cdots X_{k_{r-1}}$$

$$+ \sum_{k_1=1}^{m-r+1} \sum_{k_2=k_1+1}^{m-r+2} \cdots \sum_{k_r=k_{r-1}+1}^{m} b_{k_1,k_2,\cdots,k_r} X_{k_1} X_{k_2} \cdots X_{k_r}$$

$$+ \frac{1}{r+1} \left( \sum_{l=1}^{k_1-1} b_{l,k_1,k_2,\cdots,k_r} \zeta_l + \sum_{l=k_1+1}^{k_2-1} b_{k_1,l,k_2,\cdots,k_r} \zeta_l + \cdots + \sum_{l=k_r+1}^{m} b_{k_1,k_2,\cdots,k_r,l} \zeta_l \right)$$

$$b_{k_1,k_2,\cdots,k_r} \equiv a_{k_1,k_2,\cdots,k_r}$$

FIG. 44B $$b_{k_1,k_2,\cdots,k_r,k_{r+1}} \equiv a_{k_1,k_2,\cdots,k_r,k_{r+1}}$$
$$+ \frac{1}{r+2}\left(\sum_{l=1}^{k_1-1} b_{l,k_1,k_2,\cdots,k_r,k_{r+1}}\zeta_l + \sum_{l=k_1+1}^{k_2-1} b_{k_1,l,k_2,\cdots,k_r,k_{r+1}}\zeta_l + \cdots + \sum_{l=k_{r+1}+1}^{m} b_{k_1,k_2,\cdots,k_r,k_{r+1},l}\zeta_l\right)$$

$$\vdots$$

$$b_{k_1,k_2,\cdots,k_r,\cdots,k_{d-1}} \equiv a_{k_1,k_2,\cdots,k_r,\cdots,k_{d-1}}$$
$$+ \frac{1}{d}\left(\sum_{l=1}^{k_1-1} b_{l,k_1,k_2,\cdots,k_r,\cdots,k_{d-1}}\zeta_l + \sum_{l=k_1+1}^{k_2-1} b_{k_1,l,k_2,\cdots,k_r,\cdots,k_{d-1}}\zeta_l + \cdots + \sum_{l=k_{d-1}+1}^{m} b_{k_1,k_2,\cdots,k_r,\cdots,k_{d-1},l}\zeta_l\right)$$

$$b_{k_1,k_2,\cdots,k_r,\cdots,k_d} \equiv a_{k_1,k_2,\cdots,k_r,\cdots,k_d}$$

$\zeta_l$ is locally determined value of $X_l$ as $$\zeta_l \to \begin{cases} 1 & \text{randomly at probability } p_l \\ 0 & \text{randomly at probability } (1 - p_l) \end{cases}$$

Hence, this transformation may change the ground, if $p_k \geq 0.5$ for some $k \in \{1,\cdots,m\}$.
However, this transformation does not change the ground, if $p_k < 0.5$ for all $k \in \{1,\cdots,m\}$, because $\chi_k$ is always zero.

FIG. 44C

Before transformation $$E[Y_A] = E\left[ a_0 + \sum_{k=1}^{m} a_k X_k + \sum_{k_1=1}^{m-1} \sum_{k_2=k_1+1}^{m} a_{k_1,k_2} X_{k_1} X_{k_2} + \cdots + \sum_{k_1=1}^{m-d+1} \sum_{k_2=k_1+1}^{m-d+2} \cdots \sum_{k_d=k_{d-1}+1}^{m} a_{k_1,k_2,\ldots,k_d} X_{k_1} X_{k_2} \cdots X_{k_d} \right]$$

$$= a_0 + \sum_{k=1}^{m} a_k p_k + \sum_{k_1=1}^{m-1} \sum_{k_2=k_1+1}^{m} a_{k_1,k_2} p_{k_1} p_{k_2} + \cdots$$

$$+ \sum_{k_1=1}^{m-r+2} \sum_{k_2=k_1+1}^{m-r+3} \cdots \sum_{k_{r-1}=k_{r-2}+1}^{m} a_{k_1,k_2,\ldots,k_{r-1}} p_{k_1} p_{k_2} \cdots p_{k_{r-1}} +$$

$$+ \sum_{k_1=1}^{m-r+1} \sum_{k_2=k_1+1}^{m-r+2} \cdots \sum_{k_r=k_{r-1}+1}^{m} a_{k_1,k_2,\ldots,k_r} p_{k_1} p_{k_2} \cdots p_{k_r} + \cdots$$

$$+ \sum_{k_1=1}^{m-d+1} \sum_{k_2=k_1+1}^{m-d+2} \cdots \sum_{k_r=k_{r-1}+1}^{m} \cdots \sum_{k_d=k_{d-1}+1}^{m} a_{k_1,k_2,\ldots,k_r,\ldots,k_d} p_{k_1} p_{k_2} \cdots p_{k_r} \cdots p_{k_d}$$

FIG. 45A

After transformation $$E[Y_B] = E\left[b_0 + \sum_{k=1}^{m} b_k X_k + \sum_{k_1=1}^{m-1}\sum_{k_2=k_1+1}^{m} b_{k_1,k_2} X_{k_1} X_{k_2} + \cdots\right.$$

$$+ \sum_{k_1=1}^{m-r+1}\sum_{k_2=k_1+1}^{m-r+2}\cdots\sum_{k_r=k_{r-1}+1}^{m} b_{k_1,k_2,\cdots,k_r} X_{k_1} X_{k_2} \cdots X_{k_r}\Bigg]$$

$$= b_0 + \sum_{k=1}^{m} b_k p_k + \sum_{k_1=1}^{m-1}\sum_{k_2=k_1+1}^{m} b_{k_1,k_2} p_{k_1} p_{k_2} + \cdots$$

$$+ \sum_{k_1=1}^{m-r+1}\sum_{k_2=k_1+1}^{m-r+2}\cdots\sum_{k_r=k_{r-1}+1}^{m} b_{k_1,k_2,\cdots,k_r} p_{k_1} p_{k_2} \cdots p_{k_{r-1}} p_{k_r}$$

$$= a_0 + \sum_{k=1}^{m} a_k p_k + \sum_{k_1=1}^{m-1}\sum_{k_2=k_1+1}^{m} a_{k_1,k_2} p_{k_1} p_{k_2} + \cdots$$

$$+ \sum_{k_1=1}^{m-r+1}\sum_{k_2=k_1+1}^{m-r+2}\cdots\sum_{k_{r-1}=k_{r-2}+1}^{m} E[b_{k_1,k_2,\cdots,k_r}] p_{k_1} p_{k_2} \cdots p_{k_{r-1}} p_{k_r}$$

FIG. 45B

Here, $$\sum_{k_1=1}^{m-r+1} \sum_{k_2=k_1+1}^{m-r+2} \cdots \sum_{k_r=k_{r-1}+1}^{m} E[b_{k_1,k_2,\cdots,k_r}] p_{k_1} p_{k_2} \cdots p_{k_r}$$

$$= \sum_{k_1=1}^{m-r+1} \sum_{k_2=k_1+1}^{m-r+2} \cdots \sum_{k_r=k_{r-1}+1}^{m} \underbrace{\left(\frac{1}{r+1}\sum_{l=1}^{k_1-1} E[b_{l,k_1,k_2,\cdots,k_r} \chi_l] + \sum_{l=k_1+1}^{k_2-1} E[b_{k_1,l,k_2,\cdots,k_r} \chi_l] + \cdots + \sum_{l=k_r+1}^{m} E[b_{k_1,k_2,\cdots,k_r,l} \chi_l]\right)}_{a_{k_1,k_2,\cdots,k_r}} p_{k_1} p_{k_2} \cdots p_{k_r}$$

$$= \sum_{k_1=1}^{m-r+1} \sum_{k_2=k_1+1}^{m-r+2} \cdots \sum_{k_r=k_{r-1}+1}^{m} a_{k_1,k_2,\cdots,k_r} p_{k_1} p_{k_2} \cdots p_{k_r}$$

$$+ \sum_{k_1=1}^{m-r+1} \sum_{k_2=k_1+1}^{m-r+2} \cdots \sum_{k_r=k_{r-1}+1}^{m} \frac{1}{r+1}\left(\sum_{l=1}^{k_1-1} E[b_{l,k_1,k_2,\cdots,k_r}] p_l + \sum_{l=k_1+1}^{k_2-1} E[b_{k_1,l,k_2,\cdots,k_r}] p_l + \cdots \right.$$

$$\left. + \sum_{l=k_r+1}^{m} E[b_{k_1,k_2,\cdots,k_r,l}] p_l \right) p_{k_1} p_{k_2} \cdots p_{k_r}$$

FIG. 45C $$= \sum_{k_1=1}^{m-r+1} \sum_{k_2=k_1+1}^{m-r+2} \cdots \sum_{k_r=k_{r-1}+1}^{m} a_{k_1,k_2,\ldots,k_r} p_{k_1} p_{k_2} \cdots p_{k_r}$$

$$+ \sum_{k_1=1}^{m-r+1} \sum_{k_2=k_1+1}^{m-r+2} \cdots \sum_{k_r=k_{r-1}+1}^{m-1} \sum_{k_{r+1}=k_r+1}^{m} E[b_{k_1,k_2,\ldots,k_r,k_{r+1}}] p_{k_1} p_{k_2} \cdots p_{k_r} p_{k_{r+1}} = \cdots$$

$$= \sum_{k_1=1}^{m-d+1} \sum_{k_2=k_1+1}^{m-d+2} \cdots \sum_{k_r=k_{r-1}+1}^{m} a_{k_1,k_2,\ldots,k_r} p_{k_1} p_{k_2} \cdots p_{k_r}$$

$$+ \sum_{k_1=1}^{m-r+1} \sum_{k_2=k_1+1}^{m-r+2} \cdots \sum_{k_r=k_{r-1}+1}^{m-1} \sum_{k_{r+1}=k_r+1}^{m} a_{k_1,k_2,\ldots,k_r,k_{r+1}} p_{k_1} p_{k_2} \cdots p_{k_r} p_{k_{r+1}} + \cdots$$

$$+ \sum_{k_1=1}^{m-d+1} \sum_{k_2=k_1+1}^{m-d+2} \cdots \sum_{k_r=k_{r-1}+1}^{m} \sum_{k_d=k_{d-1}+1}^{m} E[b_{k_1,k_2,\ldots,k_r,\ldots,k_d}] p_{k_1} p_{k_2} \cdots p_{k_r} \cdots p_{k_d}$$

$$= \sum_{k_1=1}^{m-d+1} \sum_{k_2=k_1+1}^{m-d+2} \cdots \sum_{k_r=k_{r-1}+1}^{m} a_{k_1,k_2,\ldots,k_r} p_{k_1} p_{k_2} \cdots p_{k_r}$$

$$+ \sum_{k_1=1}^{m-r+1} \sum_{k_2=k_1+1}^{m-r+2} \cdots \sum_{k_r=k_{r-1}+1}^{m-1} \sum_{k_{r+1}=k_r+1}^{m} a_{k_1,k_2,\ldots,k_r,k_{r+1}} p_{k_1} p_{k_2} \cdots p_{k_r} p_{k_{r+1}} + \cdots$$

$$+ \sum_{k_1=1}^{m-d+1} \sum_{k_2=k_1+1}^{m-d+2} \cdots \sum_{k_r=k_{r-1}+1}^{m} \sum_{k_d=k_{d-1}+1}^{m} a_{k_1,k_2,\ldots,k_r,\ldots,k_d} p_{k_1} p_{k_2} \cdots p_{k_r} \cdots p_{k_d}$$

FIG. 45D

Hence, this translation does not change the mean.

$Y_A = a_0 + a_1 X_1 + a_2 X_2 + a_3 X_3 + a_{1,2} X_1 X_2 + a_{1,3} X_1 X_3 + a_{2,3} X_2 X_3 + a_{1,2,3} X_1 X_2 X_3$ $Y_B = a_0 + a_1 X_1 + a_2 X_2 + a_3 X_3 + \left(a_{1,2} + \frac{1}{3} a_{1,2,3} X_3\right) X_1 X_2 + \left(a_{1,3} + \frac{1}{3} a_{1,2,3} X_2\right) X_1 X_3$
$\quad + \left(a_{2,3} + \frac{1}{3} a_{1,2,3} X_1\right) X_2 X_3$

FIG. 46A

Before translation $$E[Y_A^2] = E\left[\{a_0 + a_1X_1 + a_2X_2 + a_3X_3 + a_{1,2}X_1X_2 + a_{1,3}X_1X_3 + a_{2,3}X_2X_3 + a_{1,2,3}X_1X_2X_3\}^2\right]$$

$$= E\left[\{a_0 + a_1X_1 + a_2X_2 + a_3X_3 + a_{1,2}X_1X_2 + a_{1,3}X_1X_3 + a_{2,3}X_2X_3\}^2\right] + E\left[\{a_{1,2,3}X_1X_2X_3\}^2\right]$$

$$+ E\left[2\{a_{1,2,3}X_1X_2X_3\}\{a_0 + a_1X_1 + a_2X_2 + a_3X_3 + a_{1,2}X_1X_2 + a_{1,3}X_1X_3 + a_{2,3}X_2X_3\}\right]$$

$$= E\left[\{a_0 + a_1X_1 + a_2X_2 + a_3X_3 + a_{1,2}X_1X_2 + a_{1,3}X_1X_3 + a_{2,3}X_2X_3\}^2\right] + E\left[a_{1,2,3}^2 X_1X_2X_3\right]$$

$$+ E\left[2\{a_{1,2,3}X_1X_2X_3\}\{a_0 + a_1 + a_2 + a_3 + a_{1,2} + a_{1,3} + a_{2,3}\}\right]$$

$$= E\left[\{a_0 + a_1X_1 + a_2X_2 + a_3X_3 + a_{1,2}X_1X_2 + a_{1,3}X_1X_3 + a_{2,3}X_2X_3\}^2\right]$$

After translation $$E[Y_B^2] = E\left[\left\{\{a_0 + a_1X_1 + a_2X_2 + a_3X_3 + \left(a_{1,2} + \frac{1}{3}a_{1,2,3}X_3\right)X_1X_2 + \left(a_{1,3} + \frac{1}{3}a_{1,2,3}X_2\right)X_1X_3\right.\right.$$
$$\left.\left. + \left(a_{2,3} + \frac{1}{3}a_{1,2,3}X_1\right)X_2X_3\right\}^2\right]$$

$$= E\left[\left\{a_0 + a_1X_1 + a_2X_2 + a_3X_3 + a_{1,2}X_1X_2 + a_{1,3}X_1X_3 + a_{2,3}X_2X_3\right.\right.$$
$$\left.\left. + \frac{1}{3}a_{1,2,3}(\chi_3 X_1X_2 + \chi_2 X_1X_3 + \chi_1 X_2X_3)\right\}^2\right]$$

$$= E\left[\{a_0 + a_1X_1 + a_2X_2 + a_3X_3 + a_{1,2}X_1X_2 + a_{1,3}X_1X_3 + a_{2,3}X_2X_3\}^2\right]$$
$$+ \left\{\frac{1}{3}a_{1,2,3}\right\}^2 E[\{\chi_3 X_1X_2 + \chi_2 X_1X_3 + \chi_1 X_2X_3\}^2]$$
$$+ \frac{2}{3}a_{1,2,3}E[\{\chi_3 X_1X_2 + \chi_2 X_1X_3 + \chi_1 X_2X_3\}\{a_0 + a_1X_1 + a_2X_2 + a_3X_3 + a_{1,2}X_1X_2 + a_{1,3}X_1X_3$$
$$+ a_{2,3}X_2X_3\}]$$

FIG. 46C

Here,
$E[\{\chi_3 X_1 X_2 + \chi_2 X_1 X_3 + \chi_1 X_2 X_3\}^2]$
$= E[\{\chi_3 X_1 X_2\}^2] + E[\{\chi_2 X_1 X_3\}^2] + E[\{\chi_1 X_2 X_3\}^2] + E[2\{\chi_3 X_1 X_2\}\{\chi_2 X_1 X_3\}]$
$+ E[2\{\chi_3 X_1 X_2\}\{\chi_1 X_2 X_3\}] + E[2\{\chi_2 X_1 X_3\}\{\chi_1 X_2 X_3\}]$
$= E[\chi_3{}^2 X_1 X_2] + E[\chi_2{}^2 X_1 X_3] + E[\chi_1{}^2 X_2 X_3] + E[2\chi_3 \chi_2 X_1 X_2 X_3] + E[2\chi_3 \chi_1 X_1 X_2 X_3]$
$+ E[2\chi_2 \chi_1 X_1 X_2 X_3] = p_3{}^2 p_1 p_2 + p_2{}^2 p_1 p_3 + p_1{}^2 p_2 p_3 + 2p_1 p_2{}^2 p_3{}^2 + 2p_1{}^2 p_2 p_3{}^2 + 2p_1{}^2 p_2{}^2 p_3$
$= p_1 p_2 p_3 (p_1 + p_2 + p_3 + 2p_1 p_2 + 2p_1 p_3 + 2p_2 p_3)$

FIG. 46D $E[\{\chi_3 X_1 X_2 + \chi_2 X_1 X_3 + \chi_1 X_2 X_3\}\{a_0 + a_1 X_1 + a_2 X_2 + a_3 X_3 + a_{1,2} X_1 X_2 + a_{1,3} X_1 X_3 + a_{2,3} X_2 X_3\}]$
$= a_0 E[\{\chi_3 X_1 X_2 + \chi_2 X_1 X_3 + \chi_1 X_2 X_3\}] + a_1 E[\{\chi_3 X_1 X_2 + \chi_2 X_1 X_3 + \chi_1 X_2 X_3\}\{X_1\}]$
$+ a_2 E[\{\chi_3 X_1 X_2 + \chi_2 X_1 X_3 + \chi_1 X_2 X_3\}\{X_2\}] + a_3 E[\{\chi_3 X_1 X_2 + \chi_2 X_1 X_3 + \chi_1 X_2 X_3\}\{X_3\}]$
$+ a_{1,2} E[\{\chi_3 X_1 X_2 + \chi_2 X_1 X_3 + \chi_1 X_2 X_3\}\{X_1 X_2\}] + a_{1,3} E[\{\chi_3 X_1 X_2 + \chi_2 X_1 X_3 + \chi_1 X_2 X_3\}\{X_1 X_3\}]$
$+ a_{2,3} E[\{\chi_3 X_1 X_2 + \chi_2 X_1 X_3 + \chi_1 X_2 X_3\}\{X_2 X_3\}]$
$= a_0 E[\{\chi_3 X_1 X_2 + \chi_2 X_1 X_3 + \chi_1 X_2 X_3\}] + a_1 E[\{\chi_3 X_1 X_2 + \chi_2 X_1 X_3 + \chi_1 X_1 X_2 X_3\}] + a_3 E[\{\chi_3 X_1 X_2 + \chi_2 X_1 X_3 + \chi_1 X_1 X_2 X_3\}]$
$+ a_2 E[\{\chi_3 X_1 X_2 + \chi_2 X_1 X_2 X_3 + \chi_1 X_1 X_2 X_3\}] + a_{1,2} E[\{\chi_3 X_1 X_2 X_3 + \chi_2 X_1 X_2 X_3 + \chi_1 X_1 X_2 X_3\}]$
$+ a_{2,3} E[\{\chi_3 X_1 X_2 X_3 + \chi_2 X_1 X_2 X_3 + \chi_1 X_1 X_2 X_3\}]$
$= a_0\{3p_1 p_2 p_3\} + a_1\{2p_1 p_2 p_3 + p_1{}^2 p_2 p_3\} + a_2\{2p_1 p_2 p_3 + p_1 p_2{}^2 p_3\}$
$+ a_3\{2p_1 p_2 p_3 + p_1 p_2 p_3{}^2\} + a_{1,2}\{p_1{}^2 p_2 p_3 + p_1 p_2{}^2 p_3 + p_1 p_2 p_3\}$
$+ a_{1,3}\{p_1{}^2 p_2 p_3 + p_1 p_2 p_3 + p_1 p_2 p_3{}^2\} + a_{2,3}\{p_1 p_2 p_3 + p_1 p_2{}^2 p_3 + p_1 p_2 p_3{}^2\}$
$= p_1 p_2 p_3 \{3a_0 + (2 + p_1)a_1 + (2 + p_2)a_2 + (2 + p_3)a_3 + (1 + p_1 + p_2)a_{1,2}$
$+ (1 + p_1 + p_3)a_{1,3} + (1 + p_2 + p_3)a_{2,3}\}$ Hence, the second moment has the following difference between before and after the translation:

FIG. 46E $$E[Y_A^2] - E[Y_B^2]$$
$$= p_1 p_2 p_3 \{a_{1,2,3}^2 + 2a_{1,2,3}(a_0 + a_1 + a_2 + a_3 + a_{1,2} + a_{1,3} + a_{2,3})\}$$
$$- \left\{\frac{1}{3} a_{1,2,3}\right\}^2 p_1 p_2 p_3 (p_1 + p_2 + p_3 + 2p_1 p_2 + 2p_1 p_3 + 2p_2 p_3)$$
$$- \frac{2}{3} a_{1,2,3} p_1 p_2 p_3 \{3a_0 + (2+p_1)a_1 + (2+p_2)a_2 + (2+p_3)a_3 + (1+p_1+p_2)a_{1,2}$$
$$+ (1+p_1+p_3)a_{1,3} + (1+p_2+p_3)a_{2,3}\}$$
$$= p_1 p_2 p_3 \left\{ a_{1,2,3}^2 \left(1 - \frac{p_1 + p_2 + p_3 + 2p_1 p_2 + 2p_1 p_3 + 2p_2 p_3}{3^2}\right) \right.$$
$$\left. + 2a_{1,2,3}\left(\frac{1-p_1}{3}a_1 + \frac{1-p_2}{3}a_2 + \frac{1-p_3}{3}a_3 + \frac{2-p_1-p_2}{3}a_{1,2} + \frac{2-p_1-p_3}{3}a_{1,3}\right.\right.$$
$$\left.\left. + \frac{2-p_2-p_3}{3}a_{2,3}\right)\right\}$$

$$Y_A = a_0 + \sum_{k_1=1}^{m} a_{k_1} X_{k_1} + \sum_{k_1=1}^{m-1} \sum_{k_2=k_1+1}^{m} a_{k_1,k_2} X_{k_1} X_{k_2} + \sum_{k_1=1}^{m-d_A+1} \sum_{k_2=k_1+1}^{m-d_A+2} \sum_{k_3=k_2+1}^{m-d_A+3} \cdots \sum_{k_{d_A}=k_{d_A-1}+1}^{m} a_{k_1,k_2,\ldots,k_{d_A}} X_{k_1} X_{k_2} \cdots X_{k_{d_A}}$$

$$Y_B = b_0 + \sum_{k_1=1}^{m} b_{k_1} X_{k_1} + \sum_{k_1=1}^{m-1} \sum_{k_2=k_1+1}^{m} b_{k_1,k_2} X_{k_1} X_{k_2} + \sum_{k_1=1}^{m-d_B+1} \sum_{k_2=k_1+1}^{m-d_B+2} \sum_{k_3=k_2+1}^{m-d_B+3} \cdots \sum_{k_{d_B}=k_{d_B-1}+1}^{m} b_{k_1,k_2,\ldots,k_{d_B}} X_{k_1} X_{k_2} \cdots X_{k_{d_B}}$$

$$Y_C \equiv c_0 + \sum_{k_1=1}^{m} c_{k_1} X_{k_1} + \sum_{k_1=1}^{m-1} \sum_{k_2=k_1+1}^{m} c_{k_1,k_2} X_{k_1} X_{k_2} + \sum_{k_1=1}^{m-d_C+1} \sum_{k_2=k_1+1}^{m-d_C+2} \sum_{k_3=k_2+1}^{m-d_C+3} \cdots \sum_{k_{d_C}=k_{d_C-1}+1}^{m} c_{k_1,k_2,\ldots,k_{d_C}} X_{k_1} X_{k_2} \cdots X_{k_{d_C}}$$

$d_C \equiv \max(d_A, d_B)$
$c_0 \equiv a_0 - b_0$ $$c_{k_1,k_2,\ldots,k_l} \equiv \begin{cases} (a_{k_1,k_2,\ldots,k_l} - b_{k_1,k_2,\ldots,k_l} & \text{for } (1 \le l \le d_A) \wedge (1 \le l \le d_B) \\ a_{k_1,k_2,\ldots,k_l} & \text{for } (d_B < l \le d_A) \\ -b_{k_1,k_2,\ldots,k_l} & \text{for } (d_A < l \le d_B) \end{cases}$$

FIG. 48

$x: Y_A \times b_0 \to Y_C$
s.t.

$$Y_A = a_0 + \sum_{k_1=1}^{m} a_{k_1} X_{k_1} + \sum_{k_1=1}^{m-1} \sum_{k_2=k_1+1}^{m} a_{k_1,k_2} X_{k_1} X_{k_2} + \sum_{k_1=1}^{m-d_A+1} \sum_{k_2=k_1+1}^{m-d_A+2} \sum_{k_3=k_2+1}^{m-d_A+3} \cdots \sum_{k_{d_A}=k_{d_A-1}+1}^{m} a_{k_1,k_2,\cdots,k_{d_A}} X_{k_1} X_{k_2} \cdots X_{k_{d_A}}$$

$$Y_C \equiv c_0 + \sum_{k_1=1}^{m} c_{k_1} X_{k_1} + \sum_{k_1=1}^{m-1} \sum_{k_2=k_1+1}^{m} c_{k_1,k_2} X_{k_1} X_{k_2} + \sum_{k_1=1}^{m-d_C+1} \sum_{k_2=k_1+1}^{m-d_C+2} \sum_{k_3=k_2+1}^{m-d_C+3} \cdots \sum_{k_{d_C}=k_{d_C-1}+1}^{m} c_{k_1,k_2,\cdots,k_{d_C}} X_{k_1} X_{k_2} \cdots X_{k_{d_C}}$$

$d_C \equiv d_A$
$c_0 \equiv a_0 \times b_0$
$c_{k_1,k_2,\cdots,k_l} \equiv a_{k_1,k_2,\cdots,k_l} \times b_0 \qquad \text{for } (1 \leq l \leq d_A)$

FIG. 49

$\times : Y_a \times Y_b \to Y_c$ s.t.

$Y_a = \sum_{k=0}^{m} a_k X_k$ $Y_b = \sum_{k=0}^{m} b_k X_k$ $Y_c \equiv \sum_{k=0}^{m} \sum_{l=0}^{m} c_{k,l} X_k X_l = \begin{bmatrix} X_0 & X_1 & X_2 & \cdots & X_m \end{bmatrix} \begin{bmatrix} c_{0,0} & c_{0,1} & c_{0,2} & \cdots & c_{0,m} \\ c_{1,0} & c_{1,1} & c_{1,2} & \cdots & c_{1,m} \\ c_{2,0} & c_{2,1} & c_{2,2} & \cdots & c_{2,m} \\ \vdots & \vdots & \vdots & \ddots & \vdots \\ c_{m,0} & c_{m,1} & c_{m,2} & \cdots & c_{m,m} \end{bmatrix} \begin{bmatrix} X_0 \\ X_1 \\ X_2 \\ \vdots \\ X_m \end{bmatrix}$ $c_{k,l} \equiv a_k b_l$

FIG. 50

$$x: Y_A \times Y_B \to Y_C$$

s.t.

$$Y_A = \sum_{k=0}^{m} \sum_{l=0}^{m} a_{k,l} X_{k,l}$$

$$Y_B = \sum_{k=0}^{m} \sum_{l=0}^{m} b_{k,l} X_{k,l}$$

$$Y_C = \sum_{i=0}^{m} \sum_{j=0}^{m} \sum_{k=0}^{m} \sum_{l=0}^{m} c_{i,j,k,l} X_i X_j X_k X_l$$

$$c_{i,j,k,l} \equiv a_{i,j} b_{k,l}$$

FIG. 51

$$(Y_A | X_i = \chi_i \text{ for } i \in C) = a_0 + \sum_{k \in C} a_k \chi_k + \sum_{k \in \{1,\cdots,m\}-C} a_k X_k$$

$$Y_A = a_0 + \sum_{k=1}^{m} a_k X_k$$

Here, $\chi_i \in \{0,1\}$ for $i \in C$ represent the given condition as the value of ARV $X_i$.

FIG. 52

$$(Y_A | X_i = \chi_i \text{ for } i \in C) = b_0 + \sum_{k \in \{1,\cdots,m\}-C} b_k X_k + \sum_{k \in \{1,\cdots,m-1\}-C} \sum_{l \in \{k+1,\cdots,m\}-C} b_{k,l} X_k X_l$$

$$Y_A = \vec{X}^T A \vec{X}$$

$$A = \begin{bmatrix} a_0 & 0 & 0 & \cdots & 0 \\ 0 & a_1 & a_{1,2} & \cdots & a_{1,m} \\ 0 & 0 & a_2 & \cdots & a_{2,m} \\ \vdots & \vdots & \vdots & \ddots & \vdots \\ 0 & 0 & 0 & \cdots & a_m \end{bmatrix}$$

$$b_0 \equiv a_0 + \sum_{k \in C} \left( a_k + \sum_{l \in C} \tilde{a}_{k,l} X_l \right) \chi_k$$

$$b_k \equiv a_k + \sum_{l \in C} \tilde{a}_{k,l} \chi_l \quad \text{for } k \in \{1, \cdots, m\} - C$$

$$b_{k,l} \equiv a_{k,l} \quad \text{for } k \in \{1, \cdots, m-1\} - C, l \in \{k+1, \cdots, m\} - C$$

$$\tilde{a}_{k,l} \equiv \begin{cases} a_{k,l} & \text{if } (k < l) \\ a_{l,k} & \text{otherwise} \end{cases} \quad \text{for } 1 \le k \le m, 1 \le l \le m, k \ne l$$

Here, $\chi_i \in \{0,1\}$ for $i \in C$ represent the given condition as the value of ARV $X_i$.

FIG. 53

$(Y_A | X_i = \chi_i \text{ for } i \in C)$ $\equiv b_0 + \sum_{k=1}^{m} b_k X_k + \sum_{k_1=1}^{m-1} \sum_{k_2=k_1+1}^{m} b_{k_1,k_2} X_{k_1} X_{k_2} + \cdots \sum_{k_1=1}^{m-d+1} \sum_{k_2=k_1+1}^{m-d+2} \cdots \sum_{k_{d-1}=k_{d-2}+1}^{m-1} \sum_{k_d=k_{d-1}+1}^{m} b_{k_1,k_2,\cdots,k_{d-1},k_d} X_{k_1} X_{k_2} \cdots X_{k_{d-1}} X_{k_d}$ $Y_A = a_0 + \sum_{k=1}^{m} a_k X_k + \sum_{k_1=1}^{m-1} \sum_{k_2=k_1+1}^{m} a_{k_1,k_2} X_{k_1} X_{k_2} + \cdots \sum_{k_1=1}^{m-d+1} \sum_{k_2=k_1+1}^{m-d+2} \cdots \sum_{k_{d-1}=k_{d-2}+1}^{m-1} \sum_{k_d=k_{d-1}+1}^{m} a_{k_1,k_2,\cdots,k_{d-1},k_d} X_{k_1} X_{k_2} \cdots X_{k_{d-1}} X_{k_d}$ $b_0 \equiv a_0 + \sum_{k \in C} a_k \chi_k + \sum_{k_1 \in C} \sum_{k_2 \in C, > k_1} \tilde{a}_{k_1,k_2} \chi_{k_1} \chi_{k_2} + \cdots \sum_{k_1 \in C} \sum_{k_2 \in C, > k_1} \cdots \sum_{k_{d-2} \in C, > k_{d-3}} \sum_{k_{d-1} \in C, > k_{d-2}} \sum_{k_d \in C, > k_{d-1}} \tilde{a}_{k_1,k_2,\cdots,k_{d-1},k_d} \chi_{k_1} \chi_{k_2} \cdots \chi_{k_{d-1}} \chi_{k_d}$ $b_k \equiv \underbrace{\left\{ a_k + \sum_{l \in C} \tilde{a}_{k,l} \chi_l + \cdots + \sum_{l_1 \in C} \sum_{l_2 \in C, > l_1} \cdots \sum_{l_{d-1} \in C, > l_{d-2}} \tilde{a}_{k,l_1,l_2,\cdots,l_{d-1}} \chi_{l_1} \chi_{l_2} \cdots \chi_{l_{d-1}} \right.}_{} \quad \text{if } (k \in C)$ $0 \quad \text{otherwise}$

FIG. 54

$$b_{k_1,k_2} = \underbrace{\tilde{a}_{k_1,k_2} + \sum_{l \in C} \tilde{a}_{k_1,k_2,l} \chi_l + \cdots + \sum_{l_1 \in C} \sum_{l_2 \in C, > l_1} \cdots \sum_{l_{d-2} \in C, > l_{d-3}} \tilde{a}_{k_1,k_2,l_1,l_2,\cdots,l_{d-2}} \chi_{l_1} \chi_{l_2} \cdots \chi_{l_{d-2}}}_{} \quad \text{if } ((k_1 \in C) \vee (k_2 \in C))$$

$$0 \quad \text{otherwise}$$

...

$$b_{k_1,\cdots,k_j} = \underbrace{\tilde{a}_{k_1,\cdots,k_j} + \sum_{l \in C} \tilde{a}_{k_1,\cdots,k_j,l} \chi_l + \cdots + \sum_{l_1 \in C} \sum_{l_2 \in C, > l_1} \cdots \sum_{l_{d-j} \in C, > l_{d-j-1}} \tilde{a}_{k_1,\cdots,k_j,l_1,l_2,\cdots,l_{d-j}} \chi_{l_1} \chi_{l_2} \cdots \chi_{l_{d-j}}}_{} \quad \text{if } (\exists i \text{ for } k_i \in C)$$

$$0 \quad \text{otherwise}$$

...

FIG. 55A $$b_{k_1,\cdots,k_{d-1}} \equiv \begin{cases} 0 & \text{if } (\exists i \text{ for } k_i \in C) \\ \tilde{a}_{k_1,\cdots,k_{d-1}} + \sum_{l \in C} \tilde{a}_{k_1,\cdots,k_{d-1},l} X_l & \text{otherwise} \end{cases}$$

$$b_{k_1,\cdots,k_d} \equiv \begin{cases} 0 & \text{if } (\exists i \text{ for } k_i \in C) \\ a_{k_1,\cdots,k_d} & \text{otherwise} \end{cases} \quad \text{for } 1 \leq k \leq m, 1 \leq l \leq m, k \neq l$$

$$\tilde{a}_{k,l} = \begin{cases} a_{k,l} & \text{if } (k < l) \\ a_{l,k} & \text{otherwise} \end{cases}$$

$$\tilde{a}_{k_1,\cdots,k_j} = \{a_{l_1,\cdots,l_j} | \{l_1,\cdots,l_j\} = \{k_1,\cdots,k_j\}, l_1 < l_2 < \cdots < l_j\} \quad \text{for } 1 \leq j \leq d, 1 \leq k_i \leq m, k_{i_1} \neq k_{i_2}$$

Here, $\chi_i \in \{0,1\}$ for $i \in C$ represent the given condition as the value of ARV $X_i$.

$$Y_A = a_0 + \sum_{k=1}^{m} a_k X_k$$

$$Y_B = (Y_A | X_i = 1 \text{ for } i \forall i \in S_X) - (Y_A | X_i = 0 \text{ for } i \forall i \in S_X)$$

$$= \left[ a_0 + \sum_{i \in S_X} a_i \cdot 1 + \sum_{k \in \{1\cdots m\} - S_X} a_k X_k \right] - \left[ a_0 + \sum_{i \in S_X} a_i \cdot 0 + \sum_{k \in \{1\cdots m\} - S_X} a_k X_k \right] = \sum_{i \in S_X} a_i$$

FIG. 55B $$Y_A = \vec{X}^T A \vec{X}$$

$$A = \begin{bmatrix} a_0 & 0 & 0 & \cdots & 0 \\ 0 & a_1 & a_{1,2} & \cdots & a_{1,m} \\ 0 & 0 & a_2 & \cdots & a_{2,m} \\ \vdots & \vdots & \vdots & \ddots & \vdots \\ 0 & 0 & 0 & \cdots & a_m \end{bmatrix}$$

$$A = \begin{bmatrix} a_0 & 0 & 0 & \cdots & 0 \\ 0 & a_1 & 0 & \cdots & a_{1,m} \\ 0 & a_{1,2} & a_2 & \cdots & a_{2,m} \\ \vdots & \vdots & \vdots & \ddots & \vdots \\ 0 & 0 & 0 & \cdots & a_m \end{bmatrix}$$

FIG. 56A $$Y_B = (Y_A|X_i = 1 \text{ for } \forall i \in S_X) - (Y_A|X_i = 0 \text{ for } \forall i \in S_X)$$

$$= \left[ a_0 + \sum_{i \in S_X} a_i \cdot 1 + \sum_{i_1 \in S_X} \sum_{i_2 \in S_X, > i_1} a_{i_1, i_2} \cdot 1 + \sum_{k \in \{1, \cdots, m-1\} - S_X} \sum_{l \in \{k+1, \cdots, m\} - S_X} a_{k,l} X_k X_l \right.$$

$$\left. + \sum_{k \in \{1, \cdots, m\} - S_X} \left( a_k + \sum_{i \in S_X} \tilde{a}_{k,i} \cdot 1 \right) X_k \right]$$

$$- \left[ a_0 + \sum_{i \in S_X} a_i \cdot 0 + \sum_{i_1 \in S_X} \sum_{i_2 \in S_X, > i_1} a_{i_1, i_2} \cdot 0 + \sum_{k \in \{1, \cdots, m-1\} - S_X} \sum_{l \in \{k+1, \cdots, m\} - S_X} a_{k,l} X_k X_l \right.$$

$$\left. + \sum_{k \in \{1, \cdots, m\} - S_X} \left( a_k + \sum_{i \in S_X} \tilde{a}_{k,i} \cdot 0 \right) X_k \right]$$

$$= \sum_{i \in S_X} a_i + \sum_{i_1 \in S_X} \sum_{i_2 \in S_X, > i_1} a_{i_1, i_2} + \sum_{k \in \{1, \cdots, m\} - S_X} \left( \sum_{i \in S_X} \tilde{a}_{k,i} \right) X_k$$

$$\tilde{a}_{k,l} = \begin{cases} a_{k,l} & \text{if } (k < l) \\ a_{l,k} & \text{otherwise} \end{cases} \quad \text{for } 1 \le k \le m, 1 \le l \le m, k \ne l$$

FIG. 56B $$Y_A = a_0 + \sum_{k=1}^{m} a_k X_k + \sum_{k_1=1}^{m-1} \sum_{k_2=k_1+1}^{m} a_{k_1,k_2} X_{k_1} X_{k_2} + \cdots$$
$$+ \sum_{k_1=1}^{m-d+1} \sum_{k_2=k_1+1}^{m-d+2} \cdots \sum_{k_d=k_{d-1}+1}^{m} a_{k_1,k_2,\ldots,k_{d-1},k_d} X_{k_1} X_{k_2} \cdots X_{k_{d-1}} X_{k_d}$$

$$Y_B = (Y_A | X_i = 1 \text{ for } \forall i \in S_X) - (Y_A | X_i = 0 \text{ for } \forall i \in S_X)$$

$$= \left( \sum_{i \in S_X} a_i + \sum_{i_1 \in S_X} \sum_{i_2 \in S_X, > i_1} a_{i_1,i_2} + \cdots + \sum_{i_1 \in S_X} \cdots \sum_{i_d \in S_X, > i_{d-1}} a_{i_1,\ldots,i_d} \right)$$

$$+ \sum_{k \in \{1,\ldots,m\} - S_X} \left( \sum_{i \in S_X} \tilde{a}_{k,i} + \sum_{i_1 \in S_X} \sum_{i_2 \in S_X, > i_1} \tilde{a}_{k,i_1,i_2} + \cdots + \sum_{i_1 \in S_X} \cdots \sum_{i_{d-1} \in S_X, > i_{d-2}} \tilde{a}_{k,i_1,\ldots,i_{d-1}} \right) X_k$$

$$+ \sum_{k_1 \in \{1,\ldots,m-1\} - S_X} \sum_{k_2 \in \{k_1+1,\ldots,m\} - S_X} \left( \sum_{i \in S_X} \tilde{a}_{k_1,k_2,i} + \cdots + \sum_{i_1 \in S_X} \cdots \sum_{i_{d-2} \in S_X, > i_{d-3}} \tilde{a}_{k_1,k_2,i_1,\ldots,i_{d-2}} \right) X_{k_1} X_{k_2} + \cdots$$

$$+ \sum_{k_1 \in \{1,\ldots,m-d+2\} - S_X} \sum_{k_2 \in \{k_1+1,\ldots,m-d+3\} - S_X} \cdots \sum_{k_{d-1} \in \{k_{d-2}+1,\ldots,m\} - S_X} \left( \sum_{i \in S_X} \tilde{a}_{k_1,k_2,\ldots,k_{d-1},i} \right) X_{k_1} X_{k_2} \cdots X_{k_{d-1}}$$

FIG. 57A $$\tilde{a}_{k,l} = \begin{cases} a_{k,l} & \text{if } (k < l) \\ a_{l,k} & \text{otherwise} \end{cases} \quad \text{for } 1 \leq k \leq m, 1 \leq l \leq m, k \neq l$$

$$\tilde{a}_{k_1,\cdots,k_j} = \{a_{l_1,\cdots,l_j} | \{l_1,\cdots,l_j\} = \{k_1,\cdots,k_j\}, l_1 < l_2 < \cdots < l_j\} \quad \text{for } 1 \leq j \leq d, 1 \leq k_i \leq m, k_{i_1} \neq k_{i_2}$$

FIG. 57B $$G\left[\frac{dY_A}{dS_X}\right] = G[Y_A | X_i = 1 \text{ for } i \in A, X_S \in S_X) - (Y_A | X_i = 0 \text{ for } i \in A, X_S \in S_X)] = \sum_{i \in S_X} a_i$$

FIG. 58A $$G\left[\frac{dY_A}{dS_X}\right] = G[(Y_A|X_i = 1 \text{ for } \forall i \in S_X) - (Y_A|X_i = 0 \text{ for } \forall i \in S_X)]$$

$$= \sum_{i \in S_X} a_i + \sum_{i_1 \in S_X} \sum_{i_2 \in S_X, > i_1} a_{i_1, i_2} + \sum_{k \in \{1, \cdots, m\} - S_X} \left(\sum_{i \in S_X} \tilde{a}_{k,i}\right) \chi_k$$

for $1 \leq k \leq m, 1 \leq l \leq m, k \neq l$ $$\tilde{a}_{k,l} = \begin{cases} a_{k,l} & \text{if } (k < l) \\ a_{l,k} & \text{otherwise} \end{cases}$$

$$\chi_k = \begin{cases} 0 & \text{if } p_k < 0.5 \\ 1 & \text{if } p_k > 0.5 \\ 0.5 & \text{if } p_k = 0.5 \end{cases}$$

FIG. 58B $$G\left[\frac{dY_A}{dS_X}\right] = G[(Y_A|X_l = 1 \text{ for } i\Lambda \ni i \in S_X) - (Y_A|X_i = 0 \text{ for } i\Lambda \ni i \in S_X)]$$

$$= \left(\sum_{i \in S_X} a_i + \sum_{i_1 \in S_X} \sum_{i_2 \in S_X, > i_1} a_{i_1,i_2} + \cdots + \sum_{i_1 \in S_X} \cdots \sum_{i_d \in S_X, > i_{d-1}} a_{i_1,\cdots,i_d}\right)$$

$$+ \sum_{k \in \{1,\cdots,m\} - S_X} \left(\sum_{i \in S_X} \tilde{a}_{k,i} + \sum_{i_1 \in S_X} \sum_{i_2 \in S_X, > i_1} \tilde{a}_{k,i_1,i_2} + \cdots + \sum_{i_1 \in S_X} \cdots \sum_{i_{d-1} \in S_X, > i_{d-2}} \tilde{a}_{k,i_1,\cdots,i_{d-1}}\right) \chi_k$$

$$+ \sum_{k_1 \in \{1,\cdots,m-1\} - S_X} \sum_{k_2 \in \{k_1+1,\cdots,m\} - S_X} \left(\sum_{i \in S_X} \tilde{a}_{k_1,k_2,i} + \cdots + \sum_{i_1 \in S_X} \cdots \sum_{i_{d-2} \in S_X, > i_{d-3}} \tilde{a}_{k_1,k_2,i_1,\cdots,i_{d-2}}\right) \chi_{k_1} \chi_{k_2} + \cdots$$

$$+ \sum_{k_1 \in \{1,\cdots,m-d+2\} - S_X} \sum_{k_2 \in \{k_1+1,\cdots,m-d+3\} - S_X} \cdots \sum_{k_{d-1} \in \{k_{d-2}+1,\cdots,m\} - S_X} \left(\sum_{i \in S_X} \tilde{a}_{k_1,k_2,\cdots,k_{d-1},i}\right) \chi_{k_1} \chi_{k_2} \cdots \chi_{k_{d-1}}$$

for $1 \leq j \leq d, 1 \leq k_i \leq m, k_{i_1} \neq k_{i_2}$ $$\tilde{a}_{k,l} = \begin{cases} a_{k,l} & \text{if } (k < l) \\ a_{l,k} & \text{otherwise} \end{cases} \text{ for } 1 \leq k \leq m, 1 \leq l \leq m, k \neq l$$

$$\tilde{a}_{k_1,\cdots,k_j} = \{a_{l_1,\cdots,l_j} | \{l_1,\cdots,l_j\} = \{k_1,\cdots,k_j\}, l_1 < l_2 < \cdots < l_j\}$$

$$\chi_k = \begin{cases} 0 & \text{if } p_k < 0.5 \\ 1 & \text{if } p_k > 0.5 \\ 0.5 & \text{if } p_k = 0.5 \end{cases}$$

FIG. 58C $$E\left[\frac{dY_A}{dS_X}\right] = E[(Y_A|X_i = 1 \text{ for } i \in S_X) - (Y_A|X_i = 0 \text{ for } i \in S_X)] = E\left[\sum_{i \in S_X} a_i\right] = \sum_{i \in S_X} a_i$$

FIG. 59

$$\begin{aligned}
E\left[\frac{dY_A}{dS_X}\right] &= E[(Y_A|X_i = 1 \text{ for } i \in S_X) - (Y_A|X_i = 0 \text{ for } i \in S_X)] \\
&= E\left[\sum_{i \in S_X} a_i + \sum_{i_1 \in S_X} \sum_{i_2 \in S_X, >i_1} a_{i_1,i_2} + \sum_{k \in \{1,\cdots,m\}-S_X} \left(\sum_{i \in S_X} \tilde{a}_{k,i}\right) X_k\right] \\
&= \sum_{i \in S_X} a_i + \sum_{i_1 \in S_X} \sum_{i_2 \in S_X, >i_1} a_{i_1,i_2} + \sum_{k \in \{1,\cdots,m\}-S_X} \left(\sum_{i \in S_X} \tilde{a}_{k,i}\right) p_k
\end{aligned}$$

$$\tilde{a}_{k,l} = \begin{cases} a_{k,l} & \text{if } (k < l) \\ a_{l,k} & \text{otherwise} \end{cases} \quad \text{for } 1 \leq k \leq m, 1 \leq l \leq m, k \neq l$$

FIG. 60

$$E\left[\frac{dY_A}{dS_X}\right] = E[(Y_A|X_i = 1 \text{ for } 1 \forall i \in S_X) - (Y_A|X_i = 0 \text{ for } 1 \forall i \in S_X)]$$

$$= \left(\sum_{i \in S_X} a_i + \sum_{i_1 \in S_X} \sum_{i_2 \in S_X, > i_1} a_{i_1, i_2} + \cdots + \sum_{i_1 \in S_X} \cdots \sum_{i_d \in S_X, > i_{d-1}} a_{i_1, \cdots, i_d}\right)$$

$$+ \sum_{k \in \{1, \cdots, m\} - S_X} \left(\sum_{i \in S_X} \tilde{a}_{k,i} + \sum_{i_1 \in S_X} \sum_{i_2 \in S_X, > i_1} \tilde{a}_{k, i_1, i_2} + \cdots + \sum_{i_1 \in S_X} \cdots \sum_{i_{d-1} \in S_X, > i_{d-2}} \tilde{a}_{k, i_1, \cdots, i_{d-1}}\right) p_k$$

$$+ \sum_{k_1 \in \{1, \cdots, m-1\} - S_X} \sum_{k_2 \in \{k_1+1, \cdots, m\} - S_X} \cdots \left(\sum_{i \in S_X} \tilde{a}_{k_1, k_2, i} + \cdots + \sum_{i_1 \in S_X} \cdots \sum_{i_{d-2} \in S_X, > i_{d-3}} \tilde{a}_{k_1, k_2, i_1, \cdots, i_{d-2}}\right) p_{k_1} p_{k_2} + \cdots$$

$$+ \sum_{k_1 \in \{1, \cdots, m-d+2\} - S_X} \sum_{k_2 \in \{k_1+1, \cdots, m-d+3\} - S_X} \cdots \sum_{k_{d-1} \in \{k_{d-2}+1, \cdots, m\} - S_X} \left(\sum_{i \in S_X} \tilde{a}_{k_1, k_2, \cdots, k_{d-1}, i}\right) p_{k_1} p_{k_2} \cdots p_{k_{d-1}}$$

$$\tilde{a}_{k,l} = \begin{cases} a_{k,l} & \text{if } (k < l) \\ a_{l,k} & \text{otherwise} \end{cases} \quad \text{for } 1 \leq k \leq m, 1 \leq l \leq m, k \neq l$$

$$\tilde{a}_{k_1, \cdots, k_j} = \{a_{l_1, \cdots, l_j}|\{l_1, \cdots, l_j\} = \{k_1, \cdots, k_j\}, l_1 < l_2 < \cdots < l_j\} \quad \text{for } 1 \leq j \leq d, 1 \leq k_i \leq m, k_{i_1} \neq k_{i_2}$$

FIG. 61

$$V\left[\frac{dY_A}{dS_X}\right] = E\left[\left(\frac{dY_A}{dS_X}\right)^2\right] - \left(E\left[\frac{dY_A}{dS_X}\right]\right)^2 = E\left[\left(\sum_{i \in S_X} a_i\right)^2\right] - \left(\sum_{i \in S_X} a_i\right)^2 = 0$$

Namely, LRV does not hold variance of derivative.

FIG. 62

$$V\left[\frac{dY_A}{dS_X}\right] = E\left[\left(\frac{dY_A}{dS_X}\right)^2\right] - \left(E\left[\frac{dY_A}{dS_X}\right]\right)^2$$

$$= E\left[\left(\sum_{i \in S_X} a_i + \sum_{i_1 \in S_X} \sum_{i_2 \in S_X, > i_1} a_{i_1, i_2} + \sum_{k \in \{1, \cdots, m\} - S_X} \left(\sum_{i \in S_X} \tilde{a}_{k,i}\right) X_k\right)^2\right]$$

$$- \left(\sum_{i \in S_X} a_i + \sum_{i_1 \in S_X} \sum_{i_2 \in S_X, > i_1} a_{i_1, i_2} + \sum_{k \in \{1, \cdots, m\} - S_X} \left(\sum_{i \in S_X} \tilde{a}_{k,i}\right) p_k\right)^2$$

$$= E\left[\left(\sum_{i \in S_X} a_i + \sum_{i_1 \in S_X} \sum_{i_2 \in S_X, > i_1} a_{i_1, i_2}\right)^2 + 2\left(\sum_{i \in S_X} a_i + \sum_{i_1 \in S_X} \sum_{i_2 \in S_X, > i_1} a_{i_1, i_2}\right)\left(\sum_{k \in \{1, \cdots, m\} - S_X} \left(\sum_{i \in S_X} \tilde{a}_{k,i}\right) X_k\right)\right.$$

$$+ 2\sum_{k \in \{1, \cdots, m-1\} - S_X} \sum_{l \in \{k+1, \cdots, m\} - S_X} \left(\sum_{i \in S_X} \tilde{a}_{k,i}\right)\left(\sum_{i \in S_X} \tilde{a}_{l,i}\right) X_k X_l + \left.\sum_{k \in \{1, \cdots, m\} - S_X} \left(\sum_{i \in S_X} \tilde{a}_{k,i}\right)^2 X_k^2\right]$$

$$- \left[\left(\sum_{i \in S_X} a_i + \sum_{i_1 \in S_X} \sum_{i_2 \in S_X, > i_1} a_{i_1, i_2}\right)^2 + 2\left(\sum_{i \in S_X} a_i + \sum_{i_1 \in S_X} \sum_{i_2 \in S_X, > i_1} a_{i_1, i_2}\right)\left(\sum_{k \in \{1, \cdots, m\} - S_X} \left(\sum_{i \in S_X} \tilde{a}_{k,i}\right) p_k\right)\right.$$

$$+ 2\sum_{k \in \{1, \cdots, m-1\} - S_X} \sum_{l \in \{k+1, \cdots, m\} - S_X} \left(\sum_{i \in S_X} \tilde{a}_{k,i}\right)\left(\sum_{i \in S_X} \tilde{a}_{l,i}\right) p_k p_l + \left.\sum_{k \in \{1, \cdots, m\} - S_X} \left(\sum_{i \in S_X} \tilde{a}_{k,i}\right)^2 p_k^2\right]$$

FIG. 63A $$= \sum_{k \in \{1,\ldots,m\}-S_X} \left( \sum_{i \in S_X} \tilde{a}_{k,i} \right)^2 p_k(1-p_k)$$

$$\tilde{a}_{k,l} = \begin{cases} a_{k,l} & \text{if } (k < l) \\ a_{l,k} & \text{otherwise} \end{cases} \quad \text{for } 1 \leq k \leq m, 1 \leq l \leq m, k \neq l$$

FIG. 63B $$V\left[\frac{dY_A}{dS_X}\right] = E\left[\left(\frac{dY_A}{dS_X}\right)^2\right] - \left(E\left[\frac{dY_A}{dS_X}\right]\right)^2$$

$$= E\left[\left\{\left(\sum_{i \in S_X} a_i + \sum_{i_1 \in S_X}\sum_{i_2 \in S_X, > i_1} a_{i_1,i_2} + \cdots + \sum_{i_1 \in S_X}\cdots\sum_{i_d \in S_X, > i_{d-1}} a_{i_1,\cdots,i_d}\right)\right.\right.$$

$$+ \sum_{k \in \{1,\cdots,m\}-S_X}\left(\sum_{i \in S_X}\tilde{a}_{k,i} + \sum_{i_1 \in S_X}\sum_{i_2 \in S_X, > i_1}\tilde{a}_{k,i_1,i_2} + \cdots + \sum_{i_1 \in S_X}\cdots\sum_{i_{d-1} \in S_X, > i_{d-2}}\tilde{a}_{k,i_1,\cdots,i_{d-1}}\right)X_k$$

$$+ \sum_{k_1 \in \{1,\cdots,m-1\}-S_X}\sum_{k_2 \in \{k_1+1,\cdots,m\}-S_X}\left(\sum_{i \in S_X}\tilde{a}_{k_1,k_2,i} + \cdots + \sum_{i_1 \in S_X}\cdots\sum_{i_{d-2} \in S_X, > i_{d-3}}\tilde{a}_{k_1,k_2,i_1,\cdots,i_{d-2}}\right)X_{k_1}X_{k_2} + \cdots$$

$$\left.\left.+ \sum_{k_1 \in \{1,\cdots,m-d+2\}-S_X}\sum_{k_2 \in \{k_1+1,\cdots,m-d+3\}-S_X}\cdots\sum_{k_{d-1} \in \{k_{d-2}+1,\cdots,m\}-S_X}\left(\sum_{i \in S_X}\tilde{a}_{k_1,k_2,\cdots,k_{d-1},i}\right)X_{k_1}X_{k_2}\cdots X_{k_{d-1}}\right\}^2\right]$$

FIG. 64A $$-\left\{\left(\sum_{i\in S_X} a_i + \sum_{i_1\in S_X}\sum_{i_2\in S_X,>i_1} a_{i_1,i_2} + \cdots + \sum_{i_1\in S_X}\cdots\sum_{i_d\in S_X,>i_{d-1}} a_{i_1,\ldots,i_d}\right)\right.$$

$$+ \sum_{k\in\{1,\ldots,m\}-S_X}\left(\sum_{i\in S_X}\tilde{a}_{k,i} + \sum_{i_1\in S_X}\sum_{i_2\in S_X,>i_1}\tilde{a}_{k,i_1,i_2} + \cdots + \sum_{i_1\in S_X}\cdots\sum_{i_{d-1}\in S_X,>i_{d-2}}\tilde{a}_{k,i_1,\ldots,i_{d-1}}\right)p_k$$

$$+ \sum_{k_1\in\{1,\ldots,m-1\}-S_X}\sum_{k_2\in\{k_1+1,\ldots,m\}-S_X}\left(\sum_{i\in S_X}\tilde{a}_{k_1,k_2,i} + \cdots + \sum_{i_1\in S_X}\cdots\sum_{i_{d-2}\in S_X,>i_{d-3}}\tilde{a}_{k_1,k_2,i_1,\ldots,i_{d-2}}\right)p_{k_1}p_{k_2} + \cdots$$

$$\left.+ \sum_{k_1\in\{1,\ldots,m-d+2\}-S_X}\sum_{k_2\in\{k_1+1,\ldots,m-d+3\}-S_X}\cdots\sum_{k_{d-1}\in\{k_{d-2}+1,\ldots,m\}-S_X}\left(\sum_{i\in S_X}\tilde{a}_{k_1,k_2,\ldots,k_{d-1},i}\right)p_{k_1}p_{k_2}\cdots p_{k_{d-1}}\right\}^2$$

FIG. 64B $$= \sum_{k \in \{1,\ldots,m\}-S_X} \left( \sum_{i \in S_X} \tilde{a}_{k,i} + \sum_{i_1 \in S_X} \sum_{i_2 \in S_X, > i_1} \tilde{a}_{k,i_1,i_2} + \cdots + \sum_{i_1 \in S_X} \cdots \sum_{i_{d-2} \in S_X, > i_{d-2}} \tilde{a}_{k,i_1,\ldots,i_{d-1}} \right)^2 p_k(1-p_k)$$

$$+ \sum_{k_1 \in \{1,\ldots,m-1\}-S_X} \sum_{k_2 \in \{k_1+1,\ldots,m\}-S_X} \sum_{l_2 \in \{l_1+1,\ldots,m\}-S_X} \left( \sum_{i \in S_X} \tilde{a}_{k_1,k_2,i} + \cdots \right)$$

$$+ \sum_{i_1 \in S_X} \cdots \sum_{i_{d-2} \in S_X, > i_{d-3}} \tilde{a}_{k_1 k_2, i_1, \ldots, i_{d-2}} \right) \left( \sum_{i \in S_X} \tilde{a}_{l_1,l_2,i} + \cdots + \sum_{i_1 \in S_X} \cdots \sum_{i_{d-2} \in S_X, > i_{d-3}} \tilde{a}_{l_1,l_2,i_1,\ldots,i_{d-2}} \right) \left\{ \prod_{t \in \{k_1,k_2\} \cup \{l_1,l_2\}} p_t \right\}$$

$$- \prod_{t \in \{k_1, k_2, l_1, l_2\}} p_t + \cdots$$

$$+ \sum_{k_1 \in \{1,\ldots,m-d+2\}-S_X} \cdots \sum_{k_{d-1} \in \{k_{d-2}+1,\ldots,m\}-S_X} \sum_{l_{d-1} \in \{l_{d-2}+1,\ldots,m\}-S_X} \left( \sum_{i \in S_X} \tilde{a}_{k_1,\ldots,k_{d-1},i} \right) \left( \sum_{i \in S_X} \tilde{a}_{l_1,\ldots,l_{d-1},i} \right) \left\{ \prod_{t \in \{k_1,\ldots,k_{d-1}\} \cup \{l_1,\ldots,l_{d-1}\}} p_t - \prod_{t \in \{k_1,\ldots,k_{d-1},l_1,\ldots,l_{d-1}\}} p_t \right\}$$

FIG. 64C $$+2 \sum_{k \in \{1,\ldots,m\}-S_X} \sum_{l_1 \in \{1,\ldots,m-1\}-S_X} \sum_{l_2 \in \{l_1+1,\ldots,m\}-S_X} \left( \sum_{i \in S_X} \tilde{a}_{k,i} + \sum_{i_1 \in S_X} \sum_{i_2 \in S_X, > i_1} \tilde{a}_{k,i_1,i_2} + \cdots \right)$$

$$+ \sum_{i_1 \in S_X} \cdots \sum_{i_{d-1} \in S_X, > i_{d-2}} \tilde{a}_{k,i_1,\ldots,i_{d-1}} \left( \sum_{i \in S_X} \tilde{a}_{l_1,l_2,i} + \cdots + \sum_{i_1 \in S_X} \sum_{i_2 \in S_X, > i_{d-3}} \tilde{a}_{l_1,l_2,i_1,\ldots,i_{d-2}} \right) \left\{ \prod_{t \in \{k\} \cup \{l_1,l_2\}} p_t \right\}$$

$$- \prod_{t \in \{k, l_1, l_2\}} p_t \Biggr\} + \cdots$$

$$+2 \sum_{k \in \{1,\ldots,m\}-S_X} \sum_{l_1 \in \{1,\ldots,m-d+2\}-S_X} \cdots \sum_{l_{d-1} \in \{l_{d-2}+1,\ldots,m\}-S_X} \left( \sum_{i \in S_X} \tilde{a}_{k,i} + \cdots \right)$$

$$+ \sum_{i_1 \in S_X} \cdots \sum_{i_{d-1} \in S_X, > i_{d-2}} \tilde{a}_{k,i_1,\ldots,i_{d-1}} \sum_{l_{d-1} \in \{l_{d-2}+1,\ldots,m\}, \ne i} \left( \sum_{i \in S_X} \tilde{a}_{l_1,\ldots,l_{d-1},i} + \cdots \right) \left\{ \prod_{t \in \{k,l_1,\ldots,l_{d-1}\}} p_t - \prod_{t \in \{k,l_1,\ldots,l_{d-1}\}} p_t \right\} + \cdots$$

$$+2 \sum_{k_1 \in \{1,\ldots,m-d+2\}, \ne i} \cdots \sum_{k_{d-2} \in \{k_{d-3}+1,\ldots,m-d+2+1,\ldots,m\}, \ne i} \sum_{l_{d-1} \in \{l_{d-2}+1,\ldots,m\}, \ne i} \tilde{a}_{k_1,\ldots,k_{d-2},l_1,\ldots,l_{d-1},i}$$

$$+ \sum_{i_1 \in S_X} \sum_{i_2 \in S_X, > i_1} \tilde{a}_{k_1,\ldots,k_{d-2},i_1,i_2} \left( \sum_{i \in S_X} \tilde{a}_{k_1,\ldots,k_{d-2},i} + \cdots \right) \left\{ \prod_{t \in \{k_1,\ldots,k_{d-2},l_1,\ldots,l_{d-1}\}} p_t \right\}$$

FIG. 64D $$Cov\left[\frac{dY_A}{dS_X}, \frac{dY_B}{dS_X}\right] = E\left[\frac{dY_A}{dS_X}\frac{dY_B}{dS_X}\right] - E\left[\frac{dY_A}{dS_X}\right]E\left[\frac{dY_B}{dS_X}\right] = E\left[\left(\sum_{i \in S_X} a_i\right)\left(\sum_{i \in S_X} b_i\right)\right] - E\left[\left(\sum_{i \in S_X} a_i\right)\right]E\left[\left(\sum_{i \in S_X} b_i\right)\right]$$

$$Cov\left[\frac{dY_A}{dS_X}, \frac{dY_B}{dS_X}\right] = E\left[\frac{dY_A}{dS_X}\frac{dY_B}{dS_X}\right] - E\left[\frac{dY_A}{dS_X}\right]E\left[\frac{dY_B}{dS_X}\right]$$

$$= E\left[\left(\left(\sum_{i \in S_X} a_i + \sum_{i_1 \in S_X}\sum_{i_2 \in S_X, > i_1} a_{i_1,i_2}\right) + \sum_{k \in \{1,\cdots,m\}-S_X}\left(\sum_{i \in S_X} \tilde{a}_{k,i}\right)X_k\right)\left(\left(\sum_{i \in S_X} b_i + \sum_{i_1 \in S_X}\sum_{i_2 \in S_X, > i_1} b_{i_1,i_2}\right)\right.\right.$$

$$+ \sum_{k \in \{1,\cdots,m\}-S_X}\left(\sum_{i \in S_X} \tilde{b}_{k,i}\right)X_k\right]$$

$$- E\left[\left(\left(\sum_{i \in S_X} a_i + \sum_{i_1 \in S_X}\sum_{i_2 \in S_X, > i_1} a_{i_1,i_2}\right) + \sum_{k \in \{1,\cdots,m\}-S_X}\left(\sum_{i \in S_X} \tilde{a}_{k,i}\right)X_k\right)\right]E\left[\left(\left(\sum_{i \in S_X} b_i + \sum_{i_1 \in S_X}\sum_{i_2 \in S_X, > i_1} b_{i_1,i_2}\right)\right.\right.$$

$$+ \sum_{k \in \{1,\cdots,m\}-S_X}\left(\sum_{i \in S_X} \tilde{b}_{k,i}\right)X_k\right]$$

FIG. 66A $$= \left[ \left( \sum_{i \in S_X} a_i + \sum_{i_1 \in S_X} \sum_{i_2 \in S_X, >i_1} a_{i_1,i_2} \right) \left( \sum_{i \in S_X} b_i + \sum_{i_1 \in S_X} \sum_{i_2 \in S_X, >i_1} b_{i_1,i_2} \right) \right.$$

$$+ \left( \sum_{i \in S_X} a_i + \sum_{i_1 \in S_X} \sum_{i_2 \in S_X, >i_1} a_{i_1,i_2} \right) \sum_{k \in \{1,\dots,m\} - S_X} \tilde{b}_{k,i} p_k$$

$$+ \left( \sum_{i \in S_X} b_i + \sum_{i_1 \in S_X} \sum_{i_2 \in S_X, >i_1} b_{i_1,i_2} \right) \sum_{k \in \{1,\dots,m\} - S_X} \tilde{a}_{k,i} p_k$$

$$\left. + \sum_{k \in \{1,\dots,m\} - S_X} \sum_{l \in \{1,\dots,m\} - S_X} \left( \sum_{i \in S_X} \tilde{a}_{k,i} \right) \left( \sum_{i \in S_X} \tilde{b}_{k,i} \right) \prod_{t \in \{k\} \cup \{l\}} p_t \right]$$

FIG. 66B $$\begin{aligned}
&-\left[\left(\sum_{i\in S_X} a_i + \sum_{i_1\in S_X}\sum_{i_2\in S_X, >i_1} a_{i_1,i_2}\right)\left(\sum_{i\in S_X} b_i + \sum_{i_1\in S_X}\sum_{i_2\in S_X, >i_1} b_{i_1,i_2}\right)\right.\\
&+\left(\sum_{i\in S_X} a_i + \sum_{i_1\in S_X}\sum_{i_2\in S_X, >i_1} a_{i_1,i_2}\right)\sum_{k\in\{1,\dots,m\}-S_X} \tilde{b}_{k,i} p_k\\
&+\left(\sum_{i\in S_X} b_i + \sum_{i_1\in S_X}\sum_{i_2\in S_X, >i_1} b_{i_1,i_2}\right)\sum_{k\in\{1,\dots,m\}-S_X} \tilde{a}_{k,i} p_k\\
&\left.+\sum_{k\in\{1,\dots,m\}-S_X}\sum_{l\in\{1,\dots,m\}-S_X}\left(\sum_{i\in S_X}\tilde{a}_{k,i}\right)\left(\sum_{i\in S_X}\tilde{b}_{k,i}\right) p_k p_l\right]\\
&=\sum_{k\in\{1,\dots,m\}-S_X}\left(\sum_{i\in S_X}\tilde{a}_{k,i}\right)\left(\sum_{i\in S_X}\tilde{b}_{k,i}\right) p_k(1-p_k)
\end{aligned}$$

FIG. 66C $$S[X_i] \simeq \log 2 - 2q_i^2$$

Lemma

$$S[X_i] = -p_i \log(p_i) - (1-p_i)\log(1-p_i) = -\left(\frac{1}{2}+q_i\right)\log\left(\frac{1}{2}+q_i\right) - \left(\frac{1}{2}-q_i\right)\log\left(\frac{1}{2}-q_i\right)$$

$$= \log 2 - \sum_{j=1}^{\infty} \frac{2^{(2j)}}{(2j-1)(2j)} q_i^{(2j)} = \log 2 - \frac{2^2}{1\cdot 2}q_i^2 - \frac{2^4}{3\cdot 4}q_i^4 - \frac{2^6}{5\cdot 6}q_i^6 - \cdots$$

$$= \log 2 - 2q_i^2 - \frac{4}{3}q_i^4 - \frac{32}{15}q_i^6 - \cdots \simeq \log 2 - 2q_i^2$$

For $|q_i| = \left|p_i - \frac{1}{2}\right| \ll \frac{1}{2}$, $$S[X_i] \simeq \log 2 - 2q_i^2 = \log 2 - 2\left(p_i - \frac{1}{2}\right)^2$$

Here, log 2 is a natural log of 2 base $e$.

FIG. 67

$$Y_A = a_0 + \sum_{k=1}^{m} a_k X_k$$

$$S[Y_A] \equiv -\left(\sum_{x_1 \in \{0,1\}} \sum_{x_2 \in \{0,1\}} \cdots \sum_{x_m \in \{0,1\}} \left(\prod_{k=1}^{m} Pr[(X_k = \chi_k)]\right) \log\left(\prod_{k=1}^{m} (Pr[(X_k = \chi_k)])^{\frac{1}{a_k^2}}\right)\right)$$

$$\hat{S}[Y_A] \equiv -\left(\sum_{x_1 \in \{0,1\}} \sum_{x_2 \in \{0,1\}} \cdots \sum_{x_m \in \{0,1\}} \left(\prod_{k=1}^{m} Pr[(X_k = \chi_k)]\right) \log\left(\prod_{k=1}^{m} (Pr[(X_k = \chi_k)])\right)\right)$$

$\hat{S}[Y_A]$ is an alternative definition of entropy.

FIG. 68A

Lemma:

$$S[Y_A] = -\left(\sum_{\chi_1 \in \{0,1\}} \sum_{\chi_2 \in \{0,1\}} \cdots \sum_{\chi_m \in \{0,1\}} \left(\left\{\prod_{k=1}^m Pr[(X_k = \chi_k)]\right\} \left\{\sum_{k=1}^m \frac{1}{a_k^2} \log(Pr[(X_k = \chi_k)])\right\}\right)\right)$$

$$= -\sum_{\chi_1 \in \{0,1\}} \sum_{\chi_2 \in \{0,1\}} \cdots \sum_{\chi_m \in \{0,1\}} \left(\left\{Pr[(X_1 = \chi_1)] \times \prod_{k=2}^m Pr[(X_k = \chi_k)]\right\} \times \frac{1}{a_1^2} \log(Pr[(X_1 = \chi_1)])\right)$$

$$- \sum_{\chi_1 \in \{0,1\}} \sum_{\chi_2 \in \{0,1\}} \cdots \sum_{\chi_m \in \{0,1\}} \left(\left\{Pr[(X_1 = \chi_1)] \times \prod_{k=2}^m Pr[(X_k = \chi_k)]\right\} \times \sum_{k=2}^m \frac{1}{a_k^2} \log(Pr[(X_k = \chi_k)])\right)$$

$$= -\frac{1}{a_1^2} \left(\left(\sum_{\chi_1 \in \{0,1\}} Pr[(X_1 = \chi_1)] \log(Pr[(X_1 = \chi_1)])\right)\right)$$

FIG. 68B $$-\sum_{\chi_2\in\{0,1\}}\cdots\sum_{\chi_m\in\{0,1\}}\left(\left\{\prod_{k=2}^{m}Pr[(X_k=\chi_k)]\right\}\left\{\sum_{k=2}^{m}\frac{1}{a_k^2}\log(Pr[(X_k=\chi_k)])\right\}\right)$$

$$=-\sum_{k=1}^{m}\frac{1}{a_k^2}\left(\left(\sum_{\chi_k\in\{0,1\}}Pr[X_k=\chi_k]\log(Pr[X_k=\chi_k])\right)\right)$$

$$=-\sum_{k=1}^{m}\frac{1}{a_k^2}\{p_k\log(p_k)+(1-p_k)\log(1-p_k)\}$$

$$=\sum_{k=1}^{m}\frac{1}{a_k^2}\left\{-\left(\frac{1}{2}+q_k\right)\log\left(\frac{1}{2}+q_k\right)-\left(\frac{1}{2}-q_k\right)\log\left(\frac{1}{2}-q_k\right)\right\}=\sum_{k=1}^{m}\frac{1}{a_k^2}S[X_k]$$

$$\hat{S}[Y_A]=\sum_{k=1}^{m}S[X_k]$$

FIG. 68C $$Y_A = \vec{X}^T A \vec{X}$$

$$\vec{X} \equiv [X_0 \ X_1 \ X_2 \ \cdots \ X_m]^T$$

$$A \equiv \begin{bmatrix} a_0 & 0 & 0 & \cdots & 0 & 0 \\ 0 & a_1 & a_{1,2} & \cdots & a_{1,m-1} & a_{1,m} \\ 0 & 0 & a_2 & \cdots & a_{2,m-1} & a_{2,m} \\ \vdots & \vdots & \vdots & \ddots & \vdots & \vdots \\ 0 & 0 & 0 & \cdots & a_{m-1} & a_{m-1,m} \\ 0 & 0 & 0 & \cdots & 0 & a_m \end{bmatrix}$$

$$\xi_k \equiv \sqrt{a_k^2 + \sum_{j=1}^{k-1} a_{j,k}^2 + \sum_{j=k+1}^{m} a_{k,j}^2}$$

$$S[Y_A] \equiv - \left( \sum_{\chi_1 \in \{0,1\}} \sum_{\chi_2 \in \{0,1\}} \cdots \sum_{\chi_m \in \{0,1\}} \left( \prod_{k=1}^{m} Pr[(X_k = \chi_k)] \right) \log \left( \prod_{k=1}^{m} (Pr[(X_k = \chi_k)])^{\frac{1}{\xi_k^2}} \right) \right)$$

$$\hat{S}[Y_A] \equiv - \left( \sum_{\chi_1 \in \{0,1\}} \sum_{\chi_2 \in \{0,1\}} \cdots \sum_{\chi_m \in \{0,1\}} \left( \prod_{k=1}^{m} Pr[(X_k = \chi_k)] \right) \log \left( \prod_{k=1}^{m} (Pr[(X_k = \chi_k)]) \right) \right)$$

$\hat{S}[Y_A]$ is an alternative definition of entropy.

FIG. 69A $$S[Y_A] = -\left(\sum_{\chi_1 \in \{0,1\}} \sum_{\chi_2 \in \{0,1\}} \cdots \sum_{\chi_m \in \{0,1\}} \left(\left(\prod_{k=1}^{m} Pr[(X_k = \chi_k)]\right) \left\{\sum_{k=1}^{m} \left\{\frac{1}{\xi_k^2} \log(Pr[(X_k = \chi_k)])\right\}\right\}\right)\right)$$

$$= -\sum_{\chi_1 \in \{0,1\}} \sum_{\chi_2 \in \{0,1\}} \cdots \sum_{\chi_m \in \{0,1\}} \left(\left\{Pr[(X_1 = \chi_1)] \times \prod_{k=2}^{m} Pr[(X_k = \chi_k)]\right\}\right.$$
$$\left. \times \left\{\frac{1}{\xi_1^2} \log(Pr[(X_1 = \chi_1)])\right\}\right)$$
$$- \sum_{\chi_1 \in \{0,1\}} \sum_{\chi_2 \in \{0,1\}} \cdots \sum_{\chi_m \in \{0,1\}} \left(\left\{Pr[(X_1 = \chi_1)] \times \prod_{k=2}^{m} Pr[(X_k = \chi_k)]\right\}\right.$$
$$\left. \times \sum_{k=2}^{m} \left\{\frac{1}{\xi_k^2} \log(Pr[(X_k = \chi_k)])\right\}\right)$$

$$= -\frac{1}{\xi_1^2} \left(\sum_{\chi_1 \in \{0,1\}} Pr[(X_1 = \chi_1)] \times \{\log(Pr[(X_1 = \chi_1)])\}\right)$$
$$- \sum_{\chi_2 \in \{0,1\}} \cdots \sum_{\chi_m \in \{0,1\}} \left(\left(\prod_{k=2}^{m} Pr[(X_k = \chi_k)]\right) \left\{\sum_{k=2}^{m} \left\{\frac{1}{\xi_k^2} \log(Pr[(X_k = \chi_k)])\right\}\right\}\right)$$

FIG. 69B $$= -\sum_{k=1}^{m} \frac{1}{\xi_k^2} \left\{ \left( \sum_{\chi_k \in \{0,1\}} Pr[(X_k = \chi_k)] \times \{\log(Pr[(X_k = \chi_k)])\} \right) \right\}$$

$$= -\sum_{k=1}^{m} \frac{1}{\xi_k^2} \{p_k \log(p_k) + (1 - p_k)\log(1 - p_k)\}$$

$$= \sum_{k=1}^{m} \frac{1}{\xi_k^2} \left\{ -\left(\frac{1}{2} + q_k\right)\log\left(\frac{1}{2} + q_k\right) - \left(\frac{1}{2} - q_k\right)\log\left(\frac{1}{2} - q_k\right) \right\} = \sum_{k=1}^{m} \frac{1}{\xi_k^2} S[X_k]$$

$$\hat{S}[Y_A] = \sum_{k=1}^{m} S[X_k]$$

FIG. 69C $$Y_A = a_0 + \sum_{k=1}^{m} a_k X_k + \sum_{k_1=1}^{m-1} \sum_{k_2=k_1+1}^{m} a_{k_1,k_2} X_{k_1} X_{k_2} + \cdots$$
$$+ \sum_{k_1=1}^{m-d+1} \sum_{k_2=k_1+1}^{m-d+2} \cdots \sum_{k_{d-1}=k_{d-2}+1}^{m-1} \sum_{k_d=k_{d-1}+1}^{m} a_{k_1,k_2,\cdots,k_{d-1},k_d} X_{k_1} X_{k_2} \cdots X_{k_{d-1}} X_{k_d}$$

$$\xi_k \equiv \sqrt{a_k^2 + \sum_{(k=k_1)\vee(k=k_2)} a_{k_1,k_2}^2 + \cdots + \sum_{(k=k_1)\vee(k=k_2)\vee\cdots\vee(k=k_d)} a_{k_1,k_2,\cdots,k_d}^2 + \cdots}$$

$$S[Y_A] \equiv -\left(\sum_{\chi_1\in\{0,1\}} \sum_{\chi_2\in\{0,1\}} \cdots \sum_{\chi_m\in\{0,1\}} \left(\prod_{k=1}^{m} Pr[(X_k = \chi_k)]\right) \log\left(\prod_{k=1}^{m} (Pr[(X_k = \chi_k)])^{\frac{1}{\xi_k^2}}\right)\right)$$

$$\hat{S}[Y_A] \equiv -\left(\sum_{\chi_1\in\{0,1\}} \sum_{\chi_2\in\{0,1\}} \cdots \sum_{\chi_m\in\{0,1\}} \left(\prod_{k=1}^{m} Pr[(X_k = \chi_k)]\right) \log\left(\prod_{k=1}^{m} (Pr[(X_k = \chi_k)])\right)\right)$$

$\hat{S}[Y_A]$ is an alternative definition of entropy.

FIG. 70A

Lemma $$S[Y_A] = -\left(\sum_{\chi_1 \in \{0,1\}} \sum_{\chi_2 \in \{0,1\}} \cdots \sum_{\chi_m \in \{0,1\}} \left(\left\{\prod_{k=1}^{m} Pr[(X_k = \chi_k)]\right\} \sum_{k=1}^{m} \left\{\frac{1}{\xi_k^2} \log(Pr[(X_k = \chi_k)])\right\}\right)\right)$$

$$= - \sum_{\chi_1 \in \{0,1\}} \sum_{\chi_2 \in \{0,1\}} \cdots \sum_{\chi_m \in \{0,1\}} \left(\left\{Pr[(X_1 = \chi_1)] \times \prod_{k=2}^{m} Pr[(X_k = \chi_k)]\right\}\right.$$

$$\left. \times \left\{\frac{1}{\xi_1^2} \log(Pr[(X_1 = \chi_1)])\right\}\right) - \sum_{\chi_1 \in \{0,1\}} \cdots \sum_{\chi_m \in \{0,1\}} \left(\left\{Pr[(X_1 = \chi_1)] \times \prod_{k=2}^{m} Pr[(X_k = \chi_k)]\right\}\right.$$

$$\left. \times \sum_{k=2}^{m} \left\{\frac{1}{\xi_k^2} \log(Pr[(X_k = \chi_k)])\right\}\right)$$

FIG. 70B $$\begin{aligned}
&= -\frac{1}{\xi_1^2}\left\{\left(\sum_{\chi_1\in\{0,1\}} Pr[(X_1=\chi_1)]\times\{\log(Pr[(X_1=\chi_1)])\}\right)\right\}\\
&\quad - \sum_{\chi_2\in\{0,1\}}\cdots\sum_{\chi_m\in\{0,1\}}\left(\left\{\prod_{k=2}^m Pr[(X_k=\chi_k)]\right\}\left\{\sum_{k=2}^m \frac{1}{\xi_k^2}\log(Pr[(X_k=\chi_k)])\right\}\right)\\
&= -\sum_{k=1}^m \frac{1}{\xi_k^2}\left(\sum_{\chi_k\in\{0,1\}} Pr[(X_k=\chi_k)]\times\{\log(Pr[(X_k=\chi_k)])\}\right)\\
&= -\sum_{k=1}^m \frac{1}{\xi_k^2}\{p_k\log(p_k)+(1-p_k)\log(1-p_k)\}\\
&= \sum_{k=1}^m \frac{1}{\xi_k^2}\left\{-\left(\frac{1}{2}+q_k\right)\log\left(\frac{1}{2}+q_k\right)-\left(\frac{1}{2}-q_k\right)\log\left(\frac{1}{2}-q_k\right)\right\} = \sum_{k=1}^m \frac{1}{\xi_k^2}S[X_k]
\end{aligned}$$

$$\hat{S}[Y_A] = \sum_{k=1}^m \hat{S}[X_k]$$

FIG. 70C

COMPUTING USING UNKNOWN VALUES

FIELD

The embodiments discussed herein are related to computing using unknown values.

BACKGROUND

Computer programmers translate real-world problems into steps of computer programs or computer instructions. The computer programs are processed by computer devices, which are generally arithmetic machines. The computer programs are written in computer programming languages.

Computer programming languages recognize different types of data. The type(s) of data recognized by a computer language may be referred to as a basic data type. In JAVA for instance, the basic (or primitive) data types include byte, short, int, long, float, double, Boolean, and char. In C, the basic data types may include int, float, double, char. These and other basic data types represent a single state at a time.

Values and variables in computer programs are formatted in the basic data type. Accordingly, values and variables in the computer programs represent a single state that is known. The computer programs may accordingly only perform computer operations using known values. For example, in the computer programs, operations such as an addition operation and multiplication operation may be executed on known values. Similarly, variables in the conventional programming languages may have known values during execution of computer operations. The basic data type being single state at a time and being known introduces a limitation of the computer programs and the computer languages.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a method of quantum-inspired computing may include defining a first atomic random variable (ARV) in a programming language system. The first ARV may have a non-deterministic value of either zero or one. The first ARV may have a first probability of having a value of one. The first ARV may have a second probability of having a value of zero. A sum of the first probability and the second probability may be equal to one. A covariance of the first ARV and a second ARV may be zero. The method may include defining a first random variable (RV) in the programming language system. The first RV may have a first indefinite value at a first definite probability and may include a polynomial of one or more atomic random variables (ARVS) that includes the first ARV. The method may include executing a computer instruction that includes a mathematical operation. The mathematical operation may involve the first RV as a basic data type. The execution of the computer instruction may produce a second RV that has a second indefinite value at a second definite probability and the second RV that may represent a result distribution and tracks response to the one or more ARVS.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which:

FIG. 4 presents an example equation that defines a ground of an atomic random variable (ARV) defined and supported in the programming language system of FIG. 1;

FIG. 5 presents an example equation that defines a mean of the ARV of FIG. 4;

FIG. 6 presents an example equation that defines a mean square of the ARV of FIG. 4;

FIG. 7 presents an example equation that defines a variance of the ARV of FIG. 4;

FIG. 8 presents example equations that define a covariance of the ARV of FIG. 4;

FIG. 9 presents an example equation that defines an n-th moment of the ARV of FIG. 4;

FIG. 10 presents an example equation that defines a probability density function of the ARV of FIG. 4;

FIG. 11 presents an example equation that defines a cumulative density function of the ARV of FIG. 4;

FIG. 12 presents an example equation that defines a moment-generating function of the ARV of FIG. 4;

FIG. 13 presents an example equation that defines a characteristic function of the ARV of FIG. 4;

FIG. 14 presents an example equation that defines a cumulant-generating function of the ARV of FIG. 4;

FIG. 15 presents a theorem of power of the ARV of FIG. 4;

FIG. 16 presents an example equation that defines a ground of a linear random variable (LRV) defined and supported in the programming language system of FIG. 1;

FIG. 17 presents an example equation that defines a mean of the LRV of FIG. 16;

FIG. 18 presents an example equation that defines a mean square of the LRV of FIG. 16;

FIG. 19 presents an example equation that defines a variance of the LRV of FIG. 16;

FIG. 20 presents an example equation that defines n-th moment of the LRV of FIG. 16;

FIG. 21 presents example equations that define a covariance of the LRV of FIG. 16;

FIG. 22 presents an example equation that defines a correlation coefficient of the LRV of FIG. 16;

FIG. 23 presents example quadratic random variable (QRV) transform expressions that transform a QRV defined and supported in the programming language system of FIG. 1;

FIG. 24 presents an example equation that defines a ground of the QRV of FIG. 23;

FIG. 25 presents an example equation that defines a mean of the QRV of FIG. 23;

FIG. 26 presents an example equation that defines a mean square of the QRV of FIG. 23;

FIG. 27 presents an example equation that defines a variance of the QRV of FIG. 23;

FIGS. 28A, 28B, and 29 presents example equations that define a covariance of the QRV of FIG. 23;

FIG. 30 presents an example equation that defines a correlation coefficient of the QRV of FIG. 23;

FIGS. 31-32 presents equations for an example transformation between the QRV of FIG. 23 and the LRV of FIG. 16;

FIG. 33 presents some example changes to the ground after the transformation of FIGS. 31-32;

FIG. 34 presents some example changes to the mean after the transformation of FIGS. 31-32;

FIGS. 35A and 35B present some example changes to the mean square after the transformation of FIGS. 31-32;

FIG. 36A presents an example high-order random variable (HRV) transformation expressions that transform an HRV defined and supported in the programming language system of FIG. 1 to an equivalent canonical form;

FIGS. 36B and 36C present a proof of the HRV transformation expressions of FIG. 36A;

FIG. 37 presents an example equation that defines a ground of an HRV defined and supported in the programming language system of FIG. 1;

FIG. 38 presents an example equation that defines a mean of the HRV of FIG. 37;

FIG. 39 presents an example equation that defines a mean square of the HRV of FIG. 37;

FIG. 40 presents an example equation that defines a variance of the HRV of FIG. 37;

FIGS. 41A-41C present example equations that define a covariance of the HRV of FIG. 37;

FIG. 42 presents an example equation that defines a correlation coefficient of the HRV of FIG. 37;

FIGS. 43A-43B present an example reduction of the HRV of FIG. 37 by assignment of local value;

FIGS. 44A-44C present some example changes to the equations of the ground after the reduction of FIGS. 43A-43B;

FIGS. 45A and 45B present some example changes to the equations of the mean after the reduction of FIGS. 43A-43B;

FIGS. 45C-45D present equations clarifying portions of the equations of FIGS. 45A and 45B;

FIGS. 46A-46E present some example changes to the equations of the mean square (e.g., the second moment) after the reduction of FIGS. 43A-43B;

FIG. 47 presents some example differences to the mean square due to the reduction of FIGS. 43A-43B;

FIG. 48 presents an example random variable (RV) subtraction operation defined and supported in the programming language system of FIG. 1;

FIG. 49 presents an example RV scaling operation defined and supported in the programming language system of FIG. 1;

FIG. 50 presents example RV multiplication operations that involve LRVS defined and supported in the programming language system of FIG. 1;

FIG. 51 presents example RV multiplication operations that involve QRVS defined and supported in the programming language system of FIG. 1;

FIG. 52 presents an example definition for conditional random variables (CRVS) for the LRVS defined and supported in the programming language system of FIG. 1;

FIG. 53 presents an example definition for the CRVS for the QRVS defined and supported in the programming language system of FIG. 1;

FIG. 54 presents an example definition for the CRVS for the HRVS defined and supported in the programming language system of FIG. 1;

FIGS. 55A and 55B present an example definition for RV derivative operations for the LRVS defined and supported in the programming language system of FIG. 1;

FIGS. 56A and 56B present an example definition for RV derivative operations for the QRVS;

FIGS. 57A and 57B present an example definition for RV derivative operations for the HRVS;

FIGS. 58A-58C present example expressions that defines a ground of the RV derivatives;

FIG. 59 presents an example expression that defines an LRV mean of the RV derivatives;

FIG. 60 presents example expressions that define a QRV mean of the RV derivatives;

FIG. 61 presents example expressions that define an HRV mean of the RV derivatives;

FIG. 62 presents an example expression that defines an LRV variance of the RV derivatives;

FIGS. 63A and 63B present example expressions that define a QRV variance of the RV derivatives;

FIGS. 64A-64D present example expressions that define an HRV variance of the RV derivatives;

FIG. 65 presents an example expression that defines an LRV covariance of the RV derivatives;

FIGS. 66A-66C present example expressions that define a QRV covariance of the RV derivatives;

FIG. 67 presents example expressions for entropy of the ARV;

FIGS. 68A-68C present example expressions for entropy of the LRV;

FIGS. 69A-69C present example expressions for entropy of the QRV; and

FIGS. 70A-70C present example expressions for entropy of the HRV, arranged in accordance with at least one embodiment described herein.

DESCRIPTION OF EMBODIMENTS

Figure 1:
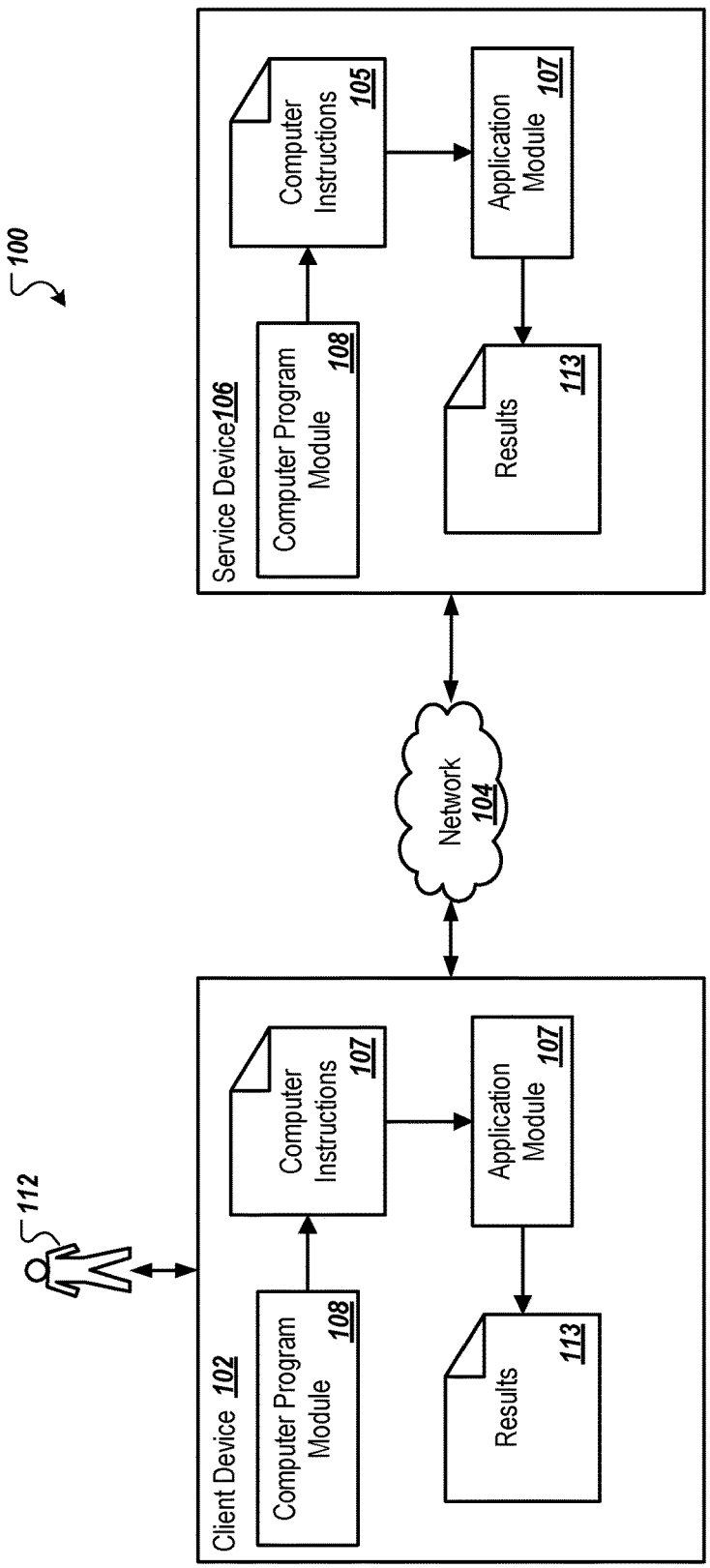
FIG. 1 illustrates an example programming language system in which some embodiments described in the present disclosure may be implemented.

Current basic data types of computer programming languages may represent a single state at a time. Accordingly, values and variables in computer programs that implement the current basic data types represent a single state at a time. In these and other computer programming languages, the single state is known during execution of mathematic operations included in computer programs.

The basic data type being a single state at a time and being known is a limitation of the computer programs and of the computer languages. Indeed, many real-word problems include unknown values. For example, quantum simulation for drug design, quantum simulation for material design, and combinatorial optimization for place and route in computer-aided design (CAD) may involve equations using many unknown values. To implement a computer program that addresses a real-world problem that includes unknown values, programmers may use algebraic mathematics with unknown variables to solve the equations beforehand, or use a numerical algorithm to translate equation that describe the real-world problems with the unknown values to simple arithmetic operations that include only known values.

The numerical algorithm is often inefficient. In particular, when dimensions of the real-world problem is high, numerical algorithm may be inefficient because the numerical algorithm may involve checking a large number (e.g., billions of billions) of combinations of possible values. Furthermore, the number of combinations may grow exponentially as the number of unknown values increases.

In addition, some statistical analysis involve random variables. For example, statistical analysis in statistical eye simulation of signal integrity analysis for high-speed signal transmission or statistical static timing analysis for CAD involve random variables. Conventional programming languages (e.g., those that only support basic data types with known values and/or a single state at a time) do not support random variables because the random variables may have unknown values. Accordingly, it may be difficult and error prone to write computer programs for statistical analysis in conventional programming languages. Indeed, some equations involved in statistical analysis may be impossible to solve. Additionally, a 'bug' in such a computer program is often indistinguishable from a result variation. For instance, jitter and inter-symbol interference in signal-integrity analysis may be correlated with each other because jitter and inter-symbol interference are both data dependent. However, a correlation between jitter and inter-symbol interference is difficult to describe, hardly noticeable, and overlooked in equations.

Some other computing systems may be able to represent multiple states at a time. For example, quantum computers, in some implementations, may be able to represent multiple states at a time. The quantum computer may utilize quantum effects of quantum devices. However, the quantum computer is difficult to realize itself. Furthermore, it may be difficult to write an algorithm and a computer program for the quantum computer because the programming model is different from conventional von Neumann-style computer devices and computer programming languages.

Another example is a non-deterministic algorithm, which may be able to represent a single state randomly chosen from multiple states at a time. For instance, a Monte Carlo (MC) method and a Markov-Chain Monte Carlo (MCMC) method may be able to represent a single state randomly chosen from multiple states at a time. The MC method explores solution space in a non-deterministic way using pseudo random numbers instead of exploring the entire solution space to relax computing inefficiencies associated with increases in dimensionality. However, in the non-deterministic algorithm results are obtained only by chance. Additionally, the non-deterministic algorithm is inefficient to cover low-probability cases especially in circumstance of high dimensionality.

Symbolic computation systems may support unknown values or random variables. Symbolic computation systems are incorporated in software packages such as REDUCE™, MATHEMATICA®, or MAPLE™. Computation in symbolic computation is performed using symbols for unknown values in the same way as conventional algebra used by human being. However, symbolic computation is not always possible. For example, it is mathematically proved impossible to solve a fifth-order equation in symbolic computation. In circumstances in which the symbolic computation is not possible, the computation may switch to numerical computation. As discussed above, the numerical computation is arithmetic. After the symbolic computation is transitioned to the numerical computation, computation for unknown values discontinues. For instance, correlation between random variables is lost after a transition to numerical computation. There is no intermediate form of computation between symbolic computation and numeric computation.

Statistical analysis software may support random variables. For example, in statistical analysis software such as 'S' or 'R,' random variables are used to represent a set of statistical data. However, the statistical analysis software is generally implemented for statistical analysis on the given data set. Accordingly, the statistical analysis software does not support general-purpose programming.

Satisfiability (SAT) solvers may be implemented to check whether a logic expression, which is represented with logic variables with conjunction; disjunction; and invert operators, is satisfiable. The SAT solvers may find the assignment of each logic variable when it is satisfiable. The logic variables are regarded to have unknown logic values. Thus, the SAT solver may be regarded to perform logic computation on the unknown logic values. There are heuristics for the SAT solvers that enable the software to solve logic expressions transformed from combinatorial optimization problems. However, SAT solvers may solve only logic expressions. Thus, problems are transformed to a logic expression before application of the SAT solver. Accordingly, the SAT solver is restrictive compared to the general-purpose computer programming.

Accordingly, embodiments described in the present disclosure relate to general-purpose computing using unknown values. For example, some embodiments may relate to computing systems that use unknown values as a basic data type, but are implemented in a general-purpose computing system and enable the generation and programming of general purpose computer programs.

An example of general purpose computing using unknown values may include quantum-inspired computing. The quantum-inspired computing may be defined relative to a quantum computer. A quantum computer uses a quantum bit (qubit) that represents either 0 or 1. In quantum computers whether the qubit is 0 or 1 is unknown. Multiple qubits compose a quantum state that represents one of super-positioned values, but which of the super-positioned values is unknown. Multiple qubits may be also entangled in a quantum state. Entanglement between the multiple qubits in the quantum state is realizable only if qubits are implemented using quantum device which has quantum effects, and may not be not realizable using conventional device which does not has quantum effects.

Some embodiments described in the present disclosure are related to quantum-inspired computing, because it realizes the super-position of multiple possible values without realizing the entanglement in a quantum state. Accordingly, it is possible to implement using conventional device which does not have quantum effects or as a software on a conventional general-purpose computer system.

Some embodiments describe a programming language system. The programming language system may support a random variable as a basic data type. The random variable may have an indefinite value, which may include a definite probability. The random variable may be represented by an atomic random variable that may have an indefinite atomic value that may have a definite probability distribution. The indefinite atomic value may have a discrete atomic value that may be either zero or one or may have one value from 0, 1, 2, 3, 4, 5, 6, 7, 8, 9 or may have a continuous atomic value. The continuous atomic value may have a Gaussian probability distribution or a uniform probability distribution.

The random variable may be represented by a polynomial of the atomic random variable. The programming language system may support multiple mathematical operations and statistical properties that enable navigation of the solution space. For an example, a value may be chosen to assign to an atomic random variable, which may equal to 0 or 1, based on whether an expected value of a derivative of a random variable with respect to the atomic random variable is positive or negative. In another example, a list of atomic random variables may be sorted in the descending order of variance of a derivative of a random variable. Accordingly, the list from those atomic random variables may be processed with larger effects on the random variable to those atomic random variables with smaller effects on the random variable.

Some example mathematical operations and statistical properties may include a product operator on the random variable, a conditional modifier on the random variable, a derivative modifier on the random variable as well as other, similar mathematical operations. Additionally, the statistical properties may include mean, mean square ($2^{nd}$ moment), variance, n-th moment, covariance, correlation coefficient, ground, other statistical properties, or some combination thereof. The programming language system may be loaded with an application program and may be executed.

The programming language system may be implemented to write and execute programs for various applications. For example, the applications may include quantum simulation for drug design, quantum simulation for material design, combinatory optimization for place and route in CAD, statistical eye simulation of signal integrity analysis for high-speed signal transmission, and statistical static timing analysis for CAD.

In comparison to statistical analysis software, the programming language system may be suitable for general-purpose programming. In comparison to SAT solvers, because the programming language system is based on polynomial, it is more general, more flexible, and more suitable for general-purpose programming. For instance, a polynomial may represent any logic formula by representing True by 1, False by 0, an inverting operator by a subtract operator (1−X), a conjunction operator by a product operator (X*Y), and a disjunction operator by a few operators (X+Y−X*Y).

These and other embodiments are described with reference to the appended figures. In the appended figures, features and components with the same item number include similar structure and function unless otherwise specified.

FIG. 1 illustrates an example programming language system 100 in which some embodiments described in the present disclosure may be implemented. In the programming language system 100, a client device 102 and/or a server device 106 may be configured for implementation of a computer program module 108. The computer program module 108 may enable a user 112 to program or otherwise generate computer instructions 105, which may take the form of a computer program. The computer program module 108 may include a general-purpose programming language that may be implemented to generate the computer instructions 105.

The computer instructions 105 may include generally applicable programming instructions that may be implemented to provide any type of computing functionality. For instance, the computer instructions 105 may include von Neumann-style computer instructions. The computer instructions 105 may be executed in an application module 107 to generate results 113. The results 113 may include a computing output, a data output, a signal that includes a data output, etc.

In the programming language system 100 of FIG. 1, the computer program module 108 and/or the application module 107 may be implemented at the client device 102. For example, the computer program module 108 may be loaded at least partially on the client device 102. Additionally, the application module 107 may be loaded at least partially on the client device 102. The user 112 may generate the computer instructions 105 locally (e.g., on the client device 102) and/or execute the computer instructions 105 locally.

Additionally, one or both of the computer program module 108 and the application module 107 may be implemented on the server device 106. For instance, the computer program module 108 and/or the application module 107 may be accessed by the user 112 using the client device 102 via a network 104. In some embodiments, the computer instructions 105 may be communicated between the client device 102, the server device 106, or other devices that are capable of network communication via the network 104. Each of the client device 102, the server device 106, and the network 104 are described below.

The network 104 may be wired or wireless, and may have numerous different configurations including, but not limited to, a star configuration, token ring configuration, or other configurations. Furthermore, the network 104 may include a local area network (LAN), a wide area network (WAN) (e.g., the Internet), and/or other interconnected data paths across which multiple devices may communicate. In some embodiments, the network 104 may be a peer-to-peer network. The network 104 may also be coupled to or include portions of a telecommunications network that may enable communication of data in a variety of different communication protocols. In some embodiments, the network 104 includes BLUETOOTH® communication networks and/or cellular communications networks for sending and receiving data including via short messaging service (SMS), multimedia messaging service (MMS), hypertext transfer protocol (HTTP), direct data connection, wireless application protocol (WAP), e-mail, etc.

The client device 102 may be a computing device or system that includes a processor, memory, and network communication capabilities. For example, the client device 102 may include a laptop computer, a desktop computer, a smart phone, a tablet computer, a mobile telephone, a personal digital assistant ("PDA"), a mobile email device, or other electronic device capable of accessing the network 104.

The server device 106 may include a hardware server that includes a processor, memory, and communication capabilities. In the illustrated embodiments, the server device 106 may be coupled to the network 104 to send and receive data and information to and from the client device 102 via the network 104.

The computer program module 108 and/or the application module 107 may be implemented using hardware including a processor, a microprocessor (e.g., to perform or control performance of one or more operations), a field-programmable gate array (FPGA), or an application-specific integrated circuit (ASIC). In some other instances, the computer program module 108 and/or the application module 107 may be implemented using a combination of hardware and software. Implementation in software may include rapid activation and deactivation of one or more transistors or transistor elements such as may be included in hardware of a computing system (e.g., the client device 102 and/or the server device 106). Additionally, software defined instructions may operate on information within transistor elements. Implementation of software instructions may at least temporarily reconfigure electronic pathways and transform computing hardware.

In the programming language system 100, the user 112 may be associated with the client device 102. The user 112 may interface with the computer program module 108 and/or the application module 107 using the client device 102 or a subsystem thereof as well as a combination of the client device 102, the network 104, and the server device 106. The user 112 may include an individual. In some embodiments, the user 112 may include another entity, a group of users, a robot, or a computing system.

The computer instructions 105 that are generated by the computer program module 108 may include one or more mathematical operations. The mathematical operations in the computer instructions 105 may involve a random variable (in the singular, "RV" and in the plural "RVS") as a basic data type. Accordingly, the computer instructions 105 may recognize the RV as a data type that is executable by the application module 107. The RV may be defined in the computer program module 108. The RV may include a polynomial of one or more atomic random variables (in the singular, "ARV" and in the plural "ARVS").

The ARVS may be defined in the computer program module 108. The RV may have an indefinite value or a non-deterministic value at a definite probability. For example, in some embodiments, the ARV may have a non-deterministic value of either zero or one. In these and other embodiments, the ARV may have a first probability of having a value of one and a second probability of having a value of zero. A sum of the first probability and the second probability is one. In some embodiments, the ARV may have a non-deterministic value that may be a continuous atomic value. The continuous atomic value may have a Gaussian probability distribution or a uniform probability distribution, for instance. A covariance between the ARVS is zero.

The computer program module 108 may support and define multiple types of RVS. For example, the computer program module 108 may support and define a linear random variable (in the singular, "LRV" and in the plural "LRVS"), a quadratic random variable (in the singular, "QRV" and in the plural "QRVS"), and high-order random variables (in the singular, "HRV" and in the plural "HRVS"). In addition, conditional random variables (in the singular, "CRV" and in the plural "CRVS") may be defined and supported by the computer program module 108. Some additional details of LRVS, QRVS, HRVS, and CRVS are provided elsewhere in the present disclosure.

The execution of mathematical operations that involve the RVS may produce new RVS that best represents a result distribution, keeping track of response to the original ARVS. The mathematical operations that may be included in the computer instructions 105 and are supported and defined by the computer program module 108 may include an RV addition operation, an RV subtraction operation, an RV scaling operation, an RV multiplication operation, and an RV derivative operation. Some additional details of each of the RV addition operation, the RV subtraction operation, the RV scaling operation, the RV multiplication operation, and the RV derivative operation are provided elsewhere in the present disclosure.

In addition, the computer program module 108 may define statistical properties of the mathematical operations, ARVS, and RVS. The statistical properties may enable navigation of a solution space that results or may result from execution of the mathematical operations, for instance.

Accordingly, the computer program module 108 may be configured to define the RVS as a basic data type, the ARVS, the mathematical operators, and the statistical properties in the programming language system 100. The computer program module 108 may be configured to enable the computer instructions 105 to be written using the RVS, the ARVS, the mathematical operators, and the statistical properties. The computer instructions 105 may be executed by the application module 107.

The following paragraphs provide some additional details of each of the ARVS, the LRVS, the QRVS, the HRVS, linear operators, the CRVS, and the derivative operators.

ARVS

The computer program module 108 may define ARVS. The ARVS may provide the basis for the RVS. For example, the RVS in the computer instructions 105 may include a polynomial of one or more of the ARVS. Some examples of the polynomial are provided elsewhere in the present disclosure.

In some embodiments, the ARVS may take a non-deterministic value of either one or zero. In computer science, "non-deterministic" refers to a potentially different output or value with the same input. Accordingly, with relation to the ARVS, the value of the ARVS is not exactly known for at least a period of time. The ARVS may take the non-deterministic value according to one or more probabilities. For instance, a probability of the ARVS eventually having the value of one may be defined as a first probability. A probability of the ARVS eventually having the value of zero may be defined as a second probability. A sum of the first probability and the second probability may be equal to one. Accordingly, the probability of the ARVS having the value of zero may be equal to a difference between one and the first probability. In the computer program module 108, the first probability and the second probability may be fixed at a particular time in which the ARV is created.

The ARVS may be independent of one another. Accordingly, instance of a first ARV having a particular value (e.g., one or zero) may not affect values of a second ARV. In some embodiments, probabilities of ARVS may be correlated. For instance, a second probability of a second ARV may be manipulated based on a first probability of a first ARV.

In some embodiments, the computer program module 108 may define special ARVS. The special ARVS may include a first particular ARV that is associated with a first probability that is equal to one. The first particular ARV may be equivalent to constant one and may be defined as one for all instances. The special ARVS may include a second particular ARV that is associated with a first probability that is equal to zero. The second particular ARV may be equivalent to constant zero and may be defined as zero for all instances.

In some embodiments, the ARV may be defined according to example ARV expressions:

$$X_i \in \{0,1\};$$

$$0 \leq p_i \leq 1;$$

$$\Pr[X_i=1]=p_i;$$

$$\Pr[X_i=0]=1-p_i; \text{ and}$$

$$\mathrm{Cov}(X_i, X_k)=0 \text{ for } i \neq k.$$

In the ARV expression, i and k represent indexing variables. The parameter $p_i$ represents the first probability indexed according to the indexing variable i. The parameter $X_i$ represents an ARV indexed according to the indexing variable i. $X_k$ represents an ARV indexed according to the indexing variable k. The function Pr[ ] represents a probability function. The function Cov( ) represents a covariance function.

According to the ARV expressions, the ARVS take a non-deterministic value of either one or zero. Determination of the value (either 1 or 0) may be deferred as much as possible until it becomes necessary. For example, it may become necessary when a number of the ARVS in a term exceeds a maximum order of the polynomial of random variables. At this point, values of one or more ARVS may be determined so that the number of ARVS in a term does not exceed the maximum order of the polynomial of RVs. Additionally, values of ARVS may have to be determined at a time to produce the output of the program execution.

The determination may be deferred to enable a tracking of a correlation. The correlation may be between RVs that share the same ARV may be tracked as long as the ARV is kept as an ARV without determining its value. The correlation between the RVs that share the same ARV may be lost after a value of the ARV is determined.

In some embodiment, the ARVS may have a continuous atomic value. The continuous atomic value may have a Gaussian probability distribution or a uniform probability distribution.

The computer program module 108 may define multiple statistical properties. The statistical properties for the ARVS may include a ground, a mean, a mean square, a variance, a covariance, an n-th moment, a probability density function, a cumulative density function, a moment-generating function, a characteristic function, and a cumulant-generating function. In addition, the computer program module 108 may define a theorem of power of ARV. The statistical properties may enable navigation of a solution space.

In some embodiments, one or more of the mean, the mean square, and the n-th moment of the ARVS may be equal to the first probability. Additionally, the mean, the mean square, and the n-th moment of the ARVS may be equal to the first probability regardless of "n" of the n-th moment. Additionally, the variance of the ARVS may be equal to the product of the first probability and the second probability $(p_i(1-p_i))$. Additionally still, the m-th power of the ARVS may be equivalent to the ARVS themselves. The relationship between the m-th power of the ARVS and the ARVS is because the n-th moment of the ARVS may be equal to the first probability.

FIGS. 4-14 provide equations that may define statistical properties of the ARVS in some embodiments. In FIGS. 4-14, the parameters, functions, etc. are as defined above in the ARV expressions. The equations of FIGS. 4-14 implement standard mathematical nomenclature and functionality, which may be understood by one with skill in the art with the benefit of the present disclosure.

FIG. 4 presents equation 1 (eq. 1). Equation 1 may define a ground ("G[parameter]" throughout the present disclosure) of the ARVS. The ground of the ARVS may be based on a value of a first probability. For instance in Equation 1, if the first probability is less than 0.5, then the ground may be equal to zero. Additionally, if the first probability is greater than 0.5, then the ground may be equal to one. Additionally still, if the first probability may be equal to 0.5, the ground may be equal to 0.5.

FIG. 5 presents equation 2 (eq. 2). Equation 2 may define a mean ("E[parameter]" throughout the present disclosure) of the ARVS. FIG. 6 presents equation 3 (eq. 3). Equation 3 may define a mean square ("E[parameter$^2$]" throughout the present disclosure) of the ARVS. FIG. 7 presents equation 4 (eq. 4). Equation 4 may define a variance ("V[parameter]" throughout the present disclosure) of the ARVS.

FIG. 8 presents equations 5-7 (eq. 5, eq. 6, and eq. 7). Equations 5-7 may define a covariance ("Cov[parameter]" throughout the present disclosure) of the ARVS. In FIG. 8 (and other figures below), the variable $p_1$ may represent a first probability of $X_1$ being equal to 1 and $p_2$ may represent a first probability of $X_2$ being equal 1. FIG. 9 presents equation 8 (eq. 8). Equation 8 may define an n-th moment ("E[parameter$^n$]" throughout the present disclosure) of the ARVS.

FIG. 10 presents equation 9 (eq. 9). Equation 9 may define a probability density function of the ARVS. In FIG. 10, $\delta(x)$ is a Dirac's delta function. Some additional details of Dirac's delta function are available at https://en.wikipedia.org/wiki/Dirac_delta_function, which is incorporated herein by reference. In FIG. 10 (and other figures below), the variable x represents a parameter of a probability density function $f_{X_i}(x)$ or other functions.

FIG. 11 presents equation 10 (eq. 10). Equation 10 may define a cumulative density function of the ARVS. In FIG. 11, U(x) represents a unit step function. FIG. 12 presents equation 11 (eq. 11). Equation 11 may define a moment-generating function $M_{X_i}(t)$ of the ARVS. In FIG. 12 (and other figures below), the variable t represents a parameter of a moment-generating function $M_{X_i}(t)$ or other functions. FIG. 13 presents equation 12 (eq. 12). Equation 12 may define a characteristic function $\varphi_{X_i}(t)$ of the ARVS. FIG. 14 presents equation 13 (eq. 13). Equation 13 may define a cumulant-generating function $K_{X_i}(t)$ of the ARVS. FIG. 15 presents a theorem of power of the ARVS. The theorem illustrates that a power of an ARV is statistically equivalent to the ARV itself. FIG. 15 presents equations 14 and 15 (eq. 14 and eq. 15). Equation 14 defines the theorem statement and equation 15 provides the proof of equation 14.

LRVS

As discussed above, the RVS defined and supported in the programming language system 100 may include the LRVS. The LRVS may include a linear sum of one or more ARVS. The LRVS may include a linear sum of a particular number of the ARVS. The LRVS may further include a distribution of up to two raised to the power of the particular number possible values corresponding to zero or one of each of the ARVS.

In some embodiments, the LRVS may be defined. The LRV may be defined according to example LRV expressions:

$$Y_a \equiv \sum_{k=0}^{m} a_k X_k = a_0 X_0 + a_1 X_1 + a_2 X_2 + \cdots + a_m X_m;$$

$a_k \in \mathbb{R}$ (or $\mathbb{C}$);

$m \in \mathbb{N}$; and $p_0 = 1$.

In the LRV expressions, the parameter $Y_a$ represents the LRV. The parameter $X_k$ represents an ARV indexed according to the indexing variable k. The parameter $a_k$ represents a deterministic real or complex value that represents a response to the ARV indexed according to the indexing variable k. An example of the response to the ARV may be $a_k$ of $Y_a$ is the response of $Y_a$ to $X_k$, because $a_k$ is the difference between $Y_a$ with $X_k$ is equal to 1 and $Y_a$ with $X_k$ is equal to 0.

$\mathbb{R}$ represents the set of real numbers. $\mathbb{C}$ represents the set of complex numbers. $\mathbb{N}$ represents the set of natural numbers. The value $a_0 X_0$ is reserved for the constant term with $p_0=1$ such that $X_0$ is equal to 1. The parameter $p_0$ represents the first probability when k is equal to 0. The correlation with other RVS is maintained through common ARVS.

The computer program module 108 may define multiple statistical properties for the LRVS. The statistical properties may enable navigation of a solution space. The statistical properties for the LRVS may include a ground, a mean, a mean square, a variance, an n-th moment, a covariance, and a correlation coefficient. FIGS. 16-22 provide equations that may define the statistical properties of the LRVS in some embodiments. In FIGS. 16-22, the parameters, functions, etc. are as defined above in the LRVS expressions. The equations of FIGS. 16-22 implement standard mathematical nomenclature and functionality, which may be understood by one with skill in the art with the benefit of the present disclosure.

FIG. 16 presents equation 16 (eq. 16). Equation 16 defines a ground (e.g. "$G[Y_a]$") of the LRVS. The ground is a unique or substantially unique statistical attribute of the RVS. The ground may be close to the mean value (described below). For instance, in circumstances in which the probabilities of ARVS are evenly distributed above 0.5 and below 0.5, the ground may be close to the mean value. The ground may be average under a unique assumption to the values of ARVS. The ground may be the value of the RV when the ARVS are either 0 or 1, which may depend on whether its probability is less than or more than 0.5 and the mean value is a value of the RV when all ARVS have their respective mean values. The ground may retrieve information from an entangled state. However, retrieval of the information from the entangled state may lose coherence. The ground may be useful in addition to the mean value and the variance in quantum-inspired computing.

FIG. 17 presents equation 17 (eq. 17). Equation 17 may define a mean of the LRVS. FIG. 18 presents equation 18 (eq. 18). Equation 18 may define a mean square of the LRVS. FIG. 19 presents equation 19 (eq. 19). Equation 19 may define a variance of the LRVS. FIG. 20 presents equation 20 (eq. 20). Equation 20 may define n-th moment of the LRVS. FIG. 21 presents equations 21-23 (eq. 21, eq. 22, and eq. 23). Equations 21-23 define a covariance of the LRVS. FIG. 22 presents equation 24 (eq. 24). Equation 24 may define a correlation coefficient of the LRVS.

QRVS

As discussed above, the RVS defined and supported in the programming language system 100 may include the QRVS. The QRV may be defined according to example QRV expressions:

$$Y_A \equiv \vec{X}^T A \vec{X};$$

$$\vec{X} \equiv [X_0 \ X_1 \ X_2 \cdots X_m]^T;$$

$$A \equiv \begin{bmatrix} a_{0,0} & a_{0,1} & a_{0,2} & \cdots & a_{0,m} \\ a_{1,0} & a_{1,1} & a_{1,2} & \cdots & a_{1,m} \\ a_{2,0} & a_{2,1} & a_{2,2} & \cdots & a_{2,m} \\ \vdots & \vdots & \vdots & \ddots & \vdots \\ a_{m,0} & a_{m,1} & a_{m,2} & \cdots & a_{m,m} \end{bmatrix};$$

$$a_{k,l} \in \mathbb{R} \ (\text{or } \mathbb{C});$$

$$m \in \mathbb{N}; \text{ and}$$

$$p_0 = 1.$$

In the QRV expression, l represents an indexing variable. The parameter $Y_A$ represents the QRV. The parameter $X_k$ represents an ARV indexed according to the indexing variable k. The parameter $a_{k,l}$ represents a deterministic real or complex value that represents a response to the ARV indexed according to the indexing variables k and l. $\mathbb{R}$ represents the set of real numbers. $\mathbb{C}$ represents the set of complex numbers. $\mathbb{N}$ represents the set of natural numbers.

The parameter $a_0 X_0$ is reserved for the constant term with $p_0=1$ such that $X_0$ is equal to 1.

The QRV may be transformed to an equivalent canonical form. In some embodiments, the QRV may be transformed using QRV transform expressions, which are provided in FIG. 23.

The computer program module 108 may define multiple statistical properties for the QRVS. The statistical properties may enable navigation of a solution space. The statistical properties for the QRVS may include a ground, a mean, a mean square, a variance, a covariance, and a correlation coefficient. FIGS. 24-30 provide equations that may apply to the QRVS in some embodiments for one or more of the statistical properties. In FIGS. 24-30, the parameters, functions, etc. are as defined above in the QRVS expressions. The equations of FIGS. 24-30 implement standard mathematical nomenclature and functionality, which may be understood by one with skill in the art with the benefit of the present disclosure.

FIG. 24 presents equation 25 (eq. 25). Equation 25 may define a ground of the QRVS. The ground of the QRVS is similar to the ground described with reference to LRVS. FIG. 25 presents equation 26 (eq. 26). Equation 26 may define a mean of the QRVS. FIG. 26 presents equation 27 (eq. 27). Equation 27 may define a mean square of the QRVS. FIG. 27 presents equation 28 (eq. 28). Equation 28 may define a variance of the QRVS. FIGS. 28A, 28B, and 29 presents equations 29-31 (eq. 29, eq. 30, and eq. 31). Equations 29-31 define the covariance of the QRVS. FIG. 30 presents equation 32 (eq. 32). Equation 32 define a correlation coefficient of the QRVS.

The LRV may be transformed to an equivalent QRV with diagonal coefficient matrix. For example, FIG. 31 presents equations for an example transformation from an LRV to a QRV.

The QRV may be transformed to an approximate LRV by partial assignment of local values to ARVS. For example, FIG. 32 presents equations for an example transformation from a QRV to an LRV. Additionally, FIGS. 33-35B present changes to the equations above after the transformation. For example, FIG. 33 presents changes to the equations of the ground after the transformation. FIG. 34 presents changes to the equations of the mean after the transformation. FIGS. 35A and 35B present changes to the equations of the mean square after the transformation.

HRVS

As discussed above, the RVS defined and supported by the in the programming language system 100 may include the HRVS. The HRV may be defined according to example HRV expressions:

$$Y_A \equiv \sum_{k_1=0}^{m} \sum_{k_2=0}^{m} \cdots \sum_{k_d=0}^{m} a_{k_1,k_2,\cdots,k_d} X_{k_1} X_{k_2} \cdots X_{k_d};$$

$$a_{k_1,k_2,\cdots k_d} \in \mathbb{R} \ (\text{or } \mathbb{C});$$

$$m \in \mathbb{N};$$

$$d \leq m; \text{ and}$$

$$p_0 = 1.$$

In the HRV expressions, the parameter $Y_A$ represents the HRV. The parameter $k_i$ represents an indexing variable. The parameter $X_{k_i}$ represents an ARV indexed according to the indexing variable $k_i$. The parameter $a_{k_1, k_2, \ldots, k_d}$ represents a deterministic real or complex value that represents a response to the ARVS indexed according to the indexing variables $k_1, k_2, \ldots, k_d$. $\mathbb{R}$ represents the set of real numbers. $\mathbb{C}$ represents the set of complex numbers. $\mathbb{N}$ represents the set of natural numbers. The parameter $a_{0, 0, \ldots, 0} X_0 X_0 \ldots X_0$ is reserved for the constant term with $p_0=1$ such that $X_0$ is equal to 1. The parameter d represents the order of the HRV, that also represents the maximum number of ARVS in a single term. In the HRV expressions, if d is equal to 1, the HRV is a LRV and if d is equal to 2, the HRV is a QRV. The parameter m is a total number of ARVS in a program excluding $X_0$ that is equal to 1 with the probability of $p_0=1$. Accordingly, there are m number of ARVS from $X_1$ through $X_m$.

The HRV may be transformed to an equivalent canonical form. For example, the HRV may be transformed according to example HRV transformation expressions. FIG. 36A presents the HRV transformation expressions. FIGS. 36B and 36C present a proof of the HRV transformation expressions. In FIGS. 36A-36C, the parameters, functions, etc. are as defined above in the HRV expressions. In the canonical form, an order of an HRV is less than or equal to m.

The computer program module 108 may define multiple statistical properties for the HRVS. The statistical properties for the HRVS may include a ground, a mean, a mean square, a variance, a covariance, and a correlation coefficient. FIGS. 37-42 provide equations that may apply to the HRVS in some embodiments for one or more of the statistical properties. In FIGS. 37-42, the parameters, functions, etc. are as defined above in the HRVS expressions. The equations of FIGS. 37-42 implement standard mathematical nomenclature and functionality, which may be understood by one with skill in the art with the benefit of the present disclosure.

FIG. 37 presents equation 33 (eq. 33). Equation 33 may define a ground of the HRVS. The ground of the HRVS is similar to the ground described with reference to LRVS. FIG. 38 presents equation 34 (eq. 34). Equation 34 may define a mean of the HRVS. FIG. 39 presents equation 35 (eq. 35). Equation 35 may define a mean square of the HRVS. FIG. 40 presents equation 36 (eq. 36). Equation 36 may define a variance of the HRVS. FIGS. 41A-41C present equations 37-39 (eq. 37, eq. 38, and eq. 39). Equations 37-39 define a covariance of the HRVS. FIG. 42 presents equation 40 (eq. 40). Equation 40 defines a correlation coefficient of the HRVS.

An order of HRVS may be reduced. For example, the order of HRVS may be reduced by assignment of local value. An example reduction of the HRVS is provided in FIGS. 43A-43B. In FIGS. 43A-43B, the parameters, functions, etc. are as defined above in the HRVS expressions. The equations of FIGS. 43A-43B implement standard mathematical nomenclature and functionality, which may be understood by one with skill in the art with the benefit of the present disclosure.

Additionally, FIGS. 44A-48 present changes to the equations above after the reduction. For example, FIGS. 44A-44C present changes to the equations of the ground after the reduction. FIGS. 45A-45D present changes to the equations of the mean after the reduction. FIGS. 45A-45B present the change to the equations. FIGS. 45C-45D present equations clarifying portions of the equations of FIGS. 45A-45B.

FIGS. 46A-46E present changes to the equations of the mean square (e.g., the second moment) after the reduction. FIGS. 46A-46B presents a check of a case in which m=3, d=3, and r=2. FIG. 46C presents changes to the equations of the mean square after the reduction. FIGS. 46D and 46E presents equations clarifying portions of the equations of FIG. 46C. FIG. 47 presents a difference to the mean square due to the reduction.

Linear Operators

The mathematical operations that may be included in the computer instructions 105 and are supported and defined by the computer program module 108 may include an RV addition operation. The mathematical operation includes an RV addition operation of a first RV with a second RV. Execution of the computer instruction produces a third RV that may have a particular indefinite value at a particular definite probability and the particular RV represents a result distribution and tracks response to the one or more ARVS.

In some embodiments, the RV addition operation is defined according to RV addition operation expressions:

$+: Y_A + Y_B \rightarrow Y_C$; such that:

$$Y_A = a_0 + \sum_{k_1=1}^{m} a_{k_1} X_{k_1} + \sum_{k_1=1}^{m-1} \sum_{k_2=k_1+1}^{m} a_{k_1,k_2} X_{k_1} X_{k_2} + \ldots +$$

$$\sum_{k_1=1}^{m-d_A+1} \sum_{k_2=k_1+1}^{m-d_A+2} \sum_{k_3=k_2+1}^{m-d_A+3} \ldots \sum_{k_{d_A}=k_{d_A-1}+1}^{m} a_{k_1,k_2,\ldots,k_{d_A}} X_{k_1} X_{k_2} \ldots X_{k_{d_A}};$$

$$Y_B = b_0 + \sum_{k_1=1}^{m} b_{k_1} X_{k_1} + \sum_{k_1=1}^{m-1} \sum_{k_2=k_1+1}^{m} b_{k_1,k_2} X_{k_1} X_{k_2} + \ldots +$$

$$\sum_{k_1=1}^{m-d_B+1} \sum_{k_2=k_1+1}^{m-d_B+2} \sum_{k_3=k_2+1}^{m-d_B+3} \ldots \sum_{k_{d_B}=k_{d_B-1}+1}^{m} b_{k_1,k_2,\ldots,k_{d_B}} X_{k_1} X_{k_2} \ldots X_{k_{d_B}};$$

$$Y_C \equiv c_0 + \sum_{k_1=1}^{m} c_{k_1} X_{k_1} + \sum_{k_1=1}^{m-1} \sum_{k_2=k_1+1}^{m} c_{k_1,k_2} X_{k_1} X_{k_2} + \ldots +$$

$$\sum_{k_1=1}^{m-d_C+1} \sum_{k_2=k_1+1}^{m-d_C+2} \sum_{k_3=k_2+1}^{m-d_C+3} \ldots \sum_{k_{d_C}=k_{d_C-1}+1}^{m} c_{k_1,k_2,\ldots,k_{d_C}} X_{k_1} X_{k_2} \ldots X_{k_{d_C}};$$

$d_A, d_B \leq m$;

$d_C \equiv \max(d_A, d_B)$;

$a_{k_1,k_2,\ldots,k_{d_A}} \in \mathbb{R}$ (or $\mathbb{C}$);

$b_{k_1,k_2,\ldots,k_{d_B}} \in \mathbb{R}$ (or $\mathbb{C}$);

$m \in \mathbb{N}$;

$c_o \equiv a_0 + b_0$; and $$c_{k_1,k_2,\ldots,k_l} \equiv \begin{cases} a_{k_1,k_2,\ldots,k_l} + b_{k_1,k_2,\ldots,k_l} & \text{for } (1 \leq l \leq d_A) \wedge (1 \leq l \leq d_B) \\ a_{k_1,k_2,\ldots,k_l} & \text{for } (d_B < l \leq d_A) \\ b_{k_1,k_2,\ldots,k_l} & \text{for } (d_A < l \leq d_B) \end{cases}$$

In the RV addition operation, $Y_A$, $Y_B$, and $Y_C$ represents the RVS. The $Y_A$, $Y_B$, and $Y_C$ are high-order random variable (HRV). The parameters $d_A$, $d_B$, and $d_C$ represent the order of $Y_A$, $Y_B$, and $Y_C$, respectively. The parameters $k_1 \ldots k_{d_A}$ represent indexing variables. The parameter $X_{k_i}$ represents an ARV indexed according to the indexing variable $k_i$. The parameters $a_{k_1, k_2, \ldots, k_d}$, $b_{k_1, k_2, \ldots, k_d}$, and $c_{k_1, k_2, \ldots, k_d}$ represent deterministic real or complex values that represents a response to the ARV indexed according to the indexing variables $k_1, k_2, \ldots, k_d$. $\mathbb{R}$ represents the set of real numbers. $\mathbb{C}$ represents the set of complex numbers. $\mathbb{N}$ represents the set of natural numbers. In the RV addition operation "+:" is meant to introduce the expressions.

The RV addition operation presented above is written when $Y_A$ and $Y_B$ are HRVS. In embodiments in which $Y_A$ and $Y_B$ are LRVS, $d_A$ and/or $d_B$ may be equal to one. In embodiments in which $Y_A$ and $Y_B$ are QRVS, $d_A$ and/or $d_B$ may be equal to two. The order of $Y_C$ may be the same as a higher order of $Y_A$ or $Y_B$. Additionally, in the RV addition operation, non-existing coefficients may be treated as being equal to zero.

The mathematical operations that may be included in the computer instructions 105 and are supported and defined by the computer program module 108 may include an RV subtraction operation. The mathematical operation includes the RV subtraction operation of a first RV and a second RV. Execution of the computer instruction produces a third RV that may have a particular indefinite value at a particular definite probability and the particular RV represents a result distribution and tracks responses to the one or more ARVS.

FIG. 48 presents an example RV subtraction operation. In FIG. 48, the parameters, functions, etc. are as defined above in the RV addition operation. The equations of FIG. 48 implement standard mathematical nomenclature and functionality, which may be understood by one with skill in the art with the benefit of the present disclosure. The RV subtraction operation presented in FIG. 48 is written when $Y_A$ and $Y_B$ are HRVS. In embodiments in which $Y_A$ and $Y_B$ are LRVS, $d_A$ and/or $d_B$ may be equal to one. In embodiments in which $Y_A$ and $Y_B$ are QRVS, $d_A$ and/or $d_B$ may be equal to two. The order of $Y_C$ may be the same as a higher order of $Y_A$ or $Y_B$. Additionally, in the RV subtraction operation, non-existing coefficients may be treated as being equal to zero.

The mathematical operations that may be included in the computer instructions 105 and are supported and defined by the computer program module 108 may include an RV scaling operation. The mathematical operation includes the RV scaling operation of an RV and a constant. Execution of the computer instruction produces another RV that may have a particular indefinite value at a particular definite probability and the RV represents a result distribution and tracks response to the one or more ARVS.

FIG. 49 presents an example RV scaling operation. In FIG. 49, the parameters, functions, etc. are as defined above in the RV addition operation. The parameter $b_0$ is the constant. The equations of FIG. 49 implement standard mathematical nomenclature and functionality, which may be understood by one with skill in the art with the benefit of the present disclosure. The RV scaling operation presented in FIG. 49 is written when $Y_A$ is an HRV. In embodiments in which $Y_A$ is an LRVS, $d_A$ may be equal to one. In embodiments in which $Y_A$ is a QRVS, $d_A$ may be equal to two. The order of $Y_C$ may be the same $Y_A$. Division by a constant may be calculated as multiplication with the inverse of the constant.

The mathematical operations that may be included in the computer instructions 105 and are supported and defined by the computer program module 108 may include an RV multiplication operation. For example, the mathematical operation includes an RV multiplication operation that involves two of the RVS. The RV addition operation may be defined according to example RV multiplication operation expressions:

$\times : Y_A + Y_B \rightarrow Y_C$; such that:

$$Y_A = \sum_{k_1=0}^{m} \ldots \sum_{k_\alpha=0}^{m} a_{k_1, \cdots k_\alpha} X_{k_1} \ldots X_{k_\alpha};$$

-continued $$Y_B = \sum_{l_1=0}^{m} \ldots \sum_{l_\beta=0}^{m} b_{l_1, \cdots l_\beta} X_{l_1} \ldots X_{l_\beta};$$

$$Y_C \equiv \sum_{k_1=0}^{m} \ldots \sum_{k_\alpha=0}^{m} \sum_{l_1=0}^{m} \ldots \sum_{l_\beta=0}^{m} c_{k_1, \cdots k_\alpha, l_1, \cdots l_\alpha} X_{k_1} \ldots X_{k_\alpha} X_{l_1} \ldots X_{l_\beta};$$

$c_{k_1, \cdots k_\alpha, l_1, \cdots l_\beta} \equiv a_{k_1, \cdots k_\alpha} b_{l_1, \cdots l_\beta}$; and $m \in \mathbb{N}$.

In the RV multiplication operation expressions, $Y_A$, $Y_B$, and $Y_C$ represent RVS. The $Y_A$, $Y_B$, and $Y_C$ are HRVS. The HRV represented by $Y_A$ is a αth-order HRV. The HRV represented by $Y_B$ is a βth-order HRV. The HRV represented by $Y_C$ is an (α+β)th-order HRV. The parameters $k_1 \ldots k_\alpha$ and $l_1 \ldots l_\beta$ represent indexing variables. The parameters $X_{k_i}$ and $X_{l_j}$ represents ARVS indexed according to the indexing variables $k_i$ and $l_j$. The parameters $a_{k_1, \ldots, k_\alpha}$, $b_{l_1, \ldots, l_\beta}$, and $c_{k_1, \ldots, k_\alpha, l_1, \ldots, l_\beta}$ represent deterministic real or complex values that represents a response to the ARVS indexed according to the indexing variables $k_1, \ldots, k_\alpha$ and $l_1, \ldots, l_\beta$ and $k_1, \ldots, k_\alpha, l_1, \ldots, l_\beta$. $\mathbb{R}$ represents the set of real numbers. $\mathbb{C}$ represents the set of complex numbers. $\mathbb{N}$ represents the set of natural numbers.

One or more of the HRV in the RV multiplication operation expressions may be reduced to the canonical form according to the equations presented in FIGS. 36A-36C. After the reduction to the canonical form, the order of the HRV represented by $Y_C$ may be less than m. In addition, one or more of the HRV in the RV multiplication operation expressions may be reduced to lower order RVS using equations related to the local value assignment presented in FIGS. 43A-43B.

In addition to the RV multiplication operation that involves the HRVS, the mathematical operations that may be included in the computer instructions 105 and are supported and defined by the computer program module 108 may include an RV multiplication operation that involve LRVS and QRVS. FIG. 50 presents RV multiplication operations that involve LRVS. FIG. 51 presents RV multiplication operations that involve QRVS.

In FIGS. 50-51, the parameters, functions, etc. are as defined above in the RV multiplication operations for the HRVS. The equations of FIGS. 50-51 implement standard mathematical nomenclature and functionality, which may be understood by one with skill in the art with the benefit of the present disclosure. In the RV multiplication operations for the LRVS of FIG. 50, a product of two LRVS becomes a QRV. In the RV multiplication operations for the QRVS of FIG. 51, a product of two QRVS becomes a fourth order HRV.

Conditional Random Variables with Respect to ARV

CRVS may be defined and supported by the computer program module 108. The CRVS may be defined with respect to ARVS. The computer program module 108 may define CRVS for the LRVS, CRVS for the QRVS, and CRVS for the HRVS. FIG. 52 presents a definition for the CRVS for the LRVS. FIG. 53 presents a definition for the CRVS for the QRVS. FIG. 54 presents a definition for the CRVS for the HRVS. The parameters, functions, etc. of FIG. 52 are as defined above in the LRV expressions. The parameters, functions, etc. of FIG. 53 are as defined above in the QRV expressions. The parameters, functions, etc. of FIG. 53 are as defined above in the HRV expressions. The equations of FIGS. 52-53 implement standard mathematical nomenclature and functionality, which may be understood by one with skill in the art with the benefit of the present disclosure.

Derivative Operator

The mathematical operations that may be included in the computer instructions 105 and are supported and defined by the computer program module 108 may include an RV derivative operation. The RV derivative operation is defined according to RV derivative operation expressions:

$$\frac{d}{dS_x} : \frac{d}{dS_x} Y_A \rightarrow Y_B;$$

such that:

$$Y_B \equiv (Y_A | X_i = 1 \text{ for } \forall i \in S_X) - (Y_A | X_i = 0 \text{ for } \forall i \in S_X).$$

In the RV derivative operation expressions, $Y_A$ and $Y_B$ represents RVS. The operator $\forall$ represents a "for all" operator. The operator | represents a "such that" operator.

The computer program module 108 may define RV derivative operations for the LRVS, the QRVS, and the HRVS. FIGS. 55A and 55B present a definition for RV derivative operations for the LRVS. FIGS. 56A and 56B present a definition for RV derivative operations for the QRVS. FIGS. 57A and 57B present a definition for RV derivative operations for the HRVS. The parameters, functions, etc. of FIGS. 55A and 55B are as defined above in the LRV expressions and the RV derivative operation expressions. The parameters, functions, etc. of FIGS. 56A and 56B are as defined above in the QRV expressions and the RV derivative operation expressions. The parameters, functions, etc. of FIGS. 57A and 57B are as defined above in the HRV expressions and the RV derivative operation expressions. The equations of FIGS. 55A-57B implement standard mathematical nomenclature and functionality, which may be understood by one with skill in the art with the benefit of the present disclosure.

The computer program module 108 may define multiple statistical properties for the RV derivatives. The statistical properties for the RV derivatives may include a ground, an LRV mean, a QRV mean, an HRV mean, an LRV variance, a QRV variance, an HRV variance, an LRV covariance, and a QRV covariance. FIGS. 58A-66C provide equations that may apply to the RV derivative for one or more of the statistical properties. In FIGS. 58A-66C, the parameters, functions, etc. are as defined above in the LRV expressions, the HRV expressions, the QRV expressions, and the RV derivative operation expressions. The equations of FIGS. 58A-66C implement standard mathematical nomenclature and functionality, which may be understood by one with skill in the art with the benefit of the present disclosure.

FIG. 58A presents an example expression that may define an LRV ground of the RV derivatives. FIG. 58B presents an example expression that may define a QRV ground of the RV derivatives. FIG. 58C presents an example expression that may define an HRV ground of the RV derivatives. FIG. 59 presents an example expression that may define an LRV mean of the RV derivatives. FIG. 60 presents example expressions that define a QRV mean of the RV derivatives. FIG. 61 presents example expressions that define an HRV mean of the RV derivatives. FIG. 62 presents an example expression that may define an LRV variance of the RV derivatives. FIGS. 63A and 63B present example expressions that define a QRV variance of the RV derivatives. FIGS. 64A-64D present example expressions that define an HRV variance of the RV derivatives. FIG. 65 presents an example expression that may define an LRV covariance of the RV derivatives. FIG. 66C presents example expressions that may define a QRV covariance of the RV derivatives.

Entropy may be approximated for each of the ARV, the LRV, the QRV, and the HRV. For instance, FIG. 67 presents an example expression that may be used to approximate entropy of the ARV. FIGS. 68A-68C present an example expression for entropy of the LRV. FIGS. 69A-69C present an example expression for entropy of the QRV; and FIGS. 70A-70C present an example expression for entropy of the HRV. In FIGS. 68A-70C, $\hat{S}[Y_A]$ represents an alternative expression for entropy of the LRV, the QRV, and the HRV, respectively.

In FIGS. 68A-70C represent only example entropy expressions for the ARV, the LRV, the QRV, and the HRV. In some embodiments, some other expressions may be used to define the entropy. For instance, in some embodiments, one or more weight coefficients (e.g., $a_k^2$ and $\xi_k^2$) of entropy may be inverted. Additionally or alternatively, in some expressions some or all of the weight coefficients may be equal to one. Use of the entropy may be advantageous for global optimization, because it is a convex function.

Modifications, additions, or omissions may be made to the programming language system 100 without departing from the scope of the present disclosure. For example, the present disclosure applies to a programming language system 100 that may include one or more client devices 102, one or more server devices 106, one or more networks 104, just the client device 102 and/or the server device 106 (e.g., without the network 104 and the server device 106), or any combination thereof.

Moreover, the separation of various components in the embodiments described herein is not meant to indicate that the separation occurs in all embodiments. It may be understood with the benefit of this disclosure that the described components may be integrated together in a single component or separated into multiple components. For example, the computer program module 108 and the application module 107 may be integrated into a single module.

Figure 2:
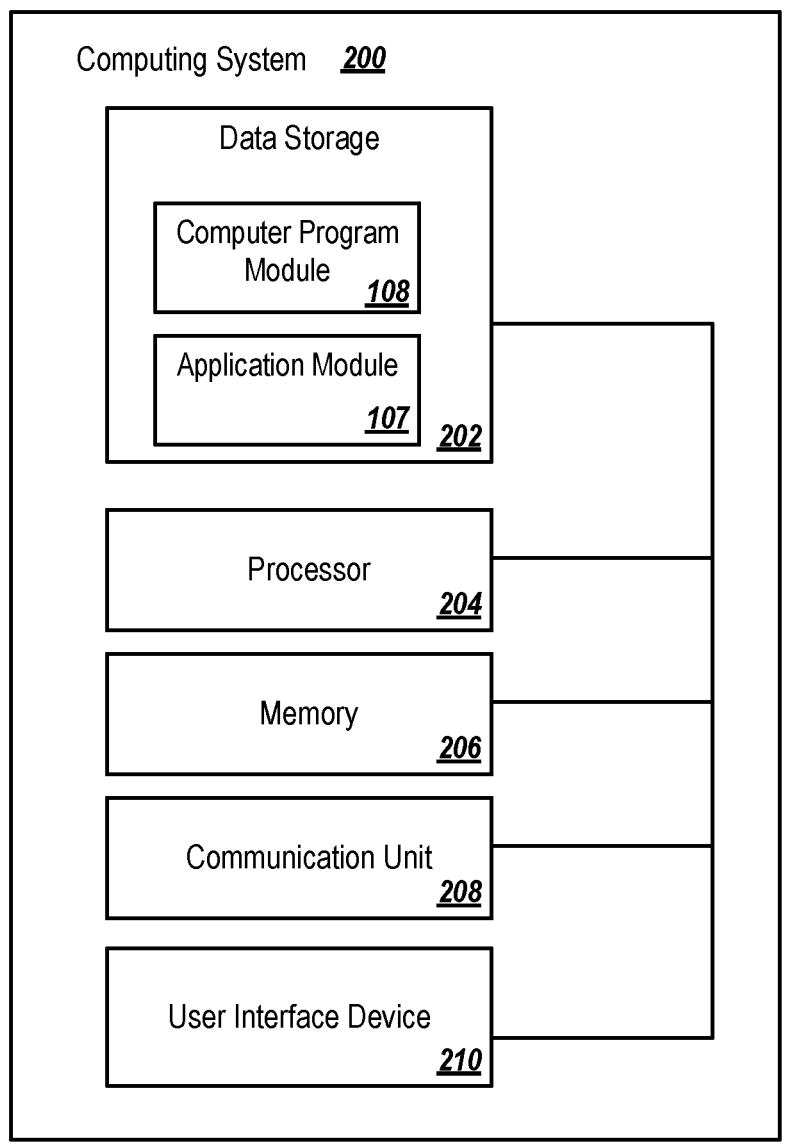
FIG. 2 illustrates an example computing system configured for quantum-inspired computing in the programming language system of FIG. 1.

FIG. 2 illustrates an example computing system 200 configured for quantum-inspired computing in a programming language system. The computing system 200 may be implemented in the programming language system 100 of FIG. 1, for instance. Examples of the computing system 200 may include the server device 106 and/or the client device 102. The computing system 200 may include one or more processors 204, a memory 206, a communication unit 208, a user interface device 210, and a data storage 202 that includes the computer program module 108 and/or the application module 107 (collectively, modules 108/107).

The processor 204 may include any suitable special-purpose or general-purpose computer, computing entity, or processing device including various computer hardware or software modules and may be configured to execute instructions stored on any applicable computer-readable storage media. For example, the processor 204 may include a microprocessor, a microcontroller, a digital signal processor (DSP), an ASIC, an FPGA, or any other digital or analog circuitry configured to interpret and/or to execute program instructions and/or to process data.

Although illustrated as a single processor in FIG. 2, the processor 204 may more generally include any number of processors configured to perform individually or collectively any number of operations described in the present disclosure. Additionally, one or more of the processors 204 may be present on one or more different electronic devices or computing systems. In some embodiments, the processor 204 may interpret and/or execute program instructions and/or process data stored in the memory 206, the data storage 202, or the memory 206 and the data storage 202. In some embodiments, the processor 204 may fetch program instructions from the data storage 202 and load the program instructions in the memory 206. After the program instructions are loaded into the memory 206, the processor 204 may execute the program instructions.

The memory 206 and the data storage 202 may include computer-readable storage media for carrying or having computer-executable instructions or data structures stored thereon. Such computer-readable storage media may include any available media that may be accessed by a general-purpose or special-purpose computer, such as the processor 204. By way of example, and not limitation, such computer-readable storage media may include tangible or non-transitory computer-readable storage media including RAM, ROM, EEPROM, CD-ROM or other optical disk storage, magnetic disk storage or other magnetic storage devices, flash memory devices (e.g., solid state memory devices), or any other storage medium which may be used to carry or store desired program code in the form of computer-executable instructions or data structures and that may be accessed by a general-purpose or special-purpose computer. Combinations of the above may also be included within the scope of computer-readable storage media. Computer-executable instructions may include, for example, instructions and data configured to cause the processor 204 to perform a certain operation or group of operations.

The communication unit 208 may include one or more pieces of hardware configured to receive and send communications. In some embodiments, the communication unit 208 may include one or more of an antenna, a wired port, and modulation/demodulation hardware, among other communication hardware devices. In particular, the communication unit 208 may be configured to receive a communication from outside the computing system 200 and to present the communication to the processor 204 or to send a communication from the processor 204 to another device or network (e.g., 104 of FIG. 1).

The user interface device 210 may include one or more pieces of hardware configured to receive input from and/or provide output to a user. In some embodiments, the user interface device 210 may include one or more of a speaker, a microphone, a display, a keyboard, a touch screen, or a holographic projection, among other hardware devices.

The modules 108/107 may include program instructions stored in the data storage 202. The processor 204 may be configured to load the modules 108/107 into the memory 206 and execute the modules 108/107. Alternatively, the processor 204 may execute the modules 108/107 line-by-line from the data storage 202 without loading them into the memory 206. When executing the modules 108/107, the processor 204 may be configured to perform a participation verification process as described elsewhere in this disclosure.

Modifications, additions, or omissions may be made to the computing system 200 without departing from the scope of the present disclosure. For example, in some embodiments, the computing system 200 may not include the user interface device 210. In some embodiments, the different components of the computing system 200 may be physically separate and may be communicatively coupled via any suitable mechanism. For example, the data storage 202 may be part of a storage device that is separate from a server, which includes the processor 204, the memory 206, and the communication unit 208, that is communicatively coupled to the storage device.

Figure 3:
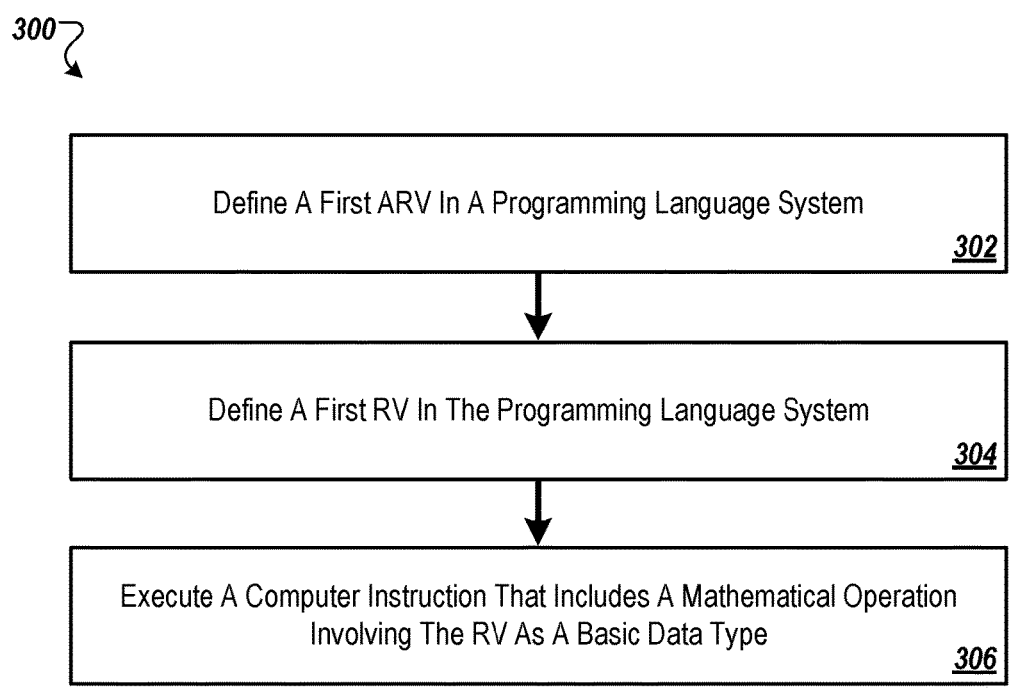
FIG. 3 is a flow diagram of an example method of quantum-inspired computing.

FIG. 3 is a flow diagram of an example method 300 of quantum-inspired computing, arranged in accordance with at least one embodiment described herein. The method 300 may be performed in a programming language system such as the programming language system 100 of FIG. 1. The method 300 may be performed in some embodiments by the client device 102, the server device 106, the computer program module 108, the application module 107, or another computer system 200 described with reference to FIGS. 1 and 2.

In some embodiments, the client device 102 and/or the server device 106 or another computing system may include or may be communicatively coupled to a non-transitory computer-readable medium (e.g., the memory 206 of FIG. 2) having stored thereon programming code or instructions that are executable by one or more processors (such as the processor 204 of FIG. 2) to cause a computing system and/or the client device 102 and/or the server device 106 to perform or control performance of the method 300. Additionally or alternatively, the client device 102 and/or the server device 106 may include the processor 204 described elsewhere in this disclosure that is configured to execute computer instructions to cause the client device 102 and/or the server device 106 or another computing system to perform or control performance of the method 300. Although illustrated as discrete blocks, various blocks in FIG. 3 may be divided into additional blocks, combined into fewer blocks, or eliminated, depending on the desired implementation.

The method 300 may begin at block 302 in which a first ARV may be defined in a programming language system. The first ARV may have a non-deterministic value of either zero or one. The first ARV may have a first probability of having a value of one. The first ARV may have a second probability of having a value of zero. A sum of the first probability and the second probability may be one. A covariance of the first ARV and a second ARV may be zero.

In some embodiments, a mean the first ARV may be equal to the first probability. A mean square of the first ARV may be equal to the first probability. An n-th moment of the first ARV may be equal to the first probability for all values of n. A variance of the first ARV is equal to a product of the first probability and the second probability. An m-th power of the first ARV equal to the first ARV for all values of m. In these and other embodiments, the first ARV may be defined according to ARV expressions provided elsewhere in this disclosure.

At block 304, a first RV may be defined in the programming language system. The first RV may have a first indefinite value at a first definite probability and may include a polynomial of one or more atomic random variables (ARVS) that includes the first ARV.

In some embodiments, the first random variable is an LRV. The LRV may include a linear sum of a particular number of the one or more ARVS and a distribution of up to two raised to the power of the particular number possible values that correspond to zero or 1 of each of the ARVS. In these and other embodiments, the LRV may be defined according to the LRV expressions provided elsewhere in this disclosure. In some embodiments, the first random variable may be a QRV. In these and other embodiments, the QRV may be defined according to the QRV expressions provided elsewhere in this disclosure. In some embodiments, the first random variable may be an HRV. In these and other embodiments, the HRV may be defined according to the HRV expressions provided elsewhere in this disclosure.

At block 306, a computer instruction may be executed that includes a mathematical operation that involves the RV as a basic data type. Execution of the computer instruction may produce a second RV that has a second indefinite value at a second definite probability and the second RV represents a result distribution and tracks responses to the one or more ARVS.

In some embodiments, the mathematical operation may include an RV addition operation of the first RV with a third RV. In these and other embodiments, the RV addition operation may be defined according to RV addition operation expressions provided elsewhere in this disclosure. In some embodiments, the mathematical operation may include an RV multiplication operation of the first RV with a third RV. In these and other embodiments, the RV multiplication operation may be defined according to RV multiplication operation expressions provided elsewhere in this disclosure. In some embodiments, the mathematical operation includes an RV derivative operation of the first RV. In these and other embodiments, the RV derivative operation may be defined according to RV derivative operation expressions provided elsewhere in this disclosure.

In some embodiments, the computer instruction may be included in an application implemented as a quantum simulation for a drug design application, a quantum simulation for a material design application, a combinatory optimization for a place and a route in computer aided design (CAD), a statistical eye simulation of signal integrity analysis for high-speed signal transmission, or a statistical static timing analysis for CAD which explorer the solution space.

One skilled in the art will appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments.

The embodiments described herein may include the use of a special-purpose or general-purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general-purpose or special-purpose computer. By way of example, and not limitation, such computer-readable media may include tangible or non-transitory computer-readable storage media including RAM, ROM, EEPROM, CD-ROM or other optical disk storage, magnetic disk storage or other magnetic storage devices, or any other non-transitory storage medium which may be used to carry or store desired program code in the form of computer-executable instructions or data structures and which may be accessed by a general-purpose or special-purpose computer. Combinations of the above may also be included within the scope of computer-readable media.

Computer-executable instructions comprise, for example, instructions and data, which cause a general-purpose computer, special-purpose computer, or special-purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modules running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present invention have been described in detail, it should be understood that the various changes, substitutions, and alterations could be made hereto without departing from the spirit and scope of the invention.

What is claimed is:

1. A method of quantum-inspired computing, the method comprising:

defining a first atomic random variable (ARV) in a programming language system, the first ARV having a non-deterministic value of either zero or one, a first probability of having a value of one, and a second probability of having a value of zero; a sum of the first probability and the second probability is one; and a covariance of the first ARV and a second ARV is zero;

defining a first random variable (RV) in the programming language system, the first RV having a first indefinite value at a first definite probability and includes a polynomial of one or more atomic random variables (ARVS) that includes the first ARV; and executing a computer instruction that includes a mathematical operation involving the first RV as a basic data type, the executing producing a second RV that has a second indefinite value at a second definite probability, represents a result distribution, and tracks a response to the one or more ARVS.

2. The method of claim 1, wherein:

a mean of the first ARV is equal to the first probability;

a mean square of the first ARV is equal to the first probability;

an n-th moment of the first ARV is equal to the first probability for all values of n;

a variance of the first ARV is equal to a product of the first probability and the second probability; and an m-th power of the first ARV is equal to the first ARV for all values of m.

3. The method of claim 1, wherein the first ARV is defined according to ARV expressions:

$X_i \in \{0,1\}$;

$0 \le p_i \le 1$;

$\Pr[X_i=1]=p_i$;

$\Pr[X_i=0]=1-p_i$; and $\mathrm{Cov}(X_i, X_k)=0$ for $i \ne k$; in which:

i and k represent indexing variables;

$p_i$ represents a first probability indexed according to the indexing variable i;

$X_i$ represents an ARV indexed according to the indexing variable i;

$X_k$ represents an ARV indexed according to the indexing variable k;

Pr[ ] represents a probability function; and

Cov( ) represents a covariance function.

4. The method of claim 3, wherein entropy of the ARV is approximated according to an approximate entropy expression:

$$S[X_i] \simeq \log 2 - 2q_i^2;$$ in which:

$S[X_i]$ represents the entropy, $q_i$ represents $p_i - \frac{1}{2}$, and log 2 represents a natural log of 2 base Napier's constant (e).

5. The method of claim 3, wherein:

the first random variable is a quadratic random variable (QRV); and the QRV is defined according to the QRV expressions:

$$Y_A \equiv \vec{X}^T A \vec{X};$$

$$\vec{X} \equiv [X_0 \; X_1 \; X_2 \cdots X_m]^T;$$

$$A \equiv \begin{bmatrix} a_{0,0} & a_{0,1} & a_{0,2} & \cdots & a_{0,m} \\ a_{1,0} & a_{1,1} & a_{1,2} & \cdots & a_{1,m} \\ a_{2,0} & a_{2,1} & a_{2,2} & \cdots & a_{2,m} \\ \vdots & \vdots & \vdots & \ddots & \vdots \\ a_{m,0} & a_{m,1} & a_{m,2} & \cdots & a_{m,m} \end{bmatrix};$$

$a_{k,l} \in \mathbb{R}$ (or $\mathbb{C}$);

$m \in \mathbb{N}$; and $p_0 = 1$;

in which:

l represents an indexing variable;

$Y_A$ represents the QRV;

$X_k$ represents an ARV indexed according to the indexing variable k;

$a_{k,l}$ represents a deterministic real or complex value that represents a response to the ARVS indexed according to the indexing variables k and l;

$\mathbb{R}$ represents the set of real numbers;

$\mathbb{C}$ represents the set of complex numbers;

$\mathbb{N}$ represents the set of natural numbers; and $X_0 a_{0,0} X_0$ is reserved for a constant term with $p_0 = 1$ such that $X_0$ is equal to 1.

6. The method of claim 3, wherein:

the first random variable is a high-order random variable (HRV); and the HRV is defined according to HRV expressions:

$$Y_A \equiv \sum_{k_1=0}^{m} \sum_{k_2=0}^{m} \cdots \sum_{k_d=0}^{m} a_{k_1,k_2,\cdots,k_d} X_{k_1} X_{k_2} \cdots X_{k_d};$$

$a_{k_1,k_2,\cdots,k_d} \in \mathbb{R}$ (or $\mathbb{C}$);

$m \in \mathbb{N}$;

$d \leq m$; and $p_0 = 1$;

in which:

$Y_A$ represents the HRV;

k and d represent indexing variables;

$X_{k_i}$ represents an ARV indexed according to the indexing variable $k_i$;

$a_{k_1, k_2, \ldots, k_d}$ represents a deterministic real or complex value that represents a response to the ARVS indexed according to the indexing variables $k_1, k_2, \ldots, k_d$;

$\mathbb{R}$ represents the set of real numbers;

$\mathbb{C}$ represents the set of complex numbers;

$\mathbb{N}$ represents the set of natural numbers; and $a_{0, 0, \ldots, 0} X_0 X_0 \cdots X_0$ is reserved for the constant term with $p_0 = 1$ such that $X_0$ is equal to 1.

7. The method of claim 1, wherein:

the mathematical operation includes an RV addition operation of the first RV with a third RV; and the RV addition operation is defined according to RV addition operation expressions:

$+: Y_A + Y_B \rightarrow Y_C;$ such that:

$$Y_A \equiv a_0 + \sum_{k_1=1}^{m} a_{k_1} X_{k_1} + \sum_{k_1=1}^{m-1} \sum_{k_2=k_1+1}^{m} a_{k_1,k_2} X_{k_1} X_{k_2} + \ldots +$$

$$\sum_{k_1=1}^{m-d_A+1} \sum_{k_2=k_1+1}^{m-d_A+2} \sum_{k_3=k_2+1}^{m-d_A+3} \cdots \sum_{k_{d_A}=k_{d_A-1}+1}^{m} a_{k_1,k_2,\cdots,k_{d_A}} X_{k_1} X_{k_2} \cdots X_{k_{d_A}};$$

$$Y_B \equiv b_0 + \sum_{k_1=1}^{m} b_{k_1} X_{k_1} + \sum_{k_1=1}^{m-1} \sum_{k_2=k_1+1}^{m} b_{k_1,k_2} X_{k_1} X_{k_2} + \ldots +$$

$$\sum_{k_1=1}^{m-d_B+1} \sum_{k_2=k_1+1}^{m-d_B+2} \sum_{k_3=k_2+1}^{m-d_B+3} \cdots \sum_{k_{d_B}=k_{d_B-1}+1}^{m} b_{k_1,k_2,\cdots,k_{d_B}} X_{k_1} X_{k_2} \cdots X_{k_{d_B}};$$

$$Y_C \equiv c_0 + \sum_{k_1=1}^{m} c_{k_1} X_{k_1} + \sum_{k_1=1}^{m-1} \sum_{k_2=k_1+1}^{m} c_{k_1,k_2} X_{k_1} X_{k_2} + \ldots +$$

$$\sum_{k_1=1}^{m-d_C+1} \sum_{k_2=k_1+1}^{m-d_C+2} \sum_{k_3=k_2+1}^{m-d_C+3} \cdots \sum_{k_{d_C}=k_{d_C-1}+1}^{m} c_{k_1,k_2,\cdots,k_{d_C}} X_{k_1} X_{k_2} \cdots X_{k_{d_C}};$$

$d_A, d_B \leq m;$ $d_C \equiv \max(d_A, d_B);$ $a_{k_1,k_2,\cdots,k_{d_A}} \in \mathbb{R}$ (or $\mathbb{C}$);

$b_{k_1,k_2,\cdots,k_{d_B}} \in \mathbb{R}$ (or $\mathbb{C}$);

$m \in \mathbb{N}$;

$c_o \equiv a_0 + b_0$; and $$c_{k_1,k_2\cdots k_l} \equiv \begin{cases} a_{k_1,k_2\cdots k_l} + b_{k_1,k_2\cdots k_l} & \text{for } (1 \leq l \leq d_A) \land (1 \leq l \leq d_B) \\ a_{k_1,k_2\cdots k_l} & \text{for } (d_B < l \leq d_A) \\ b_{k_1,k_2\cdots k_l} & \text{for } (d_A < l \leq d_B) \end{cases};$$

in which:

$Y_A$, $Y_B$, and $Y_C$ represents the first RV, the third RV, and the second RV, respectively;

the $Y_A$, $Y_B$, and $Y_C$ are high-order random variable (HRV);

$k_i$ represents an indexing variable;

$X_{k_i}$ represents an ARV indexed according to the indexing variable $k_i$;

$a_{k_1, k_2, \ldots, k_l}$, $b_{k_1, k_2, \ldots, k_l}$, and $c_{k_1, k_2, \ldots, k_l}$ represent deterministic real or complex values that represents a response to the ARVS indexed according to the indexing variables $k_1 \ldots k_l$;

$\mathbb{R}$ represents the set of real numbers;

$\mathbb{C}$ represents the set of complex numbers; and $\mathbb{N}$ represents the set of natural numbers.

8. The method of claim 1, wherein:
the mathematical operation includes an RV multiplication operation of the first RV with a third RV; and
the RV multiplication operation is defined according to RV multiplication operation expressions:

$\times: Y_A + Y_B \to Y_C$; such that:

$$Y_A = \sum_{k_1=0}^{m} \cdots \sum_{k_\alpha=0}^{m} a_{k_1,\cdots,k_\alpha} X_{k_1} \ldots X_{k_\alpha};$$

$$Y_B = \sum_{l_1=0}^{m} \cdots \sum_{l_\beta=0}^{m} b_{l_1,\cdots,l_\beta} X_{l_1} \ldots X_{l_\beta};$$

$$Y_C \equiv$$

$$\sum_{k_1=0}^{m} \cdots \sum_{k_\alpha=0}^{m} \sum_{l_1=0}^{m} \cdots \sum_{l_\beta=0}^{m} c_{k_1,\cdots,k_\alpha,l_1,\cdots,l_\alpha} X_{k_1} \ldots X_{k_\alpha} X_{l_1} \ldots X_{l_\beta};$$

$c_{k_1,\cdots,k_\alpha,l_1,\cdots,l_\alpha} \equiv a_{k_1,\cdots,k_\alpha} b_{l_1,\cdots,l_\beta}$; and $m \in \mathbb{N}$;

in which:
$Y_A, Y_B,$ and $Y_C$ represents the first RV, the third RV, and the second RV, respectively;
the $Y_A, Y_B,$ and $Y_C$ are high-order random variables (HRV);
the $Y_A$ is an αth-order HRV;
the $Y_B$ is an βth-order HRV;
the $Y_C$ is an (α-β)th-order HRV;
$k_1 \ldots k_\alpha$ and $l_1 \ldots l_\beta$ represent indexing variables;
$X_{k_i}$ represents an ARV indexed according to the indexing variables $k_i$;
$X_{l_i}$ represents an ARV indexed according to the indexing variables $l_i$;
$a_{k_1,\ldots,k_\alpha}, b_{l_1,\ldots,l_\beta},$ and $c_{k_1,\ldots,k_\alpha,l_1,\ldots,l_\beta}$ represent deterministic real or complex values that represent a response to the ARV indexed according to the indexing variables $k_1 \ldots k_\alpha$ and $l_1 \ldots l_\beta$;
$\mathbb{R}$ represents the set of real numbers;
$\mathbb{C}$ represents the set of complex numbers; and
$\mathbb{N}$ represents the set of natural numbers.
9. The method of claim 1, wherein:
the mathematical operation includes an RV derivative operation of the first RV; and
the RV derivative operation is defined according to RV derivative operation expressions:

$$\frac{d}{dS_x}: \frac{d}{dS_x} Y_A \to Y_B;$$

such that:

$Y_B \equiv (Y_A | X_i = 1 \text{ for } \forall i \in S_X) - (Y_A | X_i = 0 \text{ for } \forall i \in S_X)$; in which:

$Y_A$ and $Y_B$ represents the first RV and the second RV, respectively;
∀ represents a "for all" operator; and
| represents a "such that" operator.
10. The method of claim 1, wherein the computer instruction is included in an application implemented as:
a quantum simulation for a drug design application;
a quantum simulation for a material design application;
a combinatory optimization for a place and a route in computer aided design (CAD);
a statistical eye simulation of signal integrity analysis for high-speed signal transmission, or
a statistical static timing analysis for CAD which explores the solution space.
11. A non-transitory computer-readable medium having encoded therein programming code executable by one or more processors to perform operations comprising:
defining a first atomic random variable (ARV) in a programming language system, the first ARV having a non-deterministic value of either zero or one, a first probability of having a value of one, and a second probability of having a value of zero; a sum of the first probability and the second probability is one; and a covariance of the first ARV and a second ARV is zero;
defining a first random variable (RV) in the programming language system, the first RV having a first indefinite value at a first definite probability and includes a polynomial of one or more atomic random variables (ARVS) that includes the first ARV; and
executing a computer instruction that includes a mathematical operation involving the first RV as a basic data type, the executing producing a second RV that has a second indefinite value at a second definite probability, represents a result distribution, and tracks a response to the one or more ARVS.
12. The non-transitory computer-readable medium of claim 11, wherein:
a mean of the first ARV is equal to the first probability;
a mean square of the first ARV is equal to the first probability;
an n-th moment of the first ARV is equal to the first probability for all values of n;
a variance of the first ARV is equal to a product of the first probability and the second probability; and
an m-th power of the first ARV is equal to the first ARV for all values of m.
13. The non-transitory computer-readable medium of claim 11, wherein the first ARV is defined according to ARV expressions:

$X_i \in \{0,1\}$;

$0 \leq p_i \leq 1$;

$\Pr[X_i=1]=p_i$;

$\Pr[X_i=0]=1-p_i$; and $\text{Cov}(X_i, X_k)=0$ for $i \neq k$; in which:

i and k represent indexing variables;
$p_i$ represents a first probability indexed according to the indexing variable i;
$X_i$ represents an ARV indexed according to the indexing variable i;
$X_k$ represents an ARV indexed according to the indexing variable k;
Pr[ ] represents a probability function; and
Cov( ) represents a covariance function.
14. The non-transitory computer-readable medium of claim 13, wherein entropy of the ARV is approximated according to an approximate entropy expression:

$S[X_i] \approx \log 2 - 2q_i^2$; in which:

$S[X_i]$ represents the entropy,
$q_i$ represents $p_i - \frac{1}{2}$, and
log 2 represents a natural log of 2 base Napier's constant (e).

15. The non-transitory computer-readable medium of claim 13, wherein:
the first random variable is a quadratic random variable (QRV); and
the QRV is defined according to the QRV expressions:

$$Y_A \equiv \vec{X}^T A \vec{X};$$

$$\vec{X} \equiv [X_0 \ X_1 \ X_2 \cdots X_m]^T;$$

$$A \equiv \begin{bmatrix} a_{0,0} & a_{0,1} & a_{0,2} & \ldots & a_{0,m} \\ a_{1,0} & a_{1,1} & a_{1,2} & \ldots & a_{1,m} \\ a_{2,0} & a_{2,1} & a_{2,2} & \ldots & a_{2,m} \\ \vdots & \vdots & \vdots & \ddots & \vdots \\ a_{m,0} & a_{m,1} & a_{m,2} & \ldots & a_{m,m} \end{bmatrix};$$

$a_{k,l} \in \mathbb{R}$ (or $\mathbb{C}$);

$m \in \mathbb{N}$; and $p_0 = 1$;

in which:
l represents an indexing variable;
$Y_A$ represents the QRV;
$X_k$ represents an ARV indexed according to the indexing variable k;
$a_{k,l}$ represents a deterministic real or complex value that represents a response to the ARVS indexed according to the indexing variables k;
$\mathbb{R}$ represents the set of real numbers;
$\mathbb{C}$ represents the set of complex numbers;
$\mathbb{N}$ represents the set of natural numbers; and
$X_0 a_{0,0} X_0$ is reserved for a constant term with $p_0=1$ such that $X_0$ is equal to 1.

16. The non-transitory computer-readable medium of claim 13, wherein:
the first random variable is a high-order random variable (HRV); and
the HRV is defined according to HRV expressions:

$$Y_A \equiv \sum_{k_1=0}^{m} \sum_{k_2=0}^{m} \cdots \sum_{k_d=0}^{m} a_{k_1, k_2, \cdots, k_d} X_{k_1} X_{k_2} \ldots X_{k_d};$$

$a_{k_1, k_2, \cdots, k_d} \in \mathbb{R}$ (or $\mathbb{C}$);

$m \in \mathbb{N}$;

$d \leq m$; and $p_0 = 1$;

in which:
$Y_A$ represents the HRV;
k and d represent indexing variables;
$X_{k_i}$ represents an ARV indexed according to the indexing variable $k_i$;
$a_{k_1, k_2, \ldots, k_d}$ represents a deterministic real or complex value that represents a response to the ARVS indexed according to the indexing variables $k_1, k_2, \ldots, k_d$;
$\mathbb{R}$ represents the set of real numbers;
$\mathbb{C}$ represents the set of complex numbers;
$\mathbb{N}$ represents the set of natural numbers; and
$a_{0, 0, \ldots, 0} X_0 X_0 \ldots X_0$ is reserved for the constant term with $p_0=1$ such that $X_0$ is equal to 1.

17. The non-transitory computer-readable medium of claim 11, wherein:
the mathematical operation includes an RV addition operation of the first RV with a third RV; and
the RV addition operation is defined according to RV addition operation expressions:

$+: Y_A + Y_B \to Y_C$; such that:

$$Y_A = a_0 + \sum_{k_1=1}^{m} a_{k_1} X_{k_1} + \sum_{k_1=1}^{m-1} \sum_{k_2=k_1+1}^{m} a_{k_1,k_2} X_{k_1} X_{k_2} + \ldots +$$

$$\sum_{k_1=1}^{m-d_A+1} \sum_{k_2=k_1+1}^{m-d_A+2} \sum_{k_3=k_2+1}^{m-d_A+3} \cdots \sum_{k_{d_A}=k_{d_A-1}+1}^{m} a_{k_1,k_2,\cdots,k_{d_A}} X_{k_1} X_{k_2} \ldots X_{k_{d_A}};$$

$$Y_B = b_0 + \sum_{k_1=1}^{m} b_{k_1} X_{k_1} + \sum_{k_1=1}^{m-1} \sum_{k_2=k_1+1}^{m} b_{k_1,k_2} X_{k_1} X_{k_2} + \ldots +$$

$$\sum_{k_1=1}^{m-d_B+1} \sum_{k_2=k_1+1}^{m-d_B+2} \sum_{k_3=k_2+1}^{m-d_B+3} \cdots \sum_{k_{d_B}=k_{d_B-1}+1}^{m} b_{k_1,k_2,\cdots,k_{d_B}} X_{k_1} X_{k_2} \ldots X_{k_{d_B}};$$

$$Y_C \equiv c_0 + \sum_{k_1=1}^{m} c_{k_1} X_{k_1} + \sum_{k_1=1}^{m-1} \sum_{k_2=k_1+1}^{m} c_{k_1,k_2} X_{k_1} X_{k_2} + \ldots +$$

$$\sum_{k_1=1}^{m-d_C+1} \sum_{k_2=k_1+1}^{m-d_C+2} \sum_{k_3=k_2+1}^{m-d_C+3} \cdots \sum_{k_{d_C}=k_{d_C-1}+1}^{m} c_{k_1,k_2,\cdots,k_{d_C}} X_{k_1} X_{k_2} \ldots X_{k_{d_C}};$$

$d_A, d_B \leq m$;

$d_C \equiv \max(d_A, d_B)$;

$a_{k_1,k_2,\cdots,k_{d_A}} \in \mathbb{R}$ (or $\mathbb{C}$);

$b_{k_1,k_2,\cdots,k_{d_B}} \in \mathbb{R}$ (or $\mathbb{C}$);

$m \in \mathbb{N}$;

$c_o \equiv a_0 + b_0$; and $$c_{k_1,k_2,\cdots,k_l} \equiv \begin{cases} a_{k_1,k_2,\cdots,k_l} + b_{k_1,k_2,\cdots,k_l} & \text{for } (1 \leq l \leq d_A) \wedge (1 \leq l \leq d_B) \\ a_{k_1,k_2,\cdots,k_l} & \text{for } (d_B < l \leq d_A) \\ b_{k_1,k_2,\cdots,k_l} & \text{for } (d_A < l \leq d_B) \end{cases};$$

in which:
$Y_A$, $Y_B$, and $Y_C$ represents the first RV, the third RV, and the second RV, respectively;
the $Y_A$, $Y_B$, and $Y_C$ are high-order random variable (HRV);
$k_i$ represents an indexing variable;
$X_{k_i}$ represents an ARV indexed according to the indexing variable $k_i$;
$a_{k_1, k_2, \ldots, k_j}$, $b_{k_1, k_2, \ldots, k_j}$, and $c_{k_1, k_2, \ldots, k_j}$ represent deterministic real or complex values that represents a response to the ARVS indexed according to the indexing variables $k_1 \ldots k_j$;
$\mathbb{R}$ represents the set of real numbers;
$\mathbb{C}$ represents the set of complex numbers; and
$\mathbb{N}$ represents the set of natural numbers.

18. The non-transitory computer-readable medium of claim 11, wherein:
the mathematical operation includes an RV multiplication operation of the first RV with a third RV; and the RV addition operation is defined according to RV multiplication operation expressions:

$\times: Y_A + Y_B \rightarrow Y_C$; such that:

$$Y_A = \sum_{k_1=0}^{m} \cdots \sum_{k_\alpha=0}^{m} a_{k_1,\cdots k_\alpha} X_{k_1} \cdots X_{k_\alpha};$$

$$Y_B = \sum_{l_1=0}^{m} \cdots \sum_{l_\beta=0}^{m} b_{l_1,\cdots l_\beta} X_{l_1} \cdots X_{l_\beta};$$

$$Y_C \equiv$$

$$\sum_{k_1=0}^{m} \cdots \sum_{k_\alpha=0}^{m} \sum_{l_1=0}^{m} \cdots \sum_{l_\beta=0}^{m} c_{k_1,\cdots k_\alpha,l_1,\cdots,l_\alpha} X_{k_1} \cdots X_{k_\alpha} X_{l_1} \cdots X_{l_\beta};$$

$c_{k_1,\cdots,k_\alpha,l_1,\cdots l_\alpha} \equiv a_{k_1,\cdots k_\alpha} b_{l_1,\cdots l_\beta}$; and $m \in \mathbb{N}$;

in which:
$Y_A, Y_B$, and $Y_C$ represents the first RV, the third RV, and the second RV, respectively;
the $Y_A$, $Y_B$, and $Y_C$ are high-order random variables (HRV);
the $Y_A$ is an αth-order HRV;
the $Y_B$ is an βth-order HRV;
the $Y_C$ is an (α-β)th-order HRV;
$k_1 \ldots k_\alpha$ and $l_1 \ldots l_\beta$ represent indexing variables;
$X_{k_i}$ represents an ARV indexed according to the indexing variable $k_i$;
$X_{l_i}$ represents an ARV indexed according to the indexing variable $l_i$;
$a_{k_1,\ldots,k_\alpha}$, $b_{l_1,\ldots,l_\beta}$, and $c_{k_1,\ldots,k_\alpha,l_1,\ldots,l_\beta}$ represent deterministic real or complex values that represent a response to the ARV indexed according to the indexing variables $k_1 \ldots k_\alpha$ and $l_1 \ldots l_\beta$;
$\mathbb{R}$ represents the set of real numbers;
$\mathbb{C}$ represents the set of complex numbers; and
$\mathbb{N}$ represents the set of natural numbers.

19. The non-transitory computer-readable medium of claim 11, wherein:
the mathematical operation includes an RV derivative operation of the first RV; and
the RV derivative operation is defined according to RV derivative operation expressions:

$$\frac{d}{dS_x} : \frac{d}{dS_x} Y_A \rightarrow Y_B;$$

such that:

$Y_B \equiv (Y_A | X_i = 1 \text{ for } \forall i \in S_X) - (Y_A | X_i = 0 \text{ for } \forall i \in S_X)$; in which:

$Y_A$ and $Y_B$ represents the first RV and the second RV, respectively;
$\forall$ represents a "for all" operator; and
| represents a "such that" operator.

20. The non-transitory computer-readable medium of claim 11, wherein the computer instruction is included in an application implemented as:
a quantum simulation for a drug design application;
a quantum simulation for a material design application;
a combinatory optimization for a place and a route in computer aided design (CAD);
a statistical eye simulation of signal integrity analysis for high-speed signal transmission, or
a statistical static timing analysis for CAD which explores the solution space.

* * * * *